(12) United States Patent
Yano et al.

(10) Patent No.: US 8,748,879 B2
(45) Date of Patent: Jun. 10, 2014

(54) SEMICONDUCTOR DEVICE, THIN FILM TRANSISTOR AND A METHOD FOR PRODUCING THE SAME

(75) Inventors: Koki Yano, Chiba (JP); Kazuyoshi Inoue, Chiba (JP); Futoshi Utsuno, Chiba (JP); Masashi Kasami, Chiba (JP); Katsunori Honda, Chiba (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 356 days.

(21) Appl. No.: 12/599,241

(22) PCT Filed: May 1, 2008

(86) PCT No.: PCT/JP2008/058385
§ 371 (c)(1),
(2), (4) Date: Sep. 23, 2010

(87) PCT Pub. No.: WO2008/136505
PCT Pub. Date: Nov. 13, 2008

(65) Prior Publication Data
US 2011/0260157 A1    Oct. 27, 2011

(30) Foreign Application Priority Data

May 8, 2007    (JP) ................................ 2007-123776
May 22, 2007    (JP) ................................ 2007-135831

(51) Int. Cl.
*H01L 29/12* (2006.01)
*H01L 21/02* (2006.01)
*H01L 29/786* (2006.01)

(52) U.S. Cl.
CPC ...... *H01L 21/02554* (2013.01); *H01L 29/7869* (2013.01)
USPC .......... 257/43; 257/59; 257/72; 257/E21.411; 438/104; 438/149; 438/608

(58) Field of Classification Search
CPC ..................... H01L 21/02554; H01L 29/7869
USPC ............... 257/43, E21.411, E21.461, 59, 72; 438/104, 149, 608
See application file for complete search history.

(56) References Cited

U.S. PATENT DOCUMENTS 7,674,650 B2 *   3/2010   Akimoto et al. .............. 438/104
2005/0157236 A1   7/2005   Kawasaki
(Continued)

FOREIGN PATENT DOCUMENTS

JP    8264794 A    10/1996
JP    8264794 W    10/1996
(Continued)

OTHER PUBLICATIONS

English translation of JP2005-268724.*
(Continued)

*Primary Examiner* — John C Ingham
(74) *Attorney, Agent, or Firm* — Millen, White, Zelano & Branigan, P.C.

(57) ABSTRACT

A semiconductor device, a thin film transistor, and a method for producing the same capable of decreasing the management cost, and capable of decreasing the production steps to reduce the production cost are proposed. A method for producing a thin film transistor 2 provided with a semiconductor which is composed of a prescribed material and serves as an active layer 41 and a conductor which is composed of a material having the same composition as that of the prescribed material and serves as at least one of a source electrode 51, a drain electrode 53 and a pixel electrode 55, which includes the steps of simultaneously forming into a film an object to be processed and a conductor (a source electrode 51, a source wire 52, a drain electrode 53, a drain wire 54 and a pixel electrode 55) which are composed of the amorphous prescribed material, followed by simultaneous shaping, and crystallizing the object to be processed which has been shaped to allow it to be the active layer 41.

70 Claims, 39 Drawing Sheets

(56) References Cited

U.S. PATENT DOCUMENTS

| | | | |
|---|---|---|---|
| 2005/0173734 A1* | 8/2005 | Yoshioka et al. | 257/202 |
| 2005/0255622 A1* | 11/2005 | Kokura et al. | 438/30 |
| 2006/0113539 A1 | 6/2006 | Sano et al. | |
| 2006/0113549 A1 | 6/2006 | Den et al. | |
| 2007/0024187 A1* | 2/2007 | Shin et al. | 313/504 |
| 2007/0054507 A1* | 3/2007 | Kaji et al. | 438/795 |
| 2009/0149030 A1* | 6/2009 | Chang | 438/752 |

FOREIGN PATENT DOCUMENTS

| | | | |
|---|---|---|---|
| JP | 2004235180 | A | 8/2004 |
| JP | 2004317685 | A | 11/2004 |
| JP | 2004319655 | A | 11/2004 |
| JP | 2004319655 | W | 11/2004 |
| JP | 2005017669 | A | 1/2005 |
| JP | 2005017669 | W | 1/2005 |
| JP | 2005019664 | A | 1/2005 |
| JP | 2005019664 | W | 1/2005 |
| JP | 20050490667 | A | 2/2005 |
| JP | 20050490667 | W | 2/2005 |
| JP | 2005106881 | A | 4/2005 |
| JP | 2005106881 | W | 4/2005 |
| JP | 2005108912 | A | 4/2005 |
| JP | 2005268724 | A | 9/2005 |
| JP | 2005268724 | W | 9/2005 |
| JP | 2006165527 | A | 6/2006 |
| JP | 2006165527 | W | 6/2006 |
| JP | 2006165528 | A | 6/2006 |
| JP | 2006165528 | W | 6/2006 |
| JP | 2006165529 | A | 6/2006 |
| JP | 2006165529 | W | 6/2006 |
| JP | 2006165530 | A | 6/2006 |
| JP | 2006165530 | W | 6/2006 |
| JP | 2006165531 | A | 6/2006 |
| JP | 2006165531 | W | 6/2006 |
| JP | 2006165532 | A | 6/2006 |
| JP | 2006165532 | W | 6/2006 |
| JP | 2006173580 | A | 6/2006 |
| JP | 2006186319 | A | 7/2006 |
| JP | 2004317685 | W | 7/2010 |
| WO | PCT2008058385 | R | 7/2008 |

OTHER PUBLICATIONS

Official Action dated Jan. 7, 2014 related to corresponding Japanese Patent Application No. 2012-141823.

* cited by examiner

FIG. 5
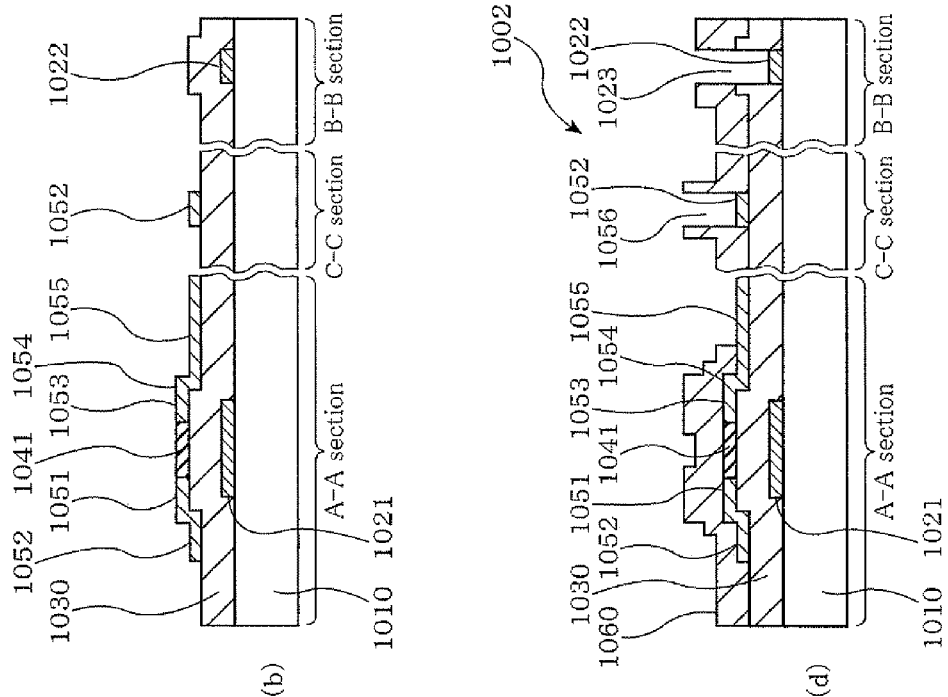
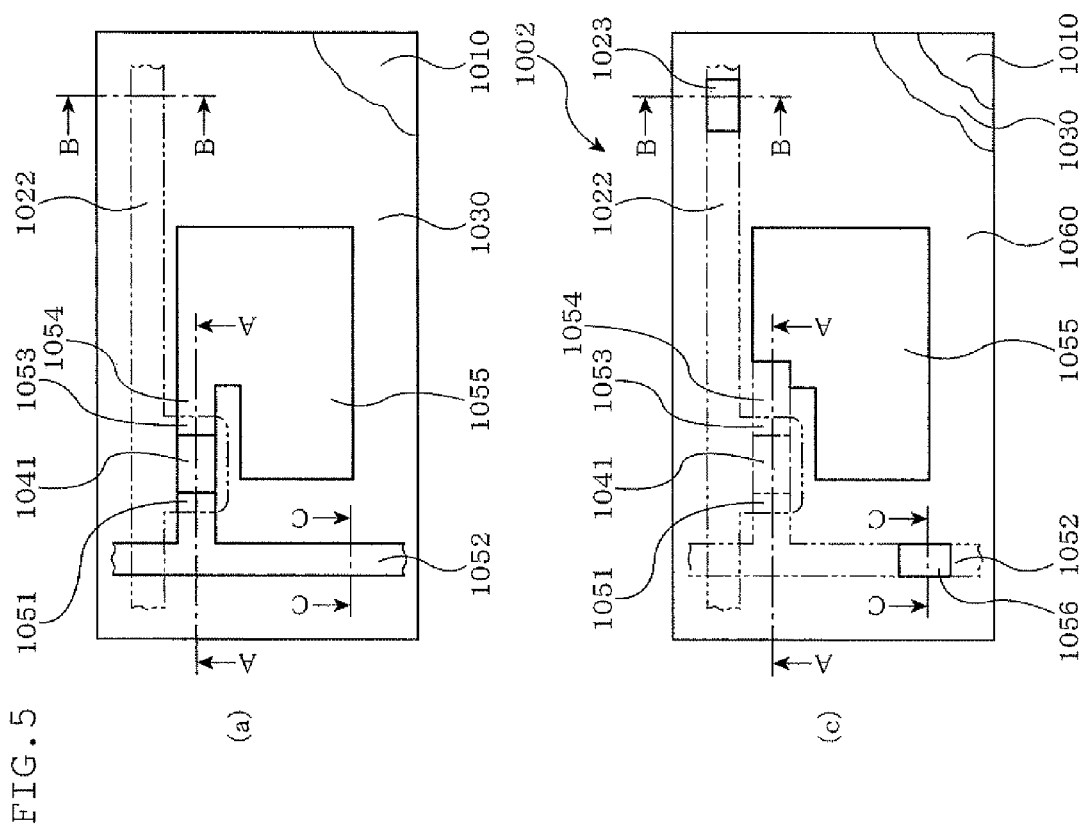

FIG. 8
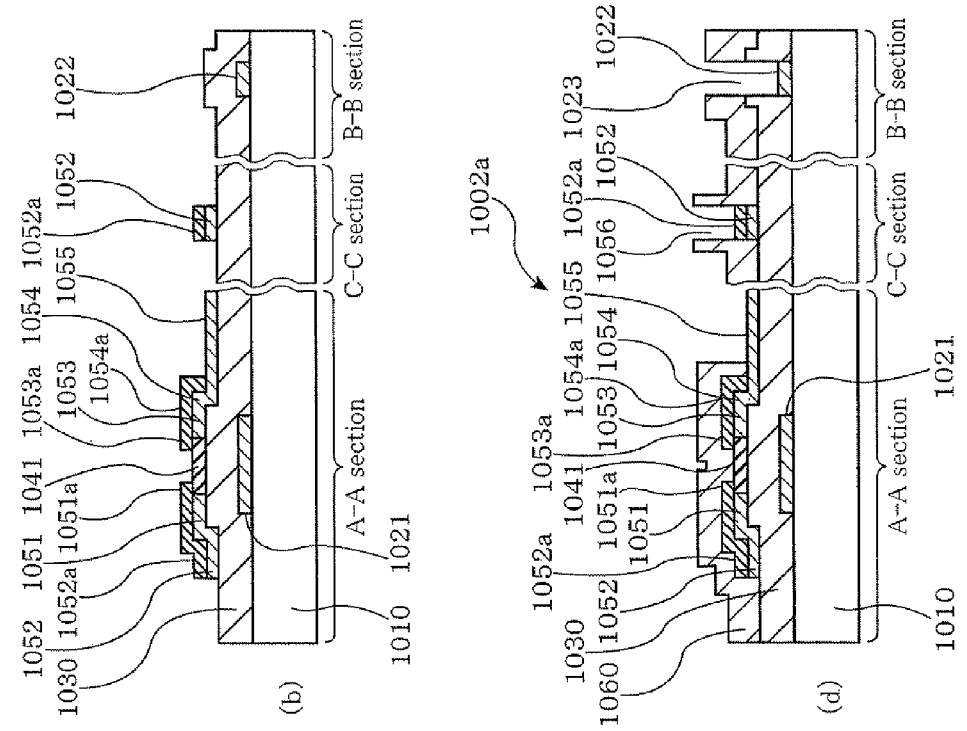
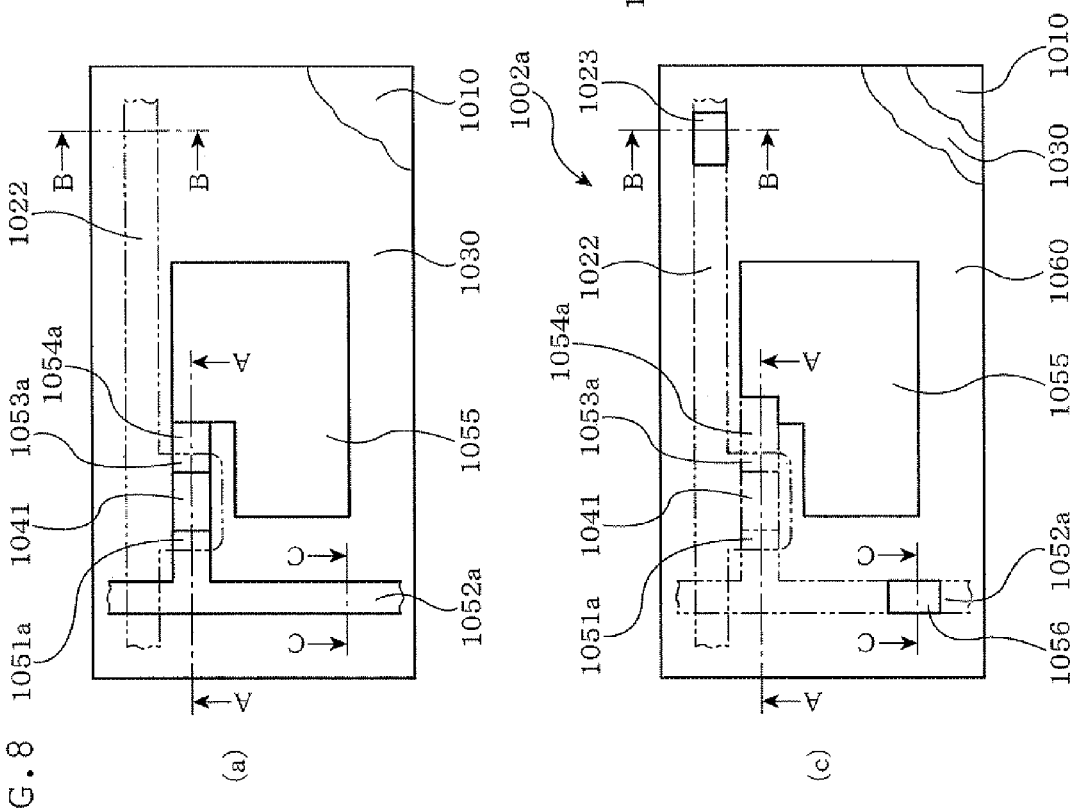

SEMICONDUCTOR DEVICE, THIN FILM TRANSISTOR AND A METHOD FOR PRODUCING THE SAME

TECHNICAL FIELD

The invention relates to a semiconductor device, a thin film transistor and a method for producing the same. In particular, the invention relates to a semiconductor device and a thin film transistor which can reduce the production cost by reducing the production steps by providing an oxide semiconductor composed of prescribed materials and a conductor which is formed simultaneously with this oxide semiconductor and is composed of a material having the same composition as that of the above-mentioned prescribed material, and to a method for producing the same. Furthermore, the invention relates to a semiconductor device and a thin film transistor capable of reducing the production steps to decrease the production cost by providing a conductor composed of a prescribed material and a semiconductor obtained by subjecting the above-mentioned prescribed material to a plasma treatment to allow it to be a semiconductor, as well as to the method for producing the same.

BACKGROUND ART

Furthermore, an active matrix-type image display apparatus such as a LCD (liquid crystal display) and an organic EL (Electro Luminescence) display has been widely used in view of display performance, energy saving or the like. In particular, it has come to almost constitute the mainstream as displays of cellular phones, PDAs (Personal Digital Assistant) personal computers, laptop computers, TVs and the like. Generally, a TFT (field-effect type thin film transistor) substrate is used in these displays.

For example, a liquid crystal display has a configuration in which a display material such as liquid crystal is filled between a TFT substrate and an opposing substrate, and a voltage is selectively applied to this display material for each pixel. Here, a TFT substrate means a substrate in which a TFT using a semiconductor thin film (also referred to as a semiconductor film) such as an amorphous silicon thin film or a polycrystalline silicon thin film is arranged. The above-mentioned image display apparatus is driven by the active matrix circuit of a TFT. Since a TFT is arranged in the shape of an array, a TFT substrate is also referred to as a "TFT array substrate".

<Conventional Method for Producing TFT Substrate>

As the method for producing a TFT substrate, a 5-mask process using five masks, a 4-mask process in which the number of masks is decreased to four by half-tone exposure technology, and other processes are known.

In such a method for producing a TFT substrate, the production process tends to include many steps since five or four masks are used. For example, it is known that the 4-mask process requires 35 steps and the 5-mask process requires steps exceeding 40. So many production steps may decrease the production yield. In addition, many steps may make the production process complicated and also may increase the production cost.

(Method for Production Using Five Masks)

FIG. 41 is schematic views for explaining the conventional method for producing a TFT substrate, in which (a) is a cross-sectional view showing the state in which a gate electrode is formed, (b) is a cross-sectional view showing the state in which an etch stopper is formed, (c) is a cross-sectional view showing the state in which a source electrode and a drain electrode are formed, (d) is a cross-sectional view showing the state in which an interlayer insulating film is formed, and (e) is a cross-sectional view showing the state in which a transparent electrode is formed.

In FIG. 41(a), a gate electrode 212 is formed on a glass substrate 210 by using a first mask (not shown). That is, first, a metal (such as aluminum (Al), for example) is deposited on the glass substrate 210 by sputtering. Then, a resist is formed by a photolithographic method by using a first mask. Subsequently, the gate electrode 212 is formed into a predetermined shape by etching, and the resist is subjected to an ashing process.

Next, as shown in FIG. 41(b), on the glass substrate 210 and the gate electrode 212, a gate-insulating film 213 as an SiN film (silicon nitride film) and an α-Si:H(i) film 214 are stacked in this order. Subsequently, an SiN film (silicon nitride film) as a channel protective layer is deposited. Then, a resist is formed by a photolithographic method using a second mask (not shown). Then, the SiN film is patterned into a predetermined shape by a dry etching method using a CHF gas, an etch stopper 215 is formed, and the resist is subjected to an ashing process.

Next, as shown in FIG. 41(c), an α-Si:H(n) film 216 is deposited on the α-Si:H (i) film 214 and the etch stopper 215. Then, a Cr (chromium)/Al double-layer film is deposited thereon by vapor vacuum deposition or sputtering. Subsequently, a resist is formed by photolithographic method using a third mask (not shown). Then, the Cr/Al double-layer film is patterned by an etching method, whereby a source electrode 217a and a drain electrode 217b are formed in a predetermined shape. In this case, Al is patterned by a photo-etching method using $H_3PO_4$—$CH_3COOH$—$HNO_3$ and Cr is patterned by a photo-etching method using an aqueous solution of diammonium cerium nitrate. Subsequently, the α-Si:H films (216 and 214) are patterned by a dry etching method using a CHF gas and a wet etching method using an aqueous hydrazine solution ($NH_2NH_2 \cdot H_2O$), whereby the α-Si:H (n) film 216 and the α-Si:H (i) film 214 are formed in predetermined shapes, and the resist is subjected to an ashing process.

Next, as shown in FIG. 41(d), before forming a transparent electrode 219, an interlayer insulating film 218 is deposited on the gate insulating electrode 213, the etch stopper 215, the source electrode 217a and the drain electrode 217b. Subsequently, a resist is formed by photolithographic method using a fourth mask (not shown). Then, the interlayer insulating film 218 is patterned by an etching method, an opening 218a for electrically connecting the transparent electrode 219 with the source electrode 217a is formed, and the resist is subjected to an ashing process.

Next, as shown in FIG. 41(e), on the interlayer insulating film 218 in a region where patterns of the source electrode 217a and the drain electrode 217b are formed, an amorphous transparent conductive film composed mainly of indium oxide and zinc oxide is deposited by sputtering. Subsequently, a resist is formed by photolithographic method using a fifth mask (not shown). Then, the amorphous transparent conductive film is patterned by a photo-etching method using an 4 wt % aqueous solution of oxalic acid as an etchant. Then, the amorphous transparent conductive film is formed in such a shape that the film electrically connects the source electrode 217a and the resist is subjected to an ashing process, whereby the transparent electrode 219 is formed.

As mentioned above, five masks are required in this conventional method for producing a TFT substrate.

(Method for Production Using Three Masks)

To improve the above-mentioned conventional technology, various technologies to produce a TFT substrate by a method in which production steps are furthermore reduced by decreasing the number of masks (from five to three, for example) have been proposed. For example, the following patent documents 1 to 7 describe a method of producing a TFT substrate using three masks.

In addition, the patent documents 8 to 14 technologies using as a semiconductor layer an amorphous oxide containing any of In, Zn and Sn.

Patent Document 1: JP-A-2004-317685
Patent Document 2: JP-A-2004-319655
Patent Document 3: JP-A-2005-017669
Patent Document 4: JP-A-2005-019664
Patent Document 5: JP-A-2005-049667
Patent Document 6: JP-A-2005-106881
Patent Document 7: JP-A-2005-108912
Patent Document 8: JP-A-2006-165527
Patent Document 9: JP-A-2006-165528
Patent Document 10: JP-A-2006-165529
Patent Document 11: JP-A-2006-165530
Patent Document 12: JP-A-2006-165531
Patent Document 13: JP-A-2006-165532
Patent Document 14: JP-A-2006-173580

DISCLOSURE OF THE INVENTION

Problems to be Solved by the Invention

However, in conventional semiconductor devices (including a thin film transistor or the like), it was considered that it is a matter of course that the semiconductor and the conductor differ in material composition. Therefore, using the same material for the semiconductor and the conductor to decrease the management cost was not even imagined. In addition, separate formation of a semiconductor layer and a conductor layer was believed to be a matter of course. Therefore, forming into a film the semiconductor layer and the conductor layer simultaneously (simultaneous film formation) and subjecting them to simultaneous etching (simultaneous shaping) to improve productivity, that is, decreasing the production steps to reduce the production cost was not even imagined.

In addition, the method for producing a TFT substrate using three masks described in the patent documents 1 to 7 is a very complicated production process since it includes anodic oxidation of a gate-insulating film and the like, and hence it is difficult to be put into practical use.

With the technology of a semiconductor composed of an amorphous oxide disclosed in the above-mentioned patent documents 8 to 14, it is impossible to attain the above-mentioned object of improving productivity.

The invention has been made in view of the above-mentioned problems, and an object thereof is to provide a semiconductor device and a thin film transistor capable of decreasing the management cost by using the same materials for a semiconductor and a conductor, and capable of decreasing the production steps to reduce the production cost by simultaneous film formation or simultaneous shaping of a semiconductor and a conductor, as well as to provide a method for producing the same.

Means for Solving the Problem

In order to attain the above-mentioned object, the semiconductor device of the invention is a semiconductor device provided with a semiconductor comprising a prescribed material, characterized in that it is provided with a conductor formed of a material having the same composition as that of said prescribed material.

Due to such a configuration, the same material can be used, whereby the management cost can be decreased.

Here, the semiconductor device means a semiconductor element, a semiconductor component, a semiconductor apparatus, an integrated circuit or the like.

It is preferred that the semiconductor be composed of the prescribed material which is crystalline, and the conductor be composed of the prescribed material which is amorphous.

In this way, the prescribed material which is crystalline can have semiconductor properties and the amorphous prescribed material can have conductivity. In addition, since the semiconductor is crystalline, stable operation can be ensured.

It is preferred that the prescribed material be composed mainly of indium oxide.

It is furthermore preferred that the prescribed material contain an oxide of a divalent metal and/or an oxide of a trivalent metal.

In this way, depending on the state of the prescribed material (for example, whether the prescribed material is amorphous or crystalline), the prescribed material can function as a conductor or as a semiconductor.

In order to attain the above-mentioned object, the method for producing the semiconductor device of the invention is a method for producing a semiconductor device provided with a semiconductor composed of a prescribed material and a conductor which is composed of a material having the same composition as that of said prescribed material, which comprises the steps of:
forming said semiconductor which is crystalline, and forming said conductor which is amorphous in a subsequent step, or forming said conductor which is amorphous and forming said semiconductor which is crystalline in a subsequent step.

In this way, since the same material can be used, the management cost can be decreased.

In order to attain the above-mentioned object, the method for producing a semiconductor device of the invention is a method for producing a semiconductor device provided with a semiconductor composed of a prescribed material and a conductor which are composed of a material having the same composition as that of said prescribed material, which comprises the steps of: simultaneously forming into a film an object to be processed and said conductor composed of said prescribed material which is amorphous, followed by simultaneous shaping, and crystallizing said object to be processed which has been shaped to allow it to be said semiconductor.

By this method, by forming a semiconductor layer and a conductor layer simultaneously (simultaneous film formation) and by subjecting them to simultaneous etching (simultaneous shaping), productivity can be improved. That is, the production steps can be decreased to reduce the production cost.

It is preferred that the method have a step of forming a metal layer connecting the semiconductor and the conductor.

By providing this step, electrical connection of the semiconductor and the conductor can be ensured.

It is preferred that the above-mentioned prescribed material be composed mainly of indium oxide.

It is further preferred that the above-mentioned prescribed material contain an oxide of a divalent metal and/or an oxide of a trivalent metal.

In this way, depending on the state of the prescribed material (for example, whether the prescribed material is amorphous or crystalline), the prescribed material can function as a conductor or as a semiconductor.

In order to attain the above-mentioned object, the thin film transistor of the invention is a thin film transistor provided with a gate electrode, a gate-insulating film, an active layer, a source electrode, a drain electrode and a pixel electrode, which comprises a semiconductor which is composed of a prescribed material and serves as said active layer, and a conductor which is composed of a material having the same composition as that of said prescribed material and serves as at least one of said source electrode, said drain electrode and said pixel electrode.

In this way, since the same material can be used, the management cost can be decreased.

Furthermore, it is preferred that the semiconductor be composed of said prescribed material which is crystalline, and the conductor be composed of said prescribed material which is amorphous.

With such a configuration, the prescribed material which is crystalline can have semiconductor properties and the prescribed material which is amorphous can have conductivity. In addition, since the semiconductor is polycrystalline, stable operation can be ensured.

It is preferred that the prescribed material be composed mainly of indium oxide.

It is furthermore preferred that the prescribed material contain an oxide of a divalent metal and/or an oxide of a trivalent metal.

In this way, depending on the state of the prescribed material (for example, whether the prescribed material is amorphous or crystalline), the prescribed material can function as a conductor or as a semiconductor.

In order to attain the above-mentioned object, the method for producing a thin film transistor of the invention is a method for producing a thin film transistor provided with a semiconductor composed of a prescribed material and serves as an active layer and a conductor composed of a material having the same composition as that of said prescribed material and serves as at least one of a source electrode, a drain electrode and a pixel electrode, which comprises the steps of: forming said semiconductor which is crystalline and forming said conductor which is amorphous in a subsequent step, or forming said conductor which is amorphous and forming said semiconductor which is crystalline in a subsequent step.

By this method, the same material can be used, whereby the management cost can be decreased. In addition, the invention can be applied to various thin film transistors.

In order to attain the above-mentioned object, the method for producing a thin film transistor of the invention is a method for producing a thin film transistor provided with a semiconductor composed of a prescribed material and serves as an active layer and a conductor composed of a material having the same composition as that of said prescribed material and serves as at least one of a source electrode, a drain electrode and a pixel electrode, which comprises the steps of: simultaneously forming into a film an object to be processed and said conductor which are composed of said prescribed material which is amorphous, followed by simultaneous shaping, and crystallizing said object to be processed which has been shaped to allow it to be said semiconductor.

By this method, the productivity can be improved by the simultaneous forming and shaping of semiconductor and conductor layers. That is, the production steps can be decreased to reduce the production cost. The invention can be applied to various thin film transistors.

In order to attain the above-mentioned object, the method for producing a thin film transistor of the invention is a method for producing a thin film transistor provided with a semiconductor composed of a prescribed material and serves as an active layer and a conductor composed of a material having the same composition as that of said prescribed material and serves as a source electrode, a drain electrode and a pixel electrode, which comprises the steps of: forming a gate electrode above a substrate, forming a gate-insulating film above said substrate and said gate electrode, and above said gate-insulating film, forming said semiconductor which is crystalline and forming said conductor which is amorphous in a subsequent step, or forming said conductor which is amorphous and forming said semiconductor which is crystalline in a subsequent step.

By this method, in the method for producing a bottom-gate type thin film transistor, the same material can be used, whereby the management cost can be decreased. In addition, due to the simultaneous film formation and the simultaneous shaping of a source electrode, a drain electrode and a pixel electrode, the production steps can be decreased to reduce the production cost.

In order to attain the above-mentioned object, the method for producing a thin film transistor of the invention is a method for producing a thin film transistor provided with a semiconductor composed of a prescribed material and serves as an active layer and a conductor composed of a material having the same composition as that of said prescribed material and serves as a source electrode, a drain electrode and a pixel electrode, which comprises the steps of: forming a gate electrode above a substrate, forming a gate-insulating film above said substrate and said gate electrode, and above said gate-insulating film, simultaneously forming into a film an object to be processed which serves as said active layer and said conductor which are composed of said prescribed material which is amorphous, followed by simultaneous shaping, and crystallizing said object to be processed which has been shaped to allow it to be said semiconductor.

By this method, by forming and shaping a semiconductor layer and a conductor layer simultaneously, productivity can be improved. That is, the production steps can be decreased to reduce the production cost.

In order to attain the above-mentioned object, the method for producing a thin film transistor of the invention is a method for producing a thin film transistor provided with a semiconductor composed of a prescribed material and serves as an active layer and a conductor composed of a material having the same composition as that of said prescribed material and serves as a source electrode, a drain electrode and a pixel electrode, which comprises the steps of: forming said semiconductor which is crystalline above a substrate and forming said conductor which is amorphous in a subsequent step, or forming said conductor which is amorphous and forming said semiconductor which is crystalline in a subsequent step; forming a gate-insulating film above said substrate, said semiconductor and said conductor; and forming a gate-insulating film above said gate-insulating film which is above said semiconductor.

By this method, in the method for producing a top-gate type thin film transistor, the same material can be used, whereby the management cost can be decreased. In addition, due to the simultaneous film formation and simultaneous shaping of a source electrode, a drain electrode and a pixel electrode, the production steps can be decreased to reduce the production cost.

In order to attain the above-mentioned object, the method for producing a thin film transistor of the invention is a method for producing a thin film transistor provided with a semiconductor composed of a prescribed material and serves as an active layer and a conductor composed of a material having the same composition as that of said prescribed material and serves as a source electrode, a drain electrode and a pixel electrode, which comprises the steps of: above a substrate, simultaneously forming into a film an object to be processed which serves as said active layer and said conductor which are composed of said prescribed material which is amorphous, followed by simultaneous shaping, and crystallizing said object to be processed to allow it to be said semiconductor, forming a gate-insulating film above said substrate, said semiconductor and said conductor, forming a gate electrode above said gate-insulating film which is above said substrate.

By this method, in the method for producing a top-gate type thin film transistor, due to the simultaneous film formation and the simultaneous shaping of a semiconductor layer and a conductor layer, the production steps can be decreased to reduce the production cost.

It is preferred that the method have a step of forming a metal layer connecting the semiconductor and the conductor.

By providing this step, electrical connection of the semiconductor and the conductor can be ensured.

It is preferred that the method have a step of forming a protective layer.

By providing this step, the thin film transistor can be a thin film transistor used in a liquid display apparatus or the like.

It is preferred that the prescribed material be composed mainly of indium oxide.

It is further preferred that the prescribed material contain an oxide of a divalent metal and/or an oxide of a trivalent metal.

In this way, depending on the state of the prescribed material (for example, whether the prescribed material is amorphous or crystalline), the prescribed material can function as a conductor or as a semiconductor.

In order to attain the above-mentioned object, the semiconductor device of the invention is a semiconductor device provided with a conductor composed of a prescribed material, wherein it is provided with a semiconductor which is allowed to be a semiconductor by subjecting said prescribed material to a plasma treatment.

Due to such a configuration, the same material can be used, whereby the management cost can be decreased. The semiconductor may be a semiconductor which is obtained by subjecting part of the conductor composed of a prescribed material to a plasma treatment, or may be a semiconductor obtained by subjecting a thin film composed of a prescribed material, which is formed separately from the conductor, to a plasma treatment.

Here, the semiconductor device means a semiconductor element, a semiconductor component, a semiconductor apparatus, an integrated circuit or the like.

It is preferred that the prescribed material be an amorphous metal oxide.

Carriers are generated in an amorphous metal oxide due to oxygen deficiency. Therefore, carrier concentration can be easily adjusted by controlling oxygen deficiency by a plasma treatment. That is, the properties of a thin film using a prescribed material can be freely controlled. For example, a conductor and a semiconductor can be provided using a prescribed material, or conductivity of the conductor and the properties of the semiconductor can be easily set.

It is preferred that the amorphous metal oxide contain at least one of indium oxide, zinc oxide and tin oxide. In this way, stable conductivity and stable semiconductor properties can be attained simultaneously.

It is further preferred that the amorphous metal oxide contain at least one of an oxide of a divalent metal, an oxide of a trivalent metal and an oxide of a tetravalent metal. In this way, the properties of a thin film transistor can be stabilized effectively.

In order to attain the above-mentioned object, the method of producing a semiconductor device of the invention is a method for producing a semiconductor device provided with a conductor composed of a prescribed material and a semiconductor of which the base material is said prescribed material, wherein said prescribed material is subjected to a plasma treatment to allow it to be said semiconductor.

By this method, the same material can be used, whereby the management cost can be decreased.

In order to attain the above-mentioned object, the method for producing a semiconductor device of the invention is a method for producing a semiconductor device provided with a conductor composed of a prescribed material and a semiconductor of which the base material is said prescribed material, which comprises the steps of: forming into a film said prescribed material to form an object to be processed and said conductor, and subjecting said object to be processed to a plasma treatment to allow it to be a semiconductor.

By this method, by forming an object to be processed to be a semiconductor and a conductor simultaneously (simultaneous film formation) and by subjecting them to simultaneous etching (simultaneous shaping), productivity can be improved. That is, the production steps can be decreased to reduce the production cost.

In order to attain the above-mentioned object, the method for producing a semiconductor device of the invention is a method for producing a semiconductor device provided with a conductor composed of a prescribed material and a semiconductor of which the base material is said prescribed material, which comprises the steps of: forming into a film said prescribed material, allowing part of said prescribed material which has been formed into a film to be a semiconductor, and etching said prescribed material which has been formed into a film to form said conductor and said semiconductor.

By this method, by forming an object to be processed to be a semiconductor and a conductor simultaneously (simultaneous film formation) and by subjecting them to simultaneous etching (simultaneous shaping), productivity can be improved. That is, the production steps can be decreased to reduce the production cost.

It is preferred that, when said prescribed material is allowed to be a semiconductor by said plasma treatment, a shielding layer be used, which has an opening part for covering a region which is allowed to be said conductor and for bringing plasma into contact with a region which is allowed to be a semiconductor.

Due to such a configuration, the shape or the arrangement of a semiconductor can be arbitrarily adjusted.

The shape, quantity, arrangement or the like of the opening is not particularly limited.

In order to attain the above-mentioned object, the thin film transistor of the invention is a thin film transistor provided with a gate electrode, a gate-insulating film, an active layer, a source electrode, a drain electrode and a pixel electrode wherein it is provided with a conductor composed of a prescribed material and serves at least one of said source electrode, said drain electrode and said pixel electrode, and said active layer which is allowed to be a semiconductor by subjecting said prescribed material to a plasma treatment.

With such a configuration, the same material can be used, whereby the management cost can be decreased.

In order to attain the above-mentioned object, the method for producing a thin film transistor of the invention is a method for producing a thin film transistor provided with a conductor composed of a prescribed material which serves at least one of said source electrode, said drain electrode and said pixel electrode and a semiconductor of which the base material is said prescribed material and serves as an active layer, which further comprises the step of subjecting said prescribed material to a plasma treatment to allow it to be a semiconductor, thereby to obtain said semiconductor.

By this method, the same material can be used, whereby the management cost can be decreased.

In order to attain the above-mentioned object, the method for producing a thin film transistor of the invention is a method for producing a thin film transistor provided with a conductor composed of a prescribed material and serves at least one of a source electrode, a drain electrode and a pixel electrode and a semiconductor based on said prescribed material and serves as an active layer, which comprises: forming into a film said predetermined material to form an object to be processed and said conductor, and subjecting said predetermined material to a plasma treatment to allow it to be said semiconductor.

By this method, by forming an object to be processed to be a semiconductor and a conductor simultaneously (simultaneous film formation) and by subjecting them to simultaneous etching (simultaneous shaping), productivity can be improved. That is, the production steps can be decreased to reduce the production cost.

In order to attain the above-mentioned object, the method for producing a thin film transistor of the invention is a method for producing a thin film transistor provided with a conductor composed of a prescribed material and serves at least one of a source electrode, a drain electrode and a pixel electrode and a semiconductor of which the base material is said prescribed material and serves as an active layer, which comprises: forming into a film said predetermined material, subjecting part of said predetermined material to a plasma treatment to allow it to be a semiconductor, and etching said prescribed material which has been formed into a film to form said conductor and said semiconductor.

By this method, by forming an object to be processed to be a semiconductor and a conductor simultaneously (simultaneous film formation) and by subjecting them to etching (simultaneous formation), productivity can be improved. That is, the production steps can be decreased to reduce the production cost.

It is preferred that the method have a step of forming a protective layer.

By providing this step, the thin film transistor is allowed to be a thin film transistor which can be used in a liquid crystal display or the like.

BRIEF DESCRIPTION OF THE DRAWINGS

FIG. 5 is a schematic view of essential parts for explaining a method for producing a thin film transistor according to the second embodiment of the invention, in which (a) is a plan view in which a gate electrode, a gate wire, a gate-insulating film, an active layer, a source wire, a source electrode, a drain electrode, a drain wire and a pixel electrode are formed, (b) is a cross-sectional view of (a), (c) is a plan view in which a protective layer is formed, and (d) is a cross-sectional view of (c);

FIG. 8 is a schematic view of essential parts for explaining the first application example of the method for producing a thin film transistor according to a second embodiment of the invention, in which (a) is a plan view showing the state in which a gate electrode, a gate wire, a gate-insulating film, an active layer, a source wire, a source electrode, a drain electrode, a drain wire, a pixel electrode and a metal layer are formed, (b) is a cross-sectional view of (a), and (c) is a plan view in which a protective layer is formed, and (d) is a cross-sectional view of (c);

BEST MODE FOR CARRYING OUT THE INVENTION

[First Embodiment of a Method for Producing a Thin Film Transistor]

Figure 1:
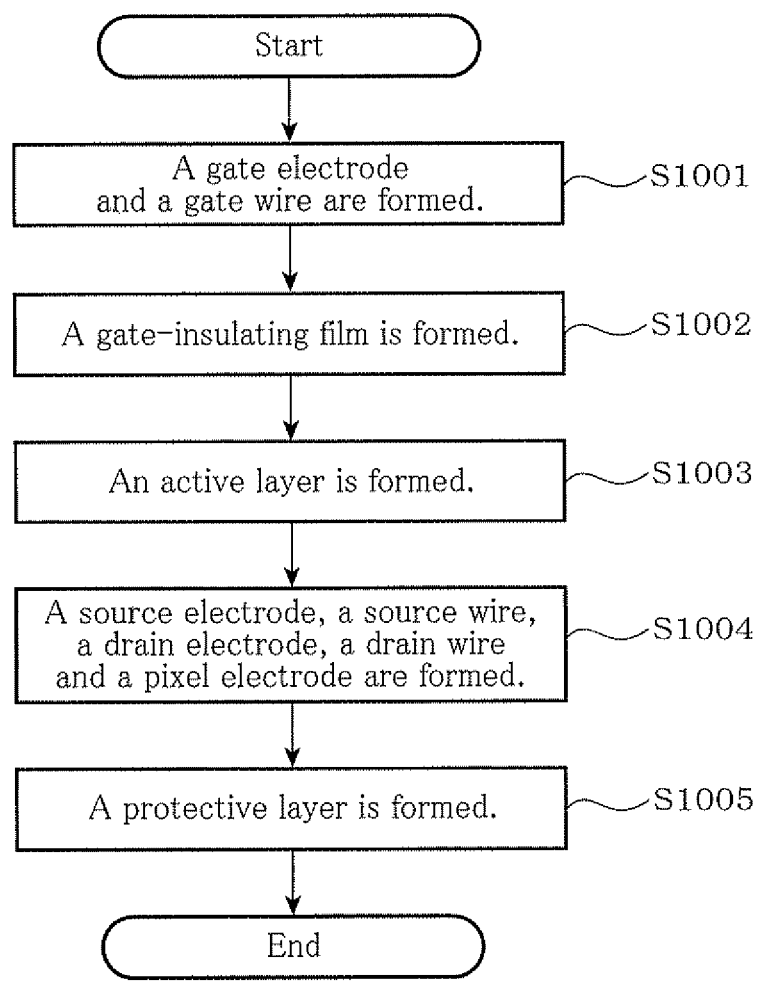
FIG. 1 is a schematic flow chart for explaining the method for producing a thin film transistor according to a first embodiment of the invention.

FIG. 1 is a schematic flow chart for explaining the method for producing a thin film transistor according to a first embodiment of the invention.

Figure 2:
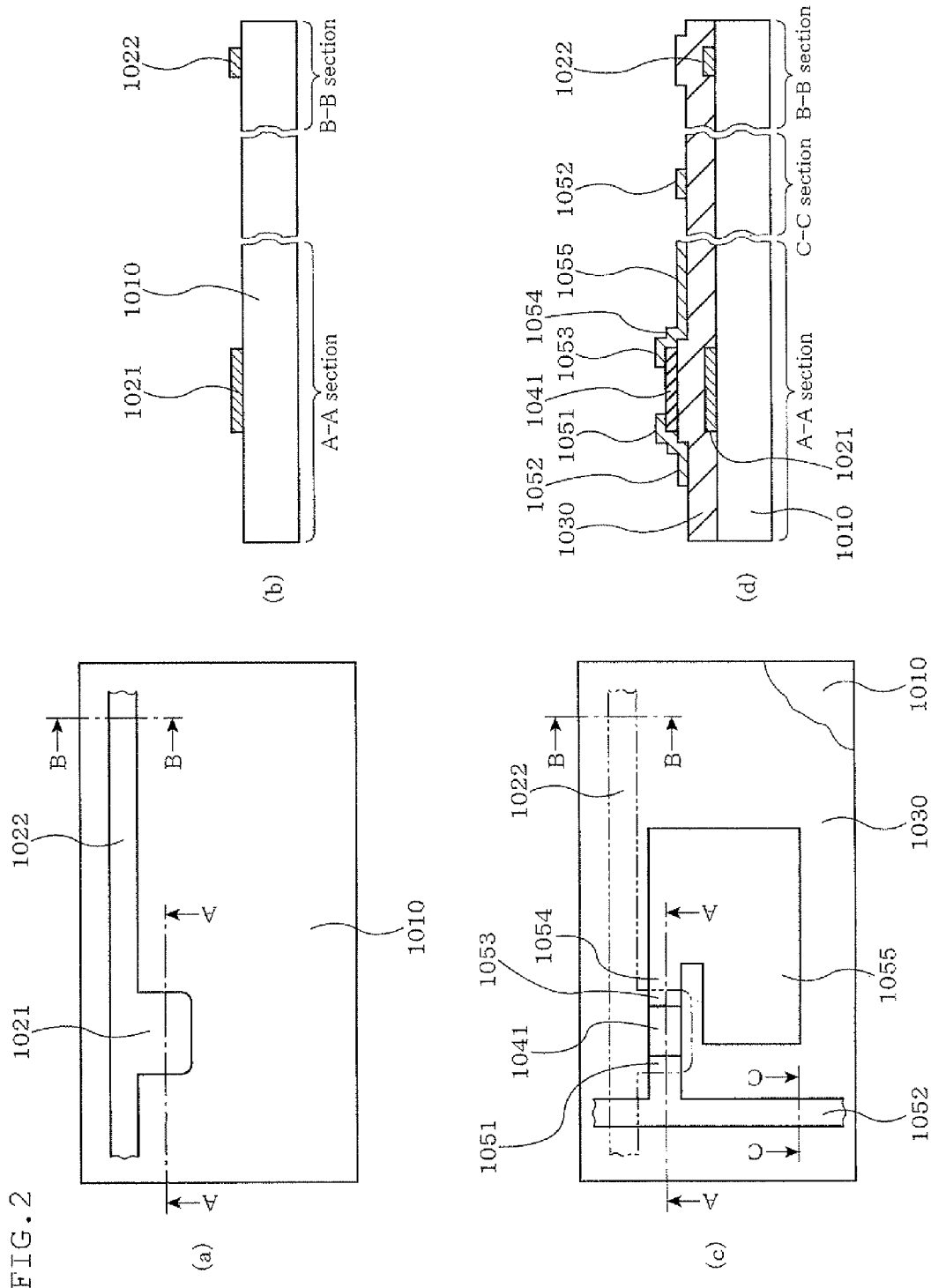
FIG. 2 is a schematic view of essential parts for explaining the method for producing a thin film transistor according to the first embodiment of the invention, in which (a) is a plan view showing the state in which a gate electrode and a gate wire are formed, (b) is a cross-sectional view of (a), (c) is a plan view showing the state in which a gate-insulating film, an active layer, a source wire, a source electrode, a drain electrode, a drain wire and a pixel electrode are formed, and (d) is a cross-sectional view of (c)

FIG. 2 is a schematic view of essential parts for explaining the method for producing a thin film transistor according to the first embodiment of the invention, in which (a) is a plan view showing the state in which a gate electrode and a gate wire are formed, (b) is a cross-sectional view of (a), (c) is a plan view showing the state in which a gate-insulating film, an active layer, a source wire, a source electrode, a drain electrode, a drain wire and a pixel electrode are formed, and (d) is a cross-sectional view of (c).

In FIG. 1, FIG. 2(a) and FIG. 2(b), at first, a transparent glass substrate 1010 is prepared. On this glass substrate 1010, by a photolithographic method using a first mask (not shown), a gate electrode 1021 and a gate wire 1022, which are composed of a metal thin film, are formed in a desired shape (Step S1001).

The substrate is not limited to the glass substrate 1010, and a substrate formed of various materials can be used according to the application of the thin film transistor 1001. Flexible resin films may be used, for example.

As the material of the above-mentioned metal thin film, Al, Cu, Ti, Mo or Ag, or alloys of them may be used, for example. The thickness of the thin film is normally 50 to 500 nm, preferably 100 to 400 nm. The reason therefor is that, if the thickness is smaller than 50 nm, the resistance of the gate wire 1022 may be increased to cause signal delay. If the thickness is larger than 500 nm, the difference in height between the metal thin film and the substrate becomes too large. As a result, defects may occur due to breakage or thinning of a wire of a gate-insulating film 1030, a source wire 1052, a drain wire 1054 or the like which are thin films formed above the metal thin film. As for the alloys, various metals may be added as long as the resistance value of a base metal is not changed largely. For example, as for Al alloys, alloys in which a metal such as Ni, Nd, La, Mo, W or the like are added are preferable. The above-mentioned metal thin film is a transparent thin film.

Then, as shown in FIG. 1, FIG. 2(c) and FIG. 2(d), an SiNx film as the gate-insulating film 1030 is formed by CVD (chemical vapor deposition method) on the glass substrate 1010, the gate electrode 1021 and the gate wire 1022 (Step S1002). The thickness of this film is normally 100 to 500 nm, preferably 200 to 400 nm. Generally, it is preferred that the thickness of the gate-insulating film 1030 be larger than the thickness of the gate wire 1022. By allowing the thickness of the gate-insulating film 1030 to be larger than the thickness of the gate wire 1022, current leakage from the gate wire 1022 to the source wire 1052 or the drain wire 1054 which are positioned above the gate wire 1022 can be decreased.

Subsequently, an active layer 1041 is formed on the gate-insulating film 1030 above the gate electrode 1021 (Step S1003).

This active layer 1041 is formed of a prescribed material, and exhibits characteristics as a semiconductor when it is allowed to be crystalline. The composition of the material of the active layer 1041 will be mentioned later.

Here, the active layer 1041 is formed into a film by a sputtering method in a crystalline state, followed by shaping by a photolithographic method using a second mask (not shown). The method is, however, not limited thereto. For example, film formation may be conducted in an amorphous state, followed by crystallization.

The conditions for crystallization may vary depending on the method or the apparatus for crystallization. However, it is preferred that the crystallization be conducted under the conditions which allow crystal peaks to appear in an X-ray diffraction apparatus.

The lower limit of the electron carrier concentration of the active layer 1041 is not particularly limited, as long as it can be applied as the active layer of a transistor. Therefore, according to the invention, the electron carrier concentration is allowed to be $10^{10}/cm^3$ or more and less than $10^{18}/cm^3$ by controlling the material, the composition ratio, the production conditions, the post-treatment conditions or the like of a crystalline oxide which serves as the active layer 1041. The electron carrier concentration is preferably $10^{11}/cm^3$ or more and $10^{17}/cm^3$ or less, further preferably $10^{12}/cm^3$ or more and $10^{16}/cm^3$ or less. With this range, it is possible to attain prescribed electron mobility and to sufficiently increase an on-off ratio. In addition, a normally-off transistor can be obtained in a high yield.

The electron carrier concentration of the crystalline oxide of the invention is a value measured at room temperature. The room temperature is 25° C., for example. Specifically, the room temperature is a temperature appropriately selected from a range of about 0 to 40° C.

The active layer 1041 of a thin film transistor 1 (semiconductor thin film) is a thin film containing crystalline substances (that is, a crystalline oxide). As for the crystalline oxide, by allowing at least part or all of the semiconductor thin film to be crystalline, the carrier concentration can be decreased or controlled easily. Furthermore, when forming a transistor, the operation thereof can be stabilized. Accordingly, performance such as electric characteristics, stability, uniformity, reproducibility, heat stability and durability can be improved.

The crystalline substance to be contained in the thin film may be either mono-crystalline or polycrystalline (including an epitaxial film). A polycrystalline film which is easily manufactured on the industrial basis and can be increased in area is preferable. A polycrystal is preferable, since a single crystal film may have cracks by bending or impact during the production process or use. For this reason, it is preferable to use a polycrystal.

In the invention, the crystalline oxide means an oxide exhibiting a specific diffraction pattern in the X-ray diffraction spectrum. On the other hand, an amorphous oxide means an oxide which shows a harrow pattern and does not exhibit a specific diffraction pattern.

Furthermore, it is preferred that the energy band gap between the conduction band and the valence band of the semiconductor thin film according to the invention be about 2.8 eV or more. Due to such a band gap, a disadvantage that electrons of the valence band are excited to allow current leakage to occur frequently by the irradiation with visible rays can be effectively avoided.

Furthermore, it is preferred that the above-mentioned crystalline oxide be a nondegenerate semiconductor.

In this way, the off-current can be rendered small and the on/off ratio can be increased.

Subsequently, on the gate-insulating film 1030 and the active layer 1041, a source wire 1052, a source electrode 1051, a drain electrode 1053, a drain wire 1054 and a pixel electrode 1055 are formed (Step S1004).

The source wire 1052, the source electrode 1051, the drain electrode 1053, the drain wire 1054 and the pixel electrode 1055 are composed of a material having the same composition as that of the prescribed material of the active layer 1041. They exhibit properties as a conductor by allowing them to be amorphous. The properties or the like as a conductor will be mentioned later.

Here, the source electrode 1051, the source wire 1052, the drain electrode 1053, the drain wire 1054 and the pixel electrode 1055 are simultaneously formed into a film in an amorphous state by a sputtering method or the like, and are shaped by simultaneous etching by a photolithographic method using a third mask (not shown). In this way, the production steps can be decreased to reduce the production cost.

In this case, the active layer 1041 is crystallized. Since it normally has PAN resistance (properties being insoluble in an acid mixture composed of phosphoric acid, acetic acid and nitric acid), selective etching with a PAN-based etching solution becomes possible. That is, the source electrode 1051, the drain electrode 1053 or the like can be formed without exerting damage on the active layer 1041.

Figure 3:
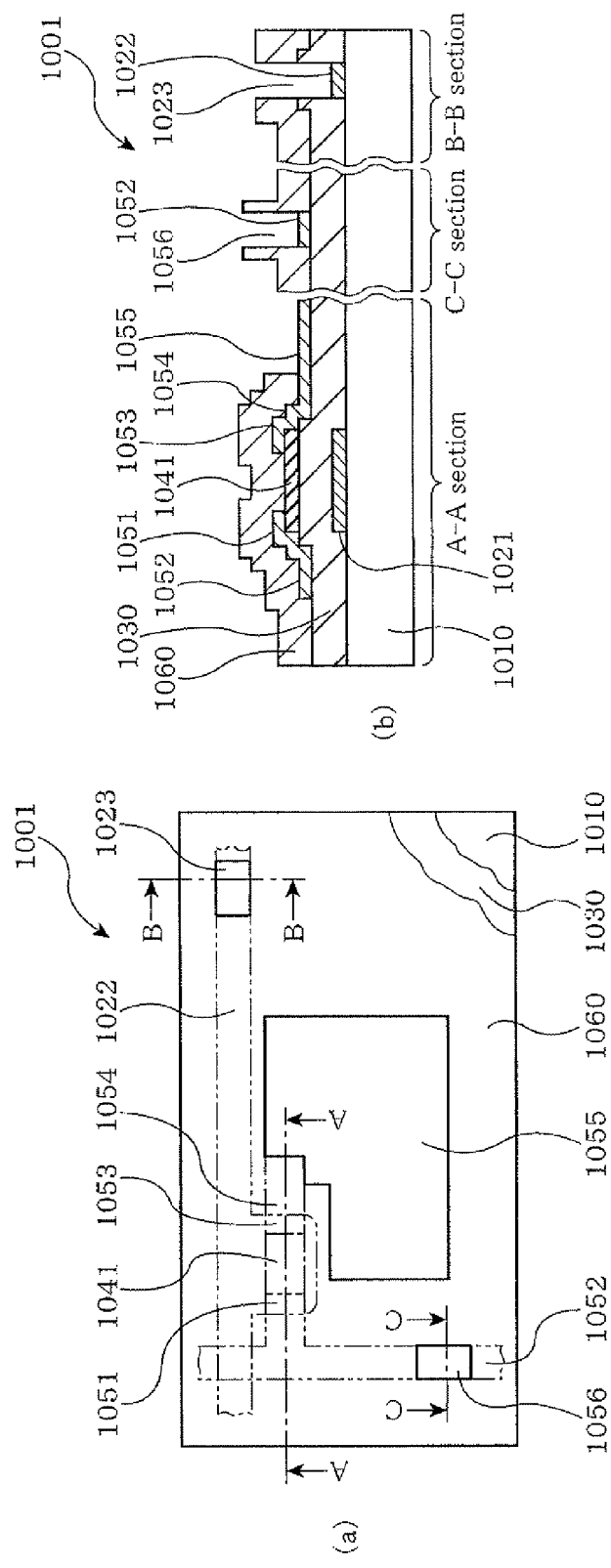
FIG. 3 is a schematic view of essential parts for explaining a method for producing a thin film transistor according to the first embodiment of the invention, in which (a) is a plan view showing the state in which a protective layer is formed, and (b) is a cross-sectional view of (a)

FIG. 3 is a schematic view of essential parts for explaining a method for producing a thin film transistor according to the first embodiment of the invention, in which (a) is a plan view showing the state in which a protective layer is formed, and (b) is a cross-sectional view of (a).

Then, as shown in FIG. 3, an SiNx film as a protective layer 1060 is formed by CVD on the gate-insulating film 1030, the source wire 1052, the source electrode 1051, the active layer 1041, the drain electrode 1053, the drain wire 1054 and the pixel electrode 1055 (Step S1005).

Here, the protective layer 1060 which has been formed into a film is subjected to dry etching by a photolithographic method using a fourth mask (not shown), whereby the pixel electrode 1055 is exposed. An opening part 1023 and an opening part 1056 are formed, and part of the gate wire 1022 and part of the source wire 1052 are exposed.

In this way, according to this embodiment, the thin film transistor 1001 provided with the protective layer 1060 can be formed by a production process using four masks.

Although not shown, when the active layer 1041 is formed also between the gate-insulating film 1030, and the source wire 1052, the drain wire 1054 and the pixel electrode 1055, the active layer 1041, the source electrode 1051, the source wire 1052, the drain electrode 1053, the drain electrode 1054 and the pixel electrode 1055 can be formed by using one half-tone mask.

Then, an explanation is made on the active layer 1041 which is composed of a prescribed material which is crystalline, as well as the source electrode 1051, the source wire 1052, the drain electrode 1053, the drain wire 1054 and the pixel electrode 1055 which are composed of an amorphous material having the same composition as that of the prescribed material constituting the active layer 1041.

The above-mentioned prescribed material is composed mainly of indium oxide. This material has properties as a semiconductor in a crystalline state, and is used as the active layer 1041. In an amorphous state, this material has properties as a transparent conductor, and is used as the source electrode 1051, the source wire 1052, the drain electrode 1053, the drain wire 1054 and the pixel electrode 1055.

That is, in the above-mentioned amorphous material, carriers (electrons) are generated by oxygen deficiency due to the amorphous nature. The material functions as a transparent material or the like improved in conductivity. On the other hand, in the above-mentioned material which has been crystallized, generation of carriers (electrons) associated with oxygen deficiency is suppressed. As a result, it effectively functions as the active layer of a thin film transistor.

The "composed mainly of indium oxide" means that, as for the number of atoms in metal components (the total number of metal atoms) in total metal oxides, the number of indium atom accounts for 50 at % or more.

It is preferred that the above-mentioned material composed mainly of indium oxide contain an oxide of a positive divalent metal.

Due to the presence of an oxide of a positive divalent metal, when crystallized, generation of carriers in the active layer of a thin film transistor composed mainly of indium oxide can be effectively suppressed. Therefore, the thin film transistor can be operated stably even if driven for a long period of time. As the oxide of a metal with a positive divalent metal include zinc oxide, magnesium oxide, calcium oxide, nickel oxide, copper oxide or the like are effective. These can effectively suppress carriers generated by oxygen deficiency and can allow the active layer of the thin film transistor to operate stably when driven for a long period of time.

In addition, if amorphous, these oxides stabilize generation of carriers by exhibiting effects of stabilizing the amorphous nature (i.e. prohibiting crystallization during the production process or decreasing the amount of carriers due to the decrease of oxygen deficiency caused by a reaction with oxygen), enabling stable long-term driving.

Furthermore, it is preferred that the above-mentioned material be composed mainly of indium oxide contain an oxide of a positive trivalent metal.

Due to the presence of an oxide of a positive trivalent metal, when crystallized, generation of carriers in the active layer of a thin film transistor composed mainly of indium oxide can be effectively suppressed. Therefore, the thin film transistor can be operated stably when driving for a long period of time. As the oxide of a positive trivalent metal, boron oxide, aluminum oxide, gallium oxide, scandium oxide, yttrium oxide, lanthanoid oxide-based oxide or the like are effective. As the lanthanoid oxide-based oxides, oxides of La, Nd, Sm, Eu, Gd, Dy, Ho, Er, Tm, Yb, Lu or the like are effective. They have a strong bonding power with oxygen. Accordingly, when crystallized, occurrence of oxygen deficiency can be suppressed, and generation of carriers can be effectively suppressed.

In addition, if amorphous, these oxides stabilize generation of carriers by exhibiting effects of stabilizing the amorphous nature (i.e. prohibiting crystallization during the production process or decreasing the amount of carriers due to the decrease of oxygen deficiency caused by a reaction with oxygen), enabling stable long-term driving.

In addition, it is preferred that the above-mentioned material composed mainly of indium oxide contain an oxide of a positive divalent metal and an oxide of a positive trivalent metal.

Due to the presence of an oxide of a positive divalent metal and an oxide of a positive trivalent metal, when crystallized, generation of carriers in the active layer of a thin film transistor composed mainly of indium oxide can be effectively suppressed. Therefore, the thin film transistor can be operated stably even if driven for a long period of time. As the oxide of a positive divalent metal, zinc oxide, magnesium oxide, calcium oxide, nickel oxide, copper oxide or the like are effective. As the oxide of a positive trivalent metal, boron oxide, aluminum oxide, gallium oxide, scandium oxide, yttrium oxide, lanthanoid oxide-based oxides or the like are effective. As the lanthanoid oxide-based oxides, oxides of La, Nd, Sm, Eu, Gd, Dy, Ho, Er, Tm, Yb, Lu or the like are effective. An oxide of a positive divalent metal can effectively suppress carriers generated by oxygen deficiency and can allow the active layer of the thin film transistor to operate stably when driven for a long period of time. The oxides of a positive trivalent metal have a strong bonding power with oxygen. Accordingly, when crystallized, generation of carriers due to oxygen deficiency can be effectively suppressed. In this sway, due to the presence of an oxide of a positive divalent metal and an oxide of a positive trivalent metal, activity of the thin film transistor can be effectively stabilized.

In addition, if amorphous, these oxides stabilize generation of carriers by exhibiting effects of stabilizing the amorphous nature (i.e. prohibiting crystallization during the production process or decreasing the amount of carriers due to a decrease in oxygen deficiency caused by a reaction with oxygen), enabling stable long-term driving.

The oxide of a positive divalent metal and the oxide of a positive trivalent metal may be added in an amount range which keeps an amorphous state when forming a thin film and does not inhibit crystallization by subsequent heat treatments (for example, laser annealing, plasma treatment, lamp heating).

As mentioned above, according to the method for producing a thin film transistor of this embodiment, the active layer 1041 composed of a prescribed material which is crystalline, and the source electrode 1051, the source wire 1052, the drain electrode 1053, the drain wire 1054 and the pixel electrode 1055 composed of an amorphous material having the same composition as that of the active layer 1041 are formed into a film simultaneously, followed by simultaneous etching.

That is, in the invention, as for the prescribed materials having the same composition, one is crystallized to allow it to be the active layer 1041 (semiconductor) and another is used in an amorphous state to allow it to be a conductor. Since the same material can be used, the management cost can be decreased.

In addition, since the source electrode 1051, the source wire 1052 and the drain electrode 1053, the drain wire 1054 and the pixel electrode 1055 are simultaneously formed into a film in an amorphous state, followed by simultaneous etching, the production steps can be decreased to reduce the production cost.

[First Embodiment of the Thin Film Transistor]

The thin film transistor 1001 in the above-mentioned embodiment is also effective as an invention of a thin film transistor.

The thin film transistor 1001 has a configuration in which it is provided with the active layer 1041 which is composed of the above-mentioned prescribed material and serves as a semiconductor, and the source electrode 1051, the source wire 1052, the drain electrode 1053, the drain wire 1054 and the pixel electrode 1055 which are composed of a material having the same composition as that of the above-mentioned prescribed material and serves as a conductor (see FIG. 3).

As mentioned above, the thin film transistor 1001 of this embodiment can reduce the management cost since the same material can be used. In addition, since the source electrode 1051, the source wire 1052 and the drain electrode 1053, the drain wire 1054 and the pixel electrode 1055 are simultaneously formed into a film in an amorphous state, followed by simultaneous etching, the production steps can be decreased to reduce the production cost.

[Second Embodiment of the Method for Producing a Thin Film Transistor]

Figure 4:
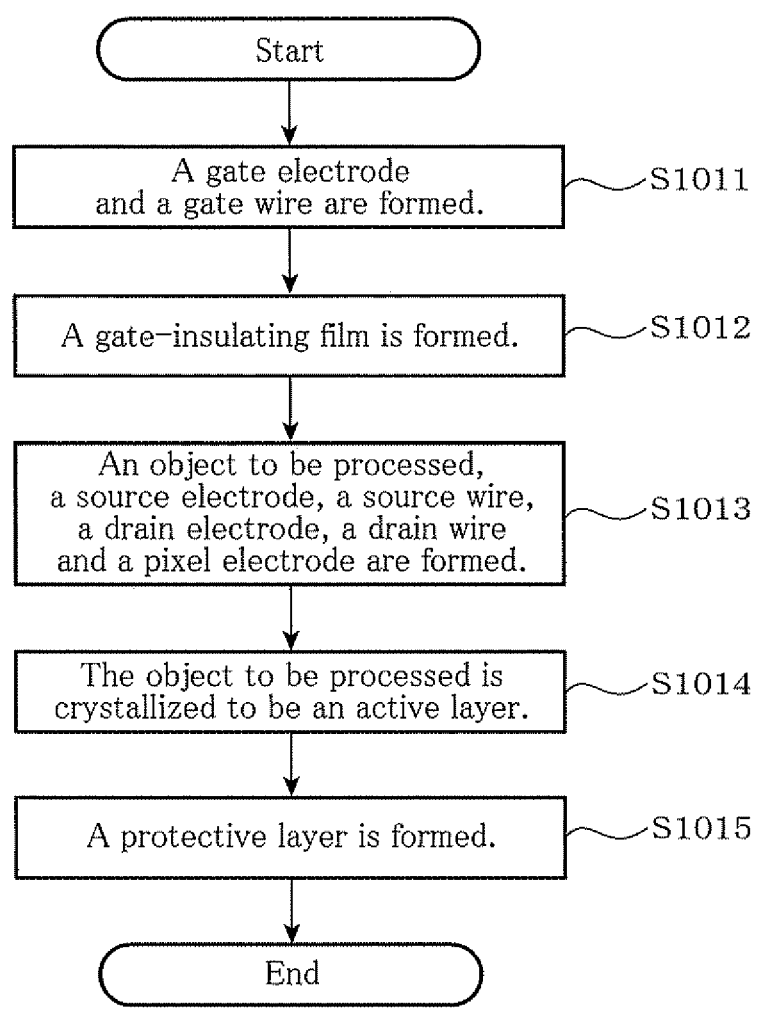
FIG. 4 is a schematic flow chart for explaining a method for producing a thin film transistor according to a second embodiment of the invention.

FIG. 4 is a schematic flow chart for explaining a method for producing a thin film transistor according to a second embodiment of the invention.

FIG. 5 is a schematic view of essential parts for explaining a method for producing a thin film transistor according to the second embodiment of the invention, in which (a) is a plan view in which a gate electrode, a gate wire, a gate-insulating film, an active layer, a source wire, a source electrode, a drain electrode, a drain wire and a pixel electrode are formed, (b) is a cross-sectional view of (a), (c) is a plan view in which a protective layer is formed, and (d) is a cross-sectional view of (d).

In FIG. 4 and FIG. 5, the method for producing a thin film transistor of this embodiment differs from the above-mentioned first embodiment in that, instead of Step S1003 and Step S1004 (see FIG. 1), an object to be processed to be the active layer 1041, the source electrode 1051, the source wire 1052, the drain electrode 1053, the drain wire 1054 and the pixel electrode 1055 are formed (Step S1013), and then the object to be processed is crystallized to allow it to be the active layer 1041 (Step 1014). The other methods are substantially the same as those in the first embodiment.

At first, in substantially the same manner as in the first embodiment, the gate electrode 1021 and the gate wire 1022 are formed on the glass substrate 1010 (Step S1011), and then, the gate-insulating film 1030 is formed (Step S1012).

Then, the object to be processed to be the active layer 1041, the source electrode 1051, the source wire 1052, the drain electrode 1053, the drain wire 1054 and the pixel electrode 1055 are formed on the gate-insulating film 1030 (Step S1013). That is, as shown in FIG. 5(*a*) and FIG. 5(*b*), the object to be processed to be the active layer 1041, the source electrode 1051, the source wire 1052, the drain electrode 1053, the drain wire 1054 and the pixel electrode 1055 are composed of the above-mentioned prescribed material, and are simultaneously formed into a film by a sputtering method or the like in an amorphous state, followed by simultaneous etching by a photolithographic method by using a second mask (not shown). As a result, the production steps can be decreased to reduce the production cost.

Subsequently, the object to be processed positioned above the gate electrode 1021 is locally crystallized to allow it to be the active layer 1041 (Step S1014). That is, as compared with the first embodiment, since no dedicated mask for forming the active layer 1041 is required, the production steps can be decreased to reduce the production cost.

Figure 6:
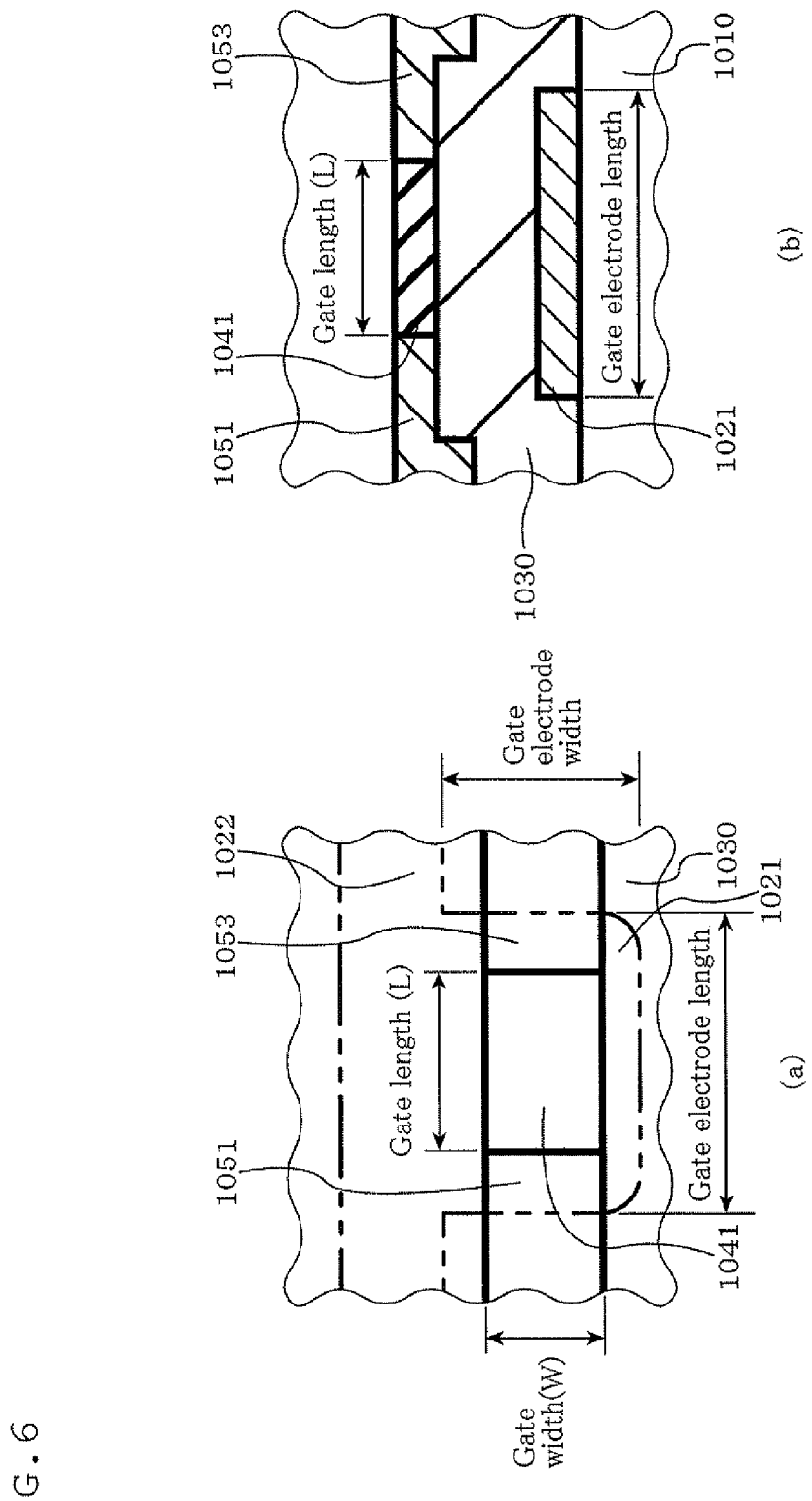
FIG. 6 is a schematic enlarged view for explaining the gate length and the gate width, (a) is a plan view and (b) is a cross-sectional view of (a)

Here, a part which serves as the active layer 1041 (thin film transistor) is crystallized by a laser annealing method, a rapid thermal annealing method using plasma or the like. As for the shape of the part which is allowed to be a semiconductor by local crystallization, as shown in FIG. 6, it is preferred that the gate length be shorter than the gate electrode length, and the gate width be shorter than the gate electrode width. In this way, the active layer 1041 can effectively accept influences brought about by application of a voltage to the gate electrode 1021, whereby transistor characteristics can be improved.

The crystallization conditions vary depending on an apparatus using the laser annealing method, the rapid thermal annealing method or the like. However, it is preferred that the crystallization be conducted under conditions which allow a crystal peak to appear by using an X-ray diffraction apparatus.

There are no particular restrictions on the lower limit of the electron carrier concentration of the active layer 1041, as long as it can be used as an active layer of a transistor.
Therefore, in the invention, the electron carrier concentration is allowed to be $10^{10}/cm^3$ or more and less than $10^{18}/cm^3$ by controlling the material, composition ratio, production conditions, post-treatment conditions or the like of a crystal oxide. It is preferred that the electron carrier concentration be $10^{11}/cm^3$ or more and $10^{17}/cm^3$ or less, with $10^{12}/cm^3$ or more and $10^{16}/cm^3$ or less being more preferable. With this range, it is possible to attain prescribed electron mobility and to sufficiently increase an on-off ratio. In addition, a normally-off thin film transistor can be obtained in a high yield.

The electron carrier concentration can be measured by the Hall effect measurement. It is preferred to perform the AC Hall measurement when measuring an electron carrier concentration of less than about $10^{17}/cm^3$. The reason therefor is that, in the case of the DC Hall measurement, there is a large degree of variation in measurement values, which may cause measurement reliability to be deteriorated.

For forming thin films which become the object to be processed which serve as the active layer 1041, the source electrode 1051, the source wire 1052, the drain electrode 1053, the drain wire 1054 and the pixel electrode 1055 (hereinafter, appropriately abbreviated as the "amorphous oxide layer"), a sputtering method is effective.

The sputtering gas used in this case, an argon gas is preferable. By using an argon gas, the resistance of the source electrode 1051, the source wire 1052, the drain electrode 1053, the drain wire 1054 and the pixel electrode 1055 can be lowered.

Furthermore, the above-mentioned amorphous oxide layer is formed with the temperature of the substrate being at room temperature. By forming a film at such a low temperature, an amorphous metal oxide layer can be formed. This amorphous metal oxide layer generates carriers by oxygen deficiency due to the amorphous structure, and is excellent in conductivity and transparency. Although there are no restrictions on the carrier concentration, the carrier concentration is $10^{19}/cm^3$ or more and less than $10^{21}/cm^3$, preferably $10^{20}/cm^3$ or more and less than $10^{21}/cm^3$ or less.

The sputtering gas is not limited to 100% argon gas, and may be an argon gas containing a slight amount of oxygen, nitrogen or the like, for example. By forming into a film in an argon gas atmosphere containing oxygen, nitrogen or the like, it operates as a stable transparent electrode in an amorphous state, and, if crystallized, oxygen deficiency is decreased, whereby semiconductor performance (carrier concentration) can be effectively stabilized.

Subsequently, in FIG. 4, FIG. 5(c) and FIG. 5(d), in substantially the same manner as in the first embodiment, on the gate-insulating film 1030, the active layer 1041, the source electrode 1051, the source wire 1052, the drain electrode 1053, the drain wire 1054 and the pixel electrode 1055, an SiNx film as the protective layer 1060 is formed by CVD (Step S1015).

The protective layer 1060 which has been formed is then subjected to dry etching by a photolithographic method using a third mask (not shown), whereby the pixel electrode 1055 is exposed. Then, the opening part 1023 and the opening part 1056 are formed, and part of the gate wire 1022 and part of the source wire 1052 are exposed to become wiring pads.

In this way, according to this embodiment, the thin film transistor 1002 provided with the protective layer 1060 can be produced by a production process using three masks.

As explained above, according to the method for producing a thin film transistor of this embodiment, the object to be processed to be the active layer 1041, the source electrode 1051, the source wire 1052, the drain electrode 1053, the drain wire 1054 and the pixel electrode 1055 which are composed of an amorphous prescribed material are simultaneously formed into a film, followed by simultaneous etching.

That is, a thin film formed of a prescribed material which is amorphous is simultaneously formed, followed by simultaneous etching. Part of this thin film is locally crystallized to allow it to be the active layer 1041 (semiconductor), and the remaining part is used as it is in an amorphous state to be the conductor. As a result, the production steps can be decreased to reduce the production cost.

In addition, since the same material can be used, the management cost can be decreased.

Furthermore, in the conventional silicon-based TFT for driving a liquid crystal panel, for example, since the materials of a transistor differ from the materials of a transparent electrode (pixel electrode) for driving a liquid crystal panel, the active layer or the pixel electrode could not be formed as the same layer. In the invention, by allowing a material for forming the transparent electrode for driving a liquid crystal and a material for forming the thin film transistor (active layer) to be the same, and the electrode part is allowed to have an amorphous structure and the active layer part is allowed to have a crystalline structure, the production steps can be drastically reduced.

[Second Embodiment of the Thin Film Transistor]

The thin film transistor 1002 in the above-mentioned embodiment is also effective as an invention of a thin film transistor.

The thin film transistor 1002 has a configuration in which it is provided with the active layer 1041 which is composed of the above-mentioned prescribed material and serves as a semiconductor, and the source electrode 1051, the source wire 1052, the drain electrode 1053, the drain wire 1054 and the pixel electrode 1055 which are composed of a material having the same composition as that of the above-mentioned prescribed material and serves as a conductor (see FIG. 5).

As mentioned above, the thin film transistor 1002 of this embodiment can reduce the management cost since the same material can be used. In addition, since the object to be processed to be the active layer 1041, the source electrode 1051, the source wire 1052 and the drain electrode 1053, the drain wire 1054 and the pixel electrode 1055 are simultaneously formed into a film in an amorphous state, followed by simultaneous etching, the production steps can be decreased to reduce the production cost.

FIRST APPLICATION EXAMPLE

The above-mentioned second embodiment of the method for producing the thin film transistor and the above-mentioned second embodiment of the thin film transistor have various application examples.

Then, the first application example will be explained with reference to the drawings.

Figure 7:
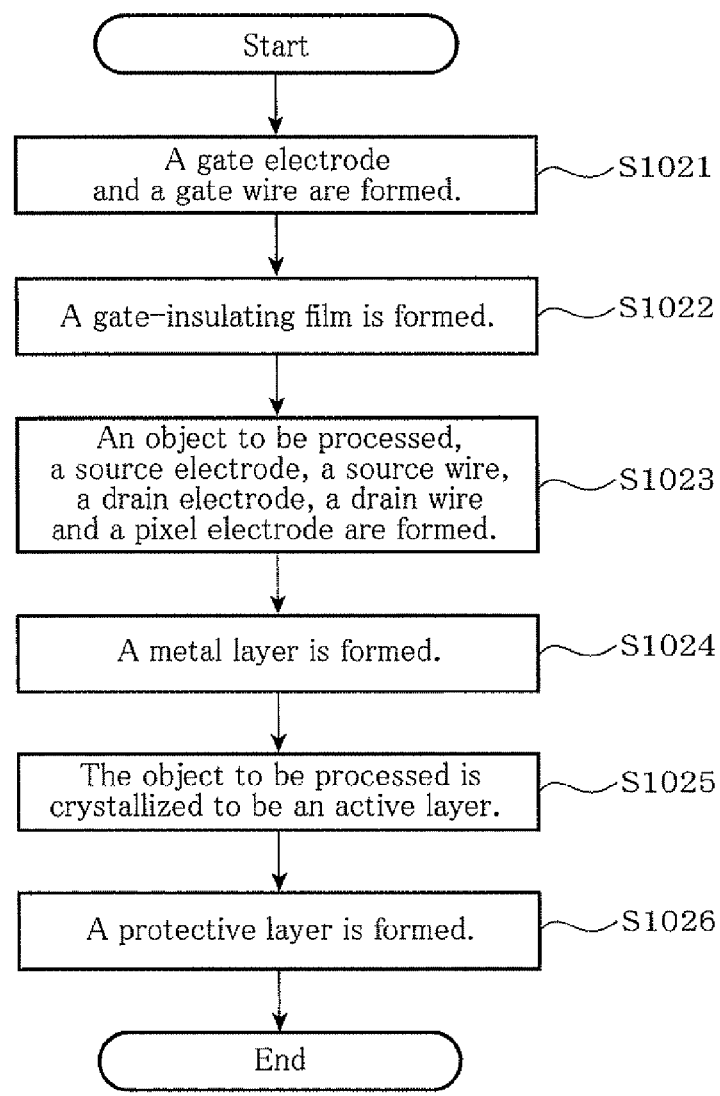
FIG. 7 is a schematic flow chart for explaining a first application example of a method for producing a thin film transistor according to the second embodiment of the invention.

FIG. 7 is a schematic flow chart for explaining a first application example of a method for producing a thin film transistor according to the second embodiment of the invention.

FIG. 8 is a schematic view of essential parts for explaining the first application example of the method for producing a thin film transistor according to the second embodiment of the invention, in which (a) is a plan view showing the state in which a gate electrode, a gate wire, a gate-insulating film, an active layer, a source wire, a source electrode, a drain electrode, a drain wire, a pixel electrode and a metal layer are formed, (b) is a cross-sectional view of (a), and (c) is a plan view in which a protective layer is formed, and (d) is a cross-sectional view of (c).

In FIG. 7 and FIG. 8, the method for producing the thin film transistor 1002a in this application example differs from the above-mentioned second embodiment in that, between the Step S1013 and the Step S1014 (see FIG. 4), a source electrode 1051a, a source wire 1052a, a drain electrode 1053a and a drain wire 1054a, which are formed of a metal layer, are formed (Step S1024). Other methods are substantially the same as those in the second embodiment.

In substantially the same manner as in the second embodiment, on the glass substrate 1010, the gate electrode 1021 and the gate wire 1022 are formed (Step S1021), and then, the gate-insulating film 1030 is formed (Step S1022).

In substantially the same manner as in the second embodiment, an amorphous oxide layer is formed in order to provide on the gate-insulating film 1030, an object to be processed to be the active layer 1041, the source electrode 1051, the source wire 1052, the drain electrode 1053, the drain wire 1054 and the pixel electrode 1055, and then a metal layer is formed by a sputtering method or the like.

Then, on the gate-insulating film 1030, the object to be processed to be the active layer 1041, the source electrode 1051, the source wire 1052, the drain electrode 1053, the drain wire 1054 and the pixel electrode 1055 are formed on the gate-insulating film 1030 by a photolithographic method using a second half-tone mask (not shown) (Step S1023).

Then, a resist which is formed by using the second half-tone mask is re-formed, and using the re-formed resist (not shown), a source electrode 1051a, a source wire 1052a, a drain electrode 153a and the drain wire 1054a, which are formed of a metal layer, are formed by a photolithographic method (Step S1024). As a result, the surfaces of the active layer 1041 and the pixel electrode 1055 are exposed. That is, the source electrode, the source wire, the drain electrode and the drain wire of a thin film transistor 1002a is a stacked layer structure of an amorphous oxide layer and a metal layer, and the active layer 1041 (thin film transistor part) and the pixel electrode 1055 are formed of only an amorphous oxide layer.

Then, as shown in FIG. 8(b), in substantially the same manner as in the second embodiment, the object to be processed positioned above the gate electrode 1021 is locally crystallized to allow it to be the active layer 1041 (Step S1025).

Then, as shown in FIG. 8(c) and FIG. 8(d), in substantially the same manner as in the second embodiment, an SiNx film as the protective layer 1060 is formed by CVD on the gate-insulating film 1030, the active layer 1041, the source electrode 1051a, the source wire 1052a, the drain electrode 1053a, the drain wire 1054a and the pixel electrode 1055 (Step S1026).

The protective layer 1060 which has been formed is then subjected to dry etching by a photolithographic method using a third mask (not shown), whereby the pixel electrode 1055 is exposed. Then, the opening part 1023 and the opening part 1056 are formed, and part of the gate wire 1022 and part of the source wire 1052a are exposed to become wiring pads.

In this way, according to this application example, the thin film transistor 1002a provided with the protective layer 1060 can be produced by a production process using three masks.

As mentioned hereinabove, according to the thin film transistor 1002a of this application example, the object to be processed which is composed of a prescribed material which is amorphous and serves as the active layer 1041, the source electrode 1051, the source wire 1052, the drain electrode 1053, the drain wire 1054 and the pixel electrode 1055 are simultaneously formed into a film, followed by simultaneous etching. In addition, by forming a source electrode 1051a, a source wire 1052a, a drain electrode 1053a and a drain wire 1054a which are formed of a metal, connection with the active layer 1041 is ensured.

The thin film transistor 1002a in this application example is also effective as an invention of a thin film transistor.

In the above-mentioned application example, crystallization of the active layer 1041 is conducted before forming the protective layer 1060. The manner of crystallization is not limited thereto. For example, crystallization may be conducted by a laser annealing method or the like from the side of the glass surface after the formation of the protective layer 1060.

In the above-mentioned application example, the active layer 1041 is crystallized after the metal layer is patterned using the re-formed resist (not shown). The manner of crystallization is not limited thereto. For example, the active layer 1041 may be crystallized after the amorphous oxide layer is patterned, followed by the patterning of the metal layer.

SECOND APPLICATION EXAMPLE

Then, a second application example will be explained with reference to the drawings.

Figure 9:
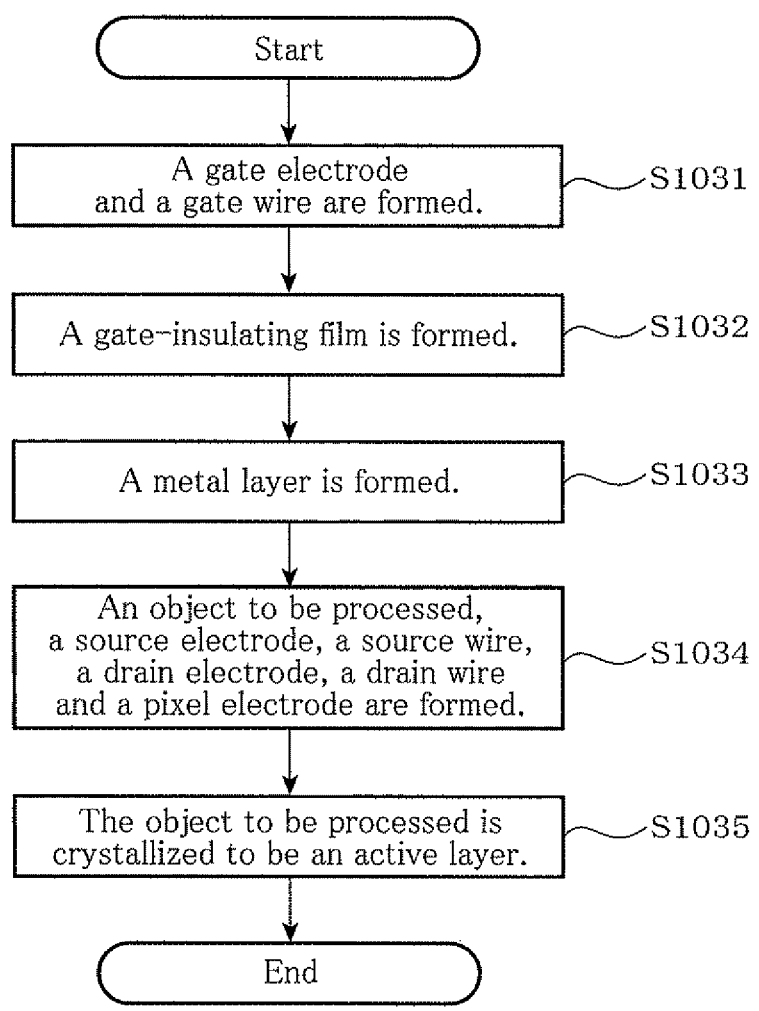
FIG. 9 is a schematic flow chart for explaining a second application example of the method for producing a thin film transistor according to the second embodiment of the invention.

FIG. 9 is a schematic flow chart for explaining a second application example of the method for producing a thin film transistor according to the second embodiment of the invention.

Figure 10:
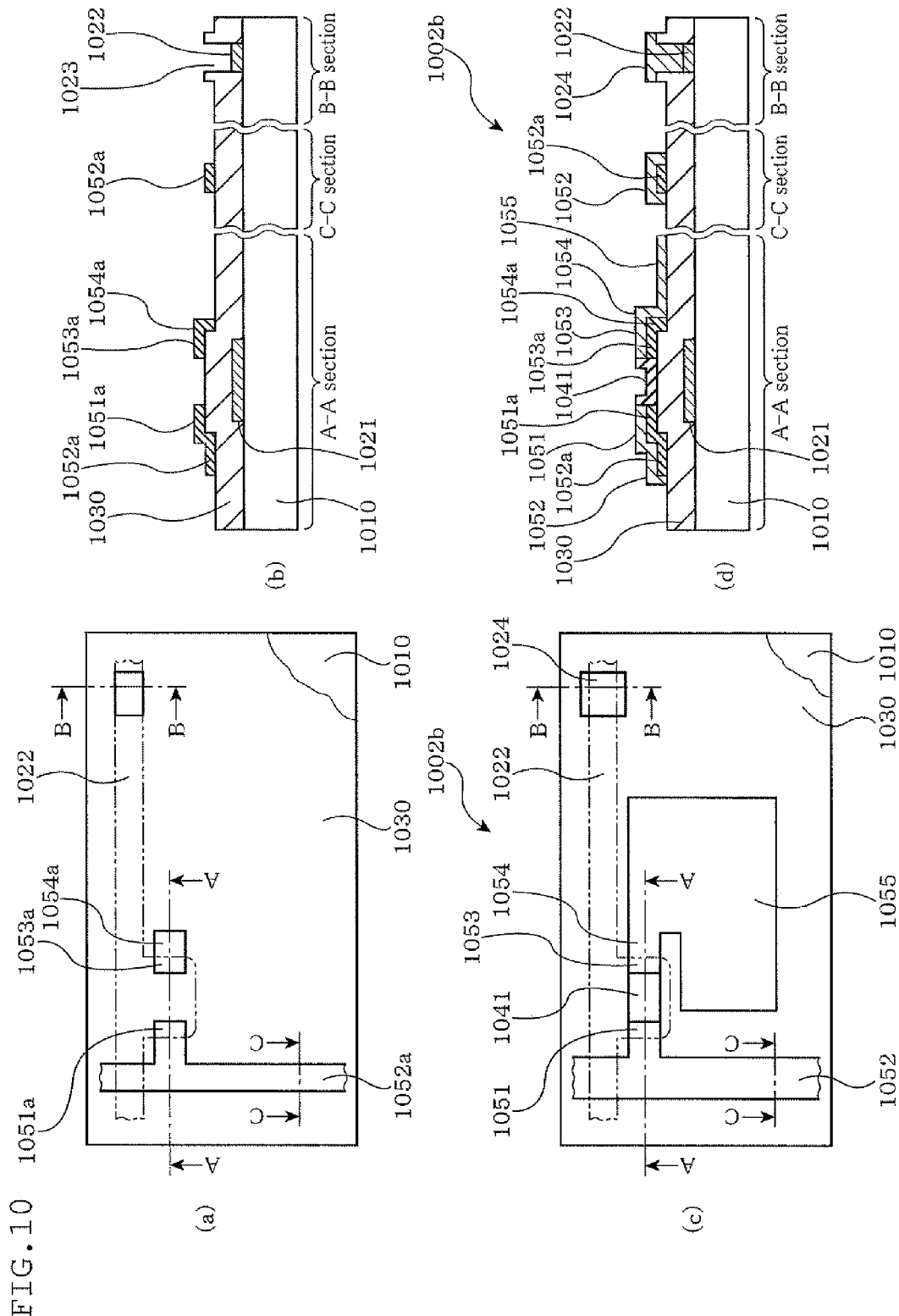
FIG. 10 is a schematic view of essential parts for explaining the second application example of the method for producing a thin film transistor according to the second embodiment of the invention, in which (a) is a plan view showing the state in which a gate electrode, a gate wire, a gate-insulating film, a metal layer and an opening are formed; (b) is a cross-sectional view of (a), (c) is a plan view showing the state in which a source electrode, a source wire, an active layer, a drain electrode, a drain wire, a pixel electrode and a gate wire pad are formed, and (d) is a cross-sectional view of (c)

FIG. 10 is a schematic view of essential parts for explaining the second application example of the method for producing a thin film transistor according to the second embodiment of the invention, in which (a) is a plan view showing the state in which a gate electrode, a gate wire, a gate-insulating film, a metal layer and an opening are formed, (b) is a cross-sectional view of (a), (c) is a plan view showing the state in which a source electrode, a source wire, an active layer, a drain electrode, a drain wire, a pixel electrode and a gate wire pad are formed, and (d) is a cross-sectional view of (c).

In FIG. 9 and FIG. 10, the method for producing the thin film transistor 1002b in this application example differs from the above-mentioned second embodiment in that, between the Step S1012 and the Step S1013 (see FIG. 4), the source electrode 1051a, the source wire 1052a, the drain electrode 1053a and the drain wire 1054a, which are formed of a metal layer, are formed (Step S1033), and the protective layer 1060 is not formed. Other methods are substantially the same as those of the second embodiment.

In substantially the same manner as in the second embodiment, on the glass substrate 1010, the gate electrode 1021 and the gate wire 1022 are formed (Step S1031), and then, the gate-insulating film 1030 is formed (Step S1032).

Then, a metal layer is formed by a sputtering method or the like, and by a photolithographic method or the like using the second mask (not shown), the source electrode 1051*a*, the source wire 1052*a*, the drain electrode 1053*a* and the drain wire 1054*a* are formed (Step S1033). Subsequently, as shown in FIG. 10(*b*), a photolithographic method using the third mask (not shown), the opening part 1023 is formed above part of the gate wire 1022.

Then, on the gate-insulating film 1030, the source electrode 1051*a*, the source wire 1052*a*, the drain electrode 1053*a*, the drain wire 1054*a* and part of the exposed gate wire 1022, by a sputtering method or the like, a thin film composed of the above-mentioned prescribed material which is amorphous (amorphous oxide layer) is simultaneously formed. Subsequently, by a photolithographic method using the fourth mask (not shown), the object to be processed to be the active layer 1041, the source electrode 1051, the source wire 1052, the drain electrode 1053, the drain wire 1054, the pixel electrode 1055 and the gate wire pad 1024 are simultaneously shaped (Step S1034).

In substantially the same manner as in the second embodiment, the object to be processed positioned above the gate electrode 1021 positioned above the gate electrode 1021 is locally crystallized to allow it to be the active layer 1041 (Step S1035).

Here, the source electrode 1051*a* and the drain electrode 1053*a* are satisfactorily connected with the active layer 1041.

As mentioned above, according to this application example, the thin film transistor 1002*b* can be produced by a production process using four masks.

As explained above, according to the method for producing the thin film transistor 1002*b* of this application example, the object to be processed to be the active layer 1041, the source electrode 1051, the source wire 1052, the drain electrode 1053, the drain wire 1054, the pixel electrode 1055 and the gate wire pad 1024 are simultaneously formed into a film, followed by simultaneous etching. In addition, by forming the source electrode 1051*a*, the source wire 1052*a*, the drain electrode 1053*a* and the drain wire 1054*a*, connection with the active layer 1041 can be ensured.

The thin film transistor 1002*b* according to this application example is also effective as an invention of the thin film transistor.

[Third Embodiment of the Method for Producing a Thin Film Transistor]

Figure 11:
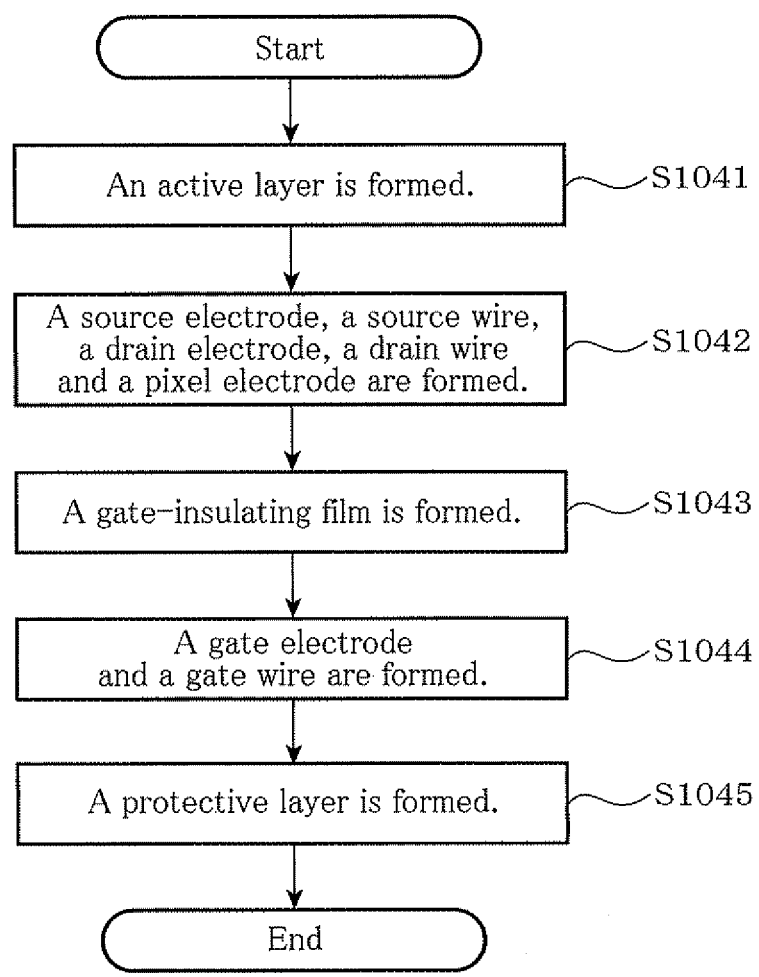
FIG. 11 is a schematic flow chart showing the method for producing a thin film transistor according to the third embodiment of the invention.

FIG. 11 is a schematic flow chart showing the method for producing a thin film transistor according to the third embodiment of the invention.

Figure 12:
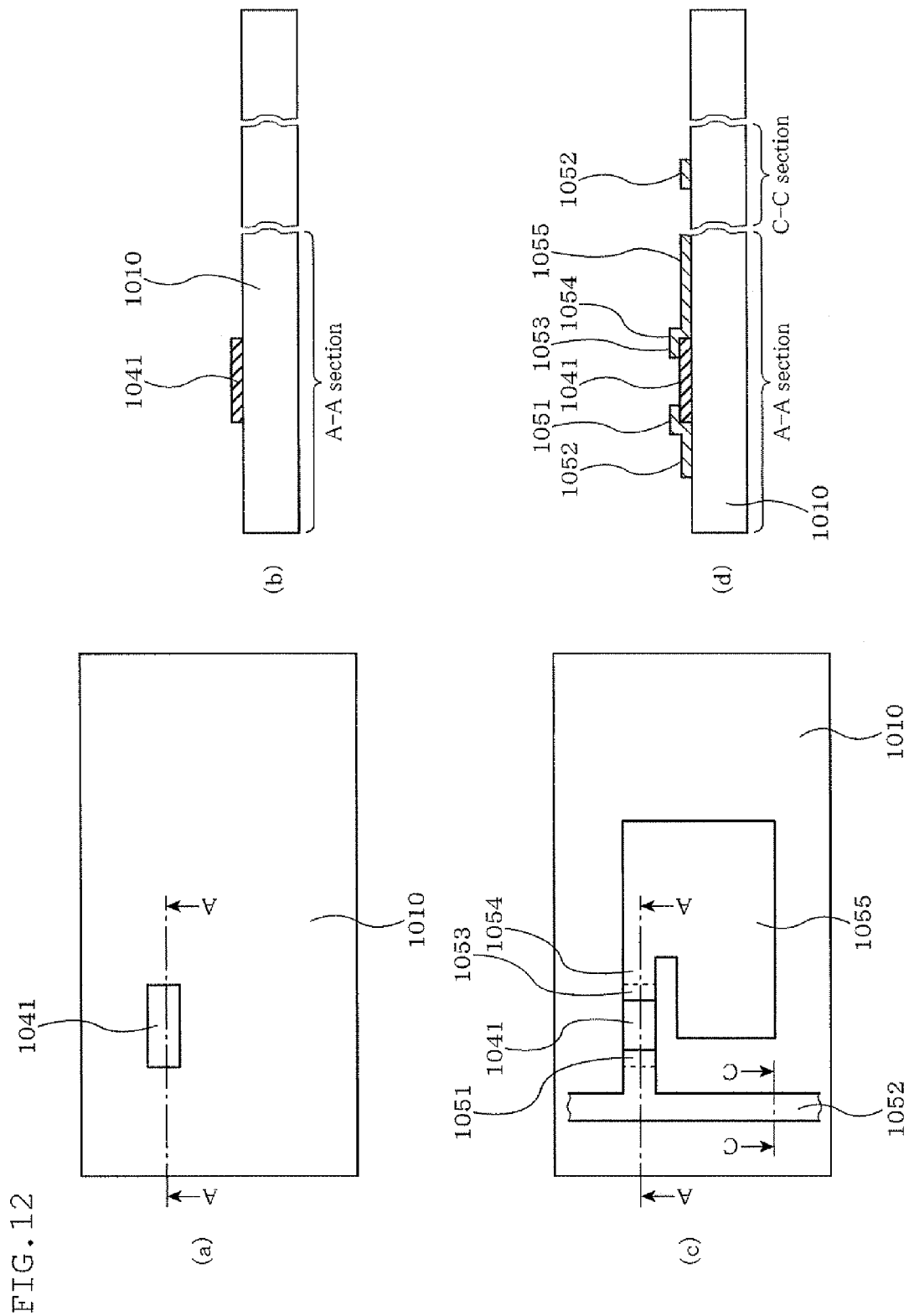
FIG. 12 is a schematic view of essential parts for explaining the method for producing a thin film transistor according to the third embodiment of the invention, in which (a) is a plan view showing the state in which an active layer is formed, (b) is a cross-sectional view of (a), (c) is a plan view showing the state in which a source wire, a source electrode, a drain electrode, a drain wire and a pixel electrode are formed, and (d) is a cross-sectional view of (c)

FIG. 12 is a schematic view of essential parts for explaining the method for producing a thin film transistor according to the third embodiment of the invention, in which (a) is a plan view showing the state in which an active layer is formed, (b) is a cross-sectional view of (a), (c) is a plan view showing the state in which a source wire, a source electrode, a drain electrode, a drain wire and a pixel electrode are formed, and (d) is a cross-sectional view of (c).

In FIG. 11, FIG. 12(*a*) and FIG. 12(*b*), a transparent glass substrate 1010 is prepared at first. On this glass substrate 1010, by a photolithographic method using a first mask (not shown), the active layer 1041 is formed (Step S1041). This active layer 1041 is composed of the above-mentioned prescribed material, and exhibit properties as a semiconductor by allowing it to be crystalline.

Here, the active layer 1041 is formed into a film by a sputtering method in a crystalline state, followed by shaping by a photolithographic method using a first mask (not shown). The method is, however, not limited thereto. For example, film formation may be conducted in an amorphous state. The film may be then shaped by a photolithographic method using a first mask (not shown), followed by crystallization.

Next, on the glass substrate 1010 and the active layer 1041, the source electrode 1051, the source wire 1052, the drain electrode 1053, the drain wire 1054 and the pixel electrode 1055 are formed (Step S1042).

The source electrode 1051, the source wire 1052, the drain electrode 1053, the drain wire 1054 and the pixel electrode 1055 are composed of a material having the same composition as that of the prescribed material of the active layer 1041. They exhibit properties as a conductor by allowing them to be amorphous.

Here, the source electrode 1051, the source wire 1052, the drain electrode 1053, the drain wire 1054 and the pixel electrode 1055 are simultaneously formed into a film in an amorphous state by a sputtering method or the like, and are shaped by simultaneous etching by a photolithographic method using a second mask (not shown). In this way, the production steps can be decreased to reduce the production cost.

In this case, the active layer 1041 is crystallized. Since it normally has PAN resistance, selective etching with a PAN-based etching solution becomes possible. That is, the source electrode 1051, the drain electrode 1053 or the like can be formed without exerting damage on the active layer 1041.

Figure 13:
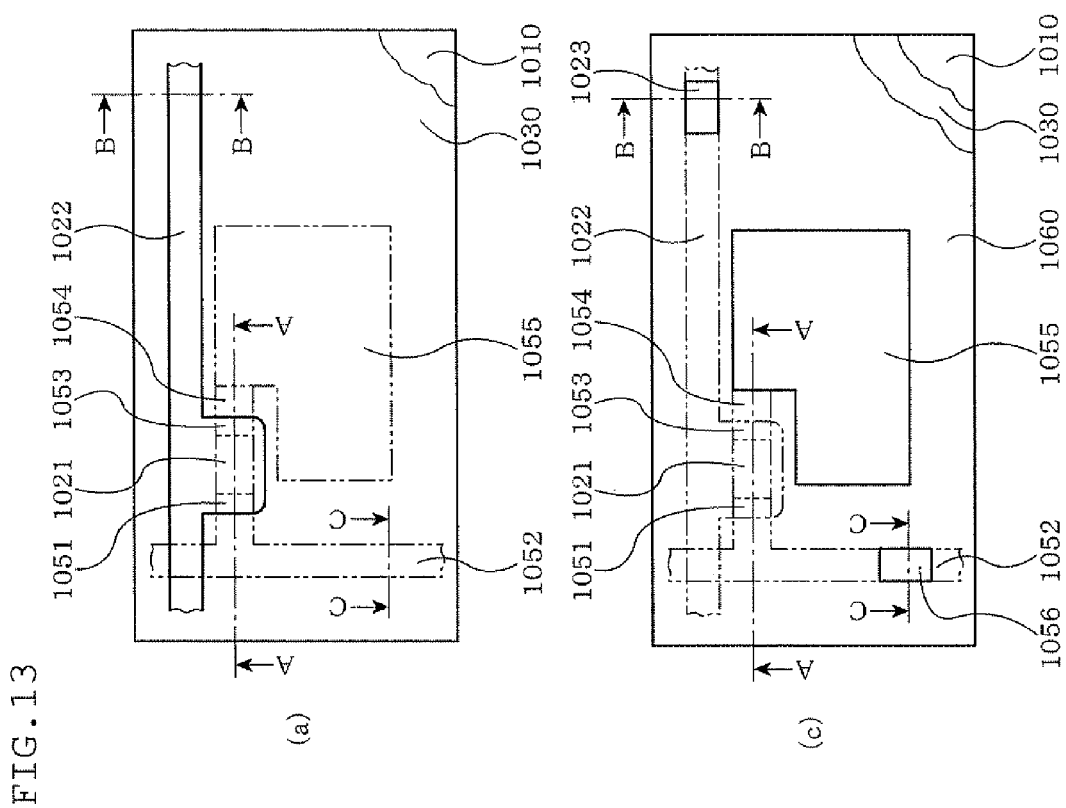
FIG. 13 is a schematic view of essential parts for explaining the method for producing a thin film transistor according to the third embodiment of the invention, in which (a) is a plan view showing the state in which a gate-insulating film, a gate electrode and a gate wire are formed, (b) is a cross-sectional view of (a), (c) is a plan view showing the state in which a protective layer is formed, and (d) is a cross-sectional view of (c)

FIG. 13 is a schematic view of essential parts for explaining the method for producing a thin film transistor according to the third embodiment of the invention, in which (a) is a plan view showing the state in which a gate-insulating film, a gate electrode and a gate wire are formed, (b) is a cross-sectional view of (a), (c) is a plan view of a cross-sectional view showing the state in which a protective layer is formed, and (d) is a cross-sectional view of (c).

As shown in FIG. 11, FIG. 13(*a*) and FIG. 13(*b*), on the glass substrate 1010, the source wire 1052, the source electrode 1051, the active layer 1041, the drain electrode 1053, the drain wire 1054 and the pixel electrode 1055, an SiNx film as the gate-insulating film 1030 is formed by CVD (chemical vapor deposition method) (Step S1043).

Subsequently, on the gate-insulating film 1030, a gate electrode 1021 and a gate wire 1022, which are composed of a metal thin film, are formed in a desired shape (Step S1044).

Then, as shown in FIG. 13(*c*) and FIG. 13(*d*), the SiNx film as the protective layer 1060 is formed by CVD on the gate-insulating film 1030, the gate electrode 1021 and the gate wire 1022 (Step S1045).

The protective layer 1060 which has been formed is then subjected to dry etching by a photolithographic method using a fourth mask (not shown), whereby the pixel electrode 1055 is exposed. Then, the opening part 1023 and the opening part 1056 are formed, and part of the gate wire 1022 and part of the source wire 1052 are exposed to become wiring pads.

In this way, according to this embodiment, the top-gate type thin film transistor 1003 provided with the protective layer 1060 can be produced by a production process using four masks.

As explained above, according to the method for producing a thin film transistor 1003 in this embodiment, the active layer 1041 composed of a prescribed material which is crystalline, and the source electrode 1051 is formed, and the source wire 1052, the drain electrode 1053, the drain wire 1054 and the pixel electrode 1055, which are composed of a material which has the same composition as that of the prescribed material of the active layer 1041 and is amorphous, are simultaneously formed into a film, followed by simultaneous etching.

That is, in the invention, as for the prescribed materials having the same composition, one is crystallized to allow it to be the active layer 1041 (semiconductor) and another is used in an amorphous state to allow it to be a conductor. Since the same material can be used, the management cost can be decreased.

In addition, the source electrode 1051, the source wire 1052, the drain electrode 1053, the drain wire 1054 and the pixel electrode 1055 are provided by simultaneously forming into a film in an amorphous state, followed by simultaneous etching. Therefore, the production steps are decreased to reduce the production cost.

[Third Embodiment of the Thin Film Transistor]

The thin film transistor 1003 in the above-mentioned embodiment is also effective as an invention of a thin film transistor.

The thin film transistor 1003 has a configuration in which it is provided with the active layer 1041 which is composed of the above-mentioned prescribed material and serves as a semiconductor, and the source electrode 1051, the source wire 1052, the drain electrode 1053, the drain wire 1054 and the pixel electrode 1055 which are composed of a material having the same composition as that of the above-mentioned prescribed material and serves as a conductor (see FIG. 13).

As mentioned above, the thin film transistor 1003 of this embodiment can reduce the management cost since the single material can be used. In addition, since the source electrode 1051, the source wire 1052 and the drain electrode 1053, the drain wire 1054 and the pixel electrode 1055 are simultaneously formed into a film in an amorphous state, followed by simultaneous etching, the production steps can be decreased to reduce the production cost.

[Fourth Embodiment of the Method for Producing a Thin Film Transistor]

Figure 14:
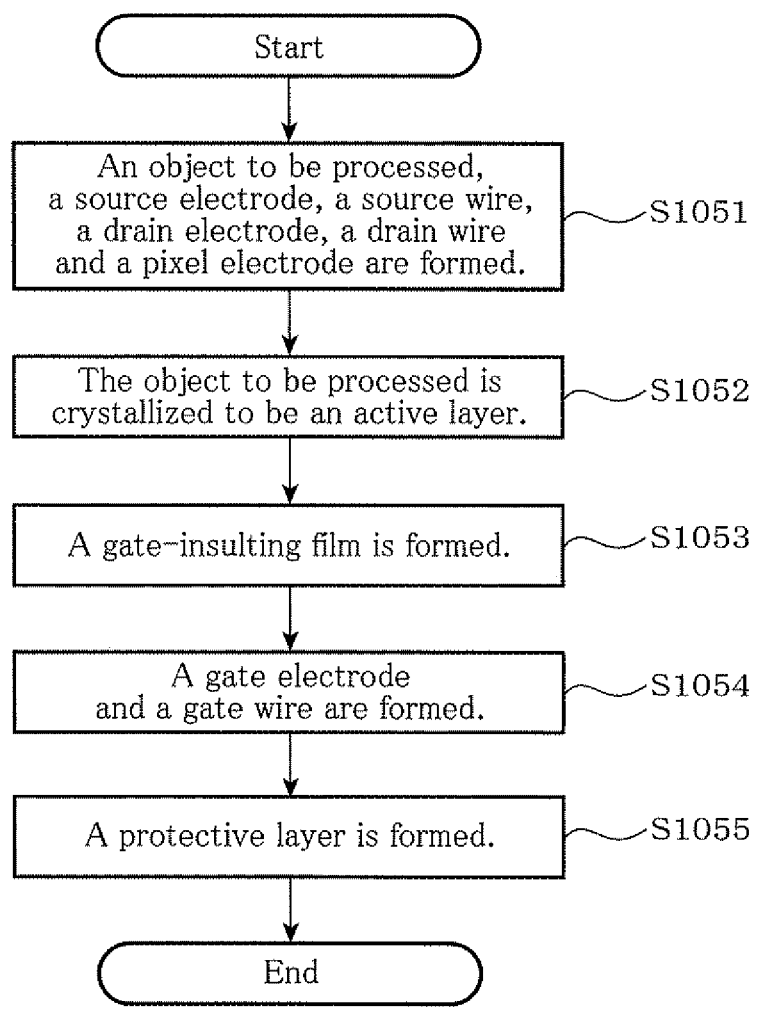
FIG. 14 is a schematic flow chart for explaining the method for producing a thin film transistor according to the fourth embodiment of the invention.

FIG. 14 is a schematic flow chart for explaining the method for producing a thin film transistor according to the fourth embodiment of the invention.

Figure 15:
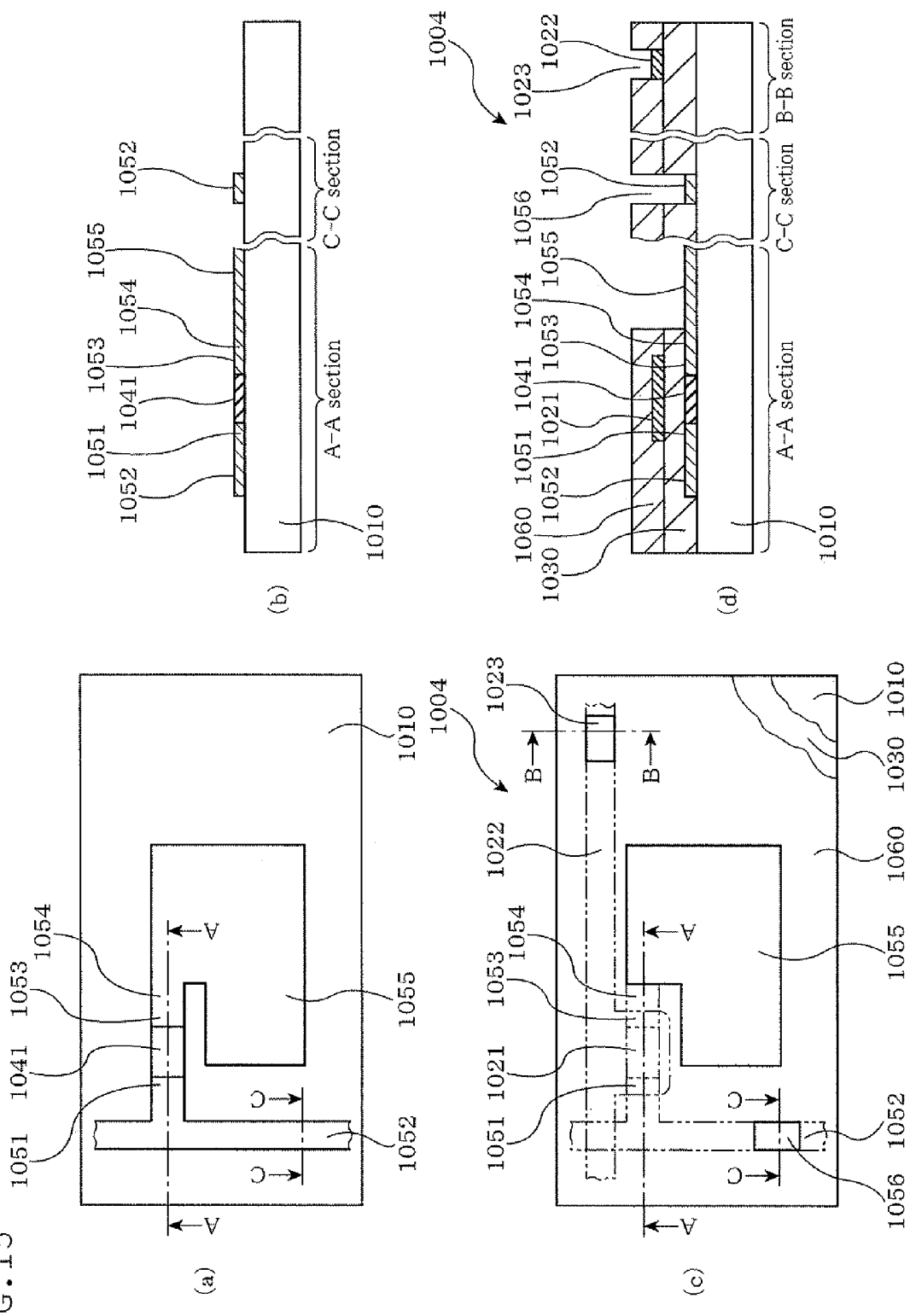
FIG. 15 is a schematic view of essential parts for explaining the method for producing a thin film transistor according to the fourth embodiment of the invention, in which (a) is a plan view showing the state in which an active layer, a source wire, a source electrode, a drain electrode, a drain wire and a pixel electrode are formed, (b) is a cross-sectional view of (a), (c) is a plan view showing the state in which a gate-insulating film, a gate electrode, a gate wire and a protective layer are formed, and (d) is a cross-sectional view of (c)

FIG. 15 is a schematic view of essential parts for explaining the method for producing a thin film transistor according to the fourth embodiment of the invention, in which (a) is a plan view showing the state in which an active layer, a source wire, a source electrode, a drain electrode, a drain wire and a pixel electrode are formed, (b) is a cross-sectional view of (a), (c) is a plan view showing the state in which a gate-insulating film, a gate electrode, a gate wire and a protective layer are formed, and (d) is a cross-sectional view of (c).

In FIG. 14 and FIG. 15, the method for producing a thin film transistor in this embodiment differs from the above-mentioned third embodiment in that, instead of the Step S1041 and the Step S1042 (see FIG. 11), the object to be processed to be the active layer 1041, the source electrode 1051, the source wire 1052, the drain electrode 1053, the drain wire 1054 and the pixel electrode 1055 are formed (Step S1051), followed by crystallization of the object to be processed to allow it to be the active layer 1041 (Step S1051). Subsequently, the object to be processed is crystallized to allow it to be the active layer 1041 (Step S1052). Other methods are substantially the same as those in the third embodiment.

On the glass substrate 1010, the object to be processed to be the active layer 1041, the source electrode 1051, the source wire 1052, the drain electrode 1053, the drain wire 1054 and the pixel electrode 1055 are formed (Step S1051).

That is, as shown in FIG. 15(*b*), the object to be processed to be the active layer 1041, the source electrode 1051, the source wire 1052, the drain electrode 1053, the drain wire 1054 and the pixel electrode 1055 are composed of the above-mentioned prescribed material, and simultaneously formed into a film in an amorphous state, and then shaped by simultaneous etching by a photolithographic method using a first mask (not shown). In this way, the production steps are decreased to reduce the production cost.

Subsequently, the object to be processed is locally crystallized to allow it to be the active layer 1041 (Step S1052). That is, as compared with the third embodiment, no dedicated mask for forming the active layer 1041 is required, the production steps can be decreased to reduce the production cost.

In addition, in substantially the same manner as in the second embodiment, a part which serves as the active layer 1041 (thin film transistor) is crystallized by a laser annealing method, a rapid thermal annealing method using plasma or the like.

Then, as shown in FIGS. 15(*c*) and 15(*d*), in substantially the same manner as in the third embodiment, an SiNx film as the gate-insulating film 1030 is formed by CVD (chemical vapor deposition) on the glass substrate 1010, the source wire 1052, the source electrode 1051, the active layer 1041, the drain electrode 1053, the drain wire 1054 and the pixel electrode 1055 (Step S1053).

Subsequently, by a photolithographic method using a second mask (not shown), on the gate-insulating film 1030, a gate electrode 1021 and a gate wire 1022, which are composed of a metal thin film, are formed in a desired shape (Step S1054).

Then, on the gate-insulating film 1030, the gate electrode 1021 and the gate wire 1022, an SiNx film as the protective layer 1060 is formed by CVD (Step S1055).

The protective layer 1060 which has been formed is then subjected to dry etching by a photolithographic method using a third mask (not shown), whereby the pixel electrode 1055 is exposed. Then, the opening part 1023 and the opening part 1056 are formed, and part of the gate wire 1022 and part of the source wire 1052 are exposed to become wiring pads.

In this way, according to this embodiment, the top-gate type thin film transistor 1004 provided with the protective layer 1060 can be produced by a production process using three masks.

As explained above, according to the method for producing a thin film transistor of this embodiment, the object to be processed which serves to be the active layer 1041, the source electrode 1051, the source wire 1052, the drain electrode 1053, the drain wire 1054 and the pixel electrode 1055, which are composed of a prescribed material and is amorphous, are simultaneously formed into a film, followed by simultaneous etching.

That is, a thin film formed of a prescribed material which is amorphous is simultaneously formed, followed by simultaneous etching. Part of this thin film is locally crystallized to allow it to be the active layer 1041 (semiconductor), and the remaining part is used as it is in an amorphous state. As a result, the production steps can be decreased to reduce the production cost. In addition, since the same material can be used, the management cost can be decreased.

[Fourth Embodiment of the Thin Film Transistor]

The thin film transistor 1004 in the above-mentioned embodiment is also effective as an invention of a thin film transistor.

The thin film transistor 1004 has a configuration in which it is provided with the active layer 1041 which is composed of the above-mentioned prescribed material and serves as a semiconductor, and the source electrode 1051, the source wire 1052, the drain electrode 1053, the drain wire 1054 and the pixel electrode 1055 which are composed of a material having the same composition as that of the above-mentioned prescribed material and serves as a conductor (see FIG. 15).

As mentioned above, the thin film transistor 1004 of this embodiment can reduce the management cost since the single material can be used. In addition, since the object to be processed to be the active layer 1041, the source electrode 1051, the source wire 1052 and the drain electrode 1053, the drain wire 1054 and the pixel electrode 1055 are simultaneously formed into a film in an amorphous state, followed by simultaneous etching, the production steps can be decreased to reduce the production cost.

THIRD APPLICATION EXAMPLE

The above-mentioned fourth embodiment of the method for producing the thin film transistor and the above-mentioned fourth embodiment of the thin film transistor have various application examples.

Then, the third application example will be explained with reference to the drawings.

Figure 16:
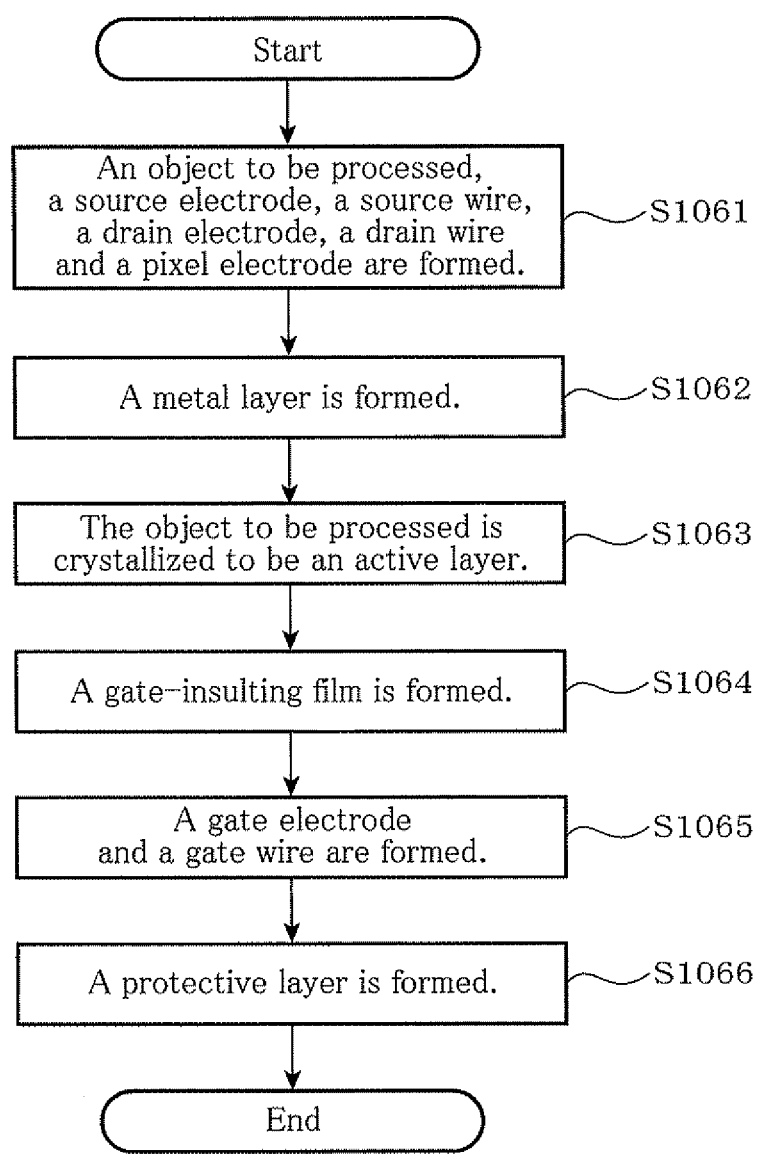
FIG. 16 is a schematic flow chart for explaining a third application example of a thin film transistor according to the fourth embodiment of the invention.

FIG. 16 is a schematic flow chart for explaining a third application example of a thin film transistor according to the fourth embodiment of the invention.

Figure 17:
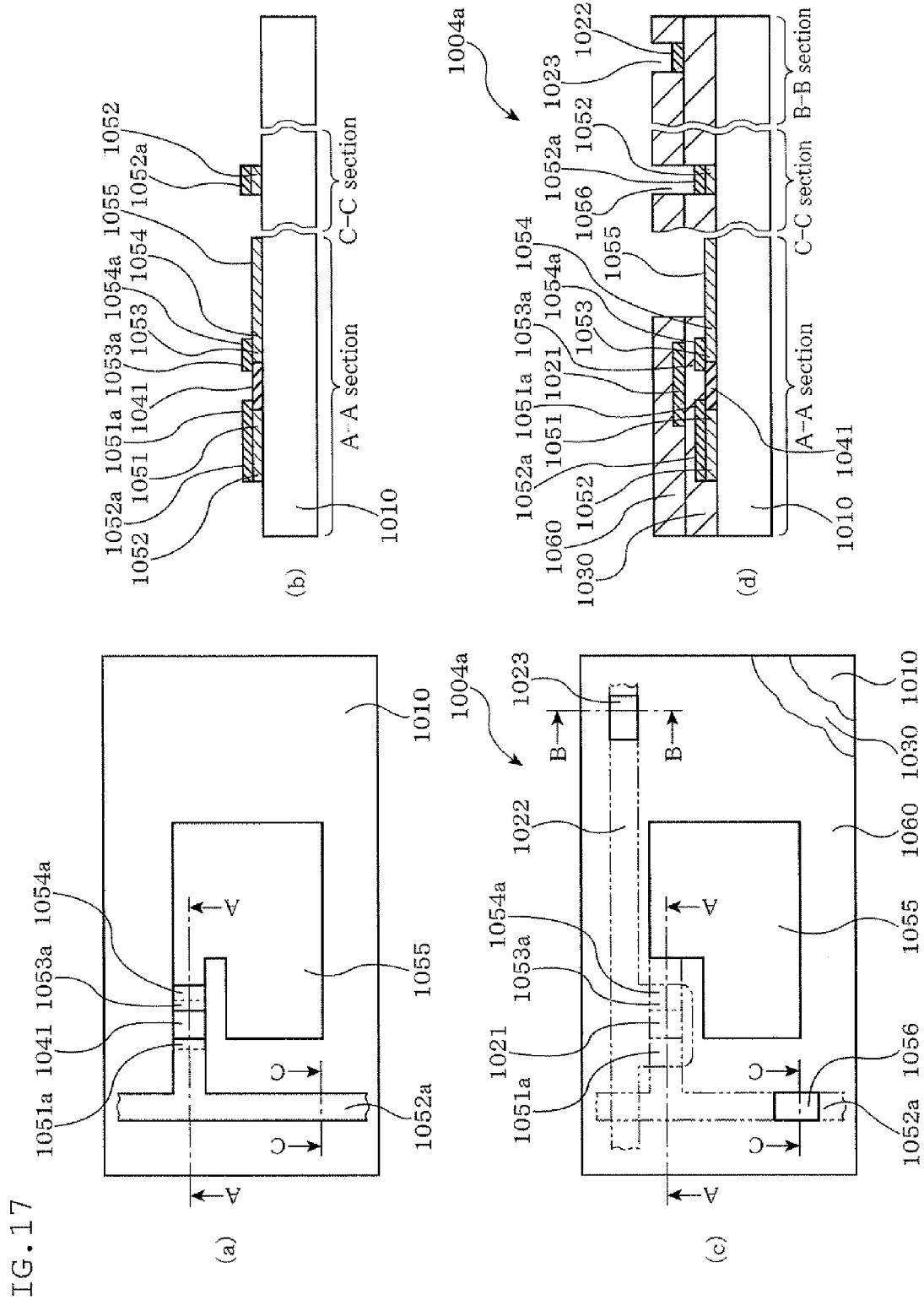
FIG. 17 is a schematic view of essential parts for explaining a third application example of a thin film transistor according to the fourth embodiment of the invention, in which (a) is a plan view showing the sate in which a gate electrode, a gate wire, a gate-insulting film, an active layer, a source wire, a source electrode, a drain electrode, a drain wire, a pixel electrode and a metal layer are formed, (b) is a cross-sectional view of (a), (c) is a plan view showing the state in which a protective layer is formed, and (d) is a cross-sectional view of (c)

FIG. 17 is a schematic view for explaining essential parts of the third application example of a method for producing a thin film transistor according to the fourth embodiment of the invention, in which (a) is a plan view showing the sate in which a gate electrode, a gate wire, a gate-insulting film, an active layer, a source wire, a source electrode, a drain electrode, a drain wire, a pixel electrode and a metal layer are formed, (b) is a cross-sectional view of (a), (c) is a plan view showing the state in which a protective layer is formed, and (d) is a cross-sectional view of (c).

In FIG. 16 and FIG. 17, the method for producing the thin film transistor 1004a in this application example differs from the above-mentioned fourth embodiment in that, between the Step S1051 and the Step S1052 (see FIG. 14), a source electrode 1051a, a source wire 1052a, a drain electrode 1053a and a drain wire 1054a, which are formed of a metal layer, are formed (Step S1062). Other methods are substantially the same as those in the fourth embodiment.

In substantially the same manner as in the fourth embodiment, an amorphous oxide layer is formed in order to provide on the glass substrate 1010, an object to be processed to be the active layer 1041, the source electrode 1051, the source wire 1052, the drain electrode 1053, the drain wire 1054 and the pixel electrode 1055, and then a metal layer is formed by a sputtering method or the like.

Then, on the glass substrate 1010, the object to be processed to be the active layer 1041, the source electrode 1051, the source wire 1052, the drain electrode 1053, the drain wire 1054 and the pixel electrode 1055 are formed by a photolithographic method using a first half-tone mask (not shown) (Step S1061).

Then, a resist which is formed by using the first half-tone mask is re-formed, and using the re-formed resist (not shown), a source electrode 1051a, a source wire 1052a, a drain electrode 1053a and the drain wire 1054a, which are formed of a metal layer, are formed by a photolithographic method (Step S1062). As a result, the surfaces of the active layer 1041 and the pixel electrode 1055 are exposed. That is, the source electrode, the source wire, the drain electrode and the drain wire of a thin film transistor 1004a are constituted as a stacked layer structure of an amorphous oxide layer and a metal layer, and the active layer 1041 (thin film transistor part) and the pixel electrode 1055 are formed of only the amorphous oxide layer.

Then, as shown in FIG. 17(b), in substantially the same manner as in the fourth embodiment, the object to be processed is locally crystallized to allow it to be the active layer 1041 (Step S1063).

Then, as shown in FIG. 17(c) and FIG. 17(d), in substantially the same manner as in the fourth embodiment, an SiNx film as the gate-insulating film 1030 is formed by CVD (chemical vapor deposition method) on the glass substrate 1010, the source wire 1052a, the source electrode 1051a, the active layer 1041, the drain electrode 1053a, the drain wire 1054a and the pixel electrode 1055 (Step S1064).

Subsequently, on the gate insulating film 1030, by a photolithographic method using a second mask (not shown), a gate electrode 1021 and a gate wire 1022, which are composed of a metal thin film, are formed in a desired shape (Step S1065).

Subsequently, an SiNx film as the protective layer 1060 is formed by CVD on the gate-insulating film 1030, the gate electrode 1021 and the gate wire 1022 (Step S1066).

The protective layer 1060 which has been formed is then subjected to dry etching by a photolithographic method using a third mask (not shown), whereby the pixel electrode 1055 is exposed. Then, the opening part 1023 and the opening part 1056 are formed, and part of the gate wire 1022 and part of the source wire 1052a are exposed to become wiring pads.

In this way, according to this application example, the top-gate type thin film transistor 1004a provided with the protective layer 1060 can be produced by a production process using three masks.

As mentioned above, according to the method for producing a thin film transistor 1004a according to this application example, the object to be processed to be the active layer 1041, and the source electrode 1051, the source wire 1052, the drain electrode 1053, the drain wire 1054 and the pixel electrode 1055, which are composed of the amorphous prescribed material, are formed into a film simultaneously, followed by simultaneous etching. In addition, by forming the source electrode 1051a, the source wire 1052a, the drain electrode 1053a and the drain wire 1054a, which are formed of a metal layer, connection with the active layer 1041 is ensured.

The thin film transistor 1004a according to this application example is also effective as an invention of a thin film transistor.

In the above-mentioned application example, crystallization of the active layer 1041 is conducted before forming the protective layer 1060. The manner of crystallization is not limited thereto. For example, crystallization may be conducted by a laser annealing method or the like from the side of the glass surface after the formation of the protective layer 1060.

In the above-mentioned application example, the active layer 1041 is crystallized after the metal layer is patterned using the re-formed resist (not shown). The manner of crystallization is not limited thereto. For example, the active layer 1041 may be crystallized after the amorphous oxide layer is patterned, followed by the patterning of the metal layer.

FIRST EXAMPLE

Then, an explanation is made on examples in the above-mentioned embodiments and application examples.

This example corresponds to the second application example of the above-mentioned second embodiment.

First, as shown in FIG. 9, FIG. 2(a) and FIG. 2(b), on the transparent glass substrate 1010, molybdenum was formed into a film by a sputtering method in a thickness of 200 nm. Using a first mask (not shown), the gate electrode 1021 and the gate wire 1022 were formed by a photolithographic method (Step S1031).

Then, as shown in FIG. 10(a) and FIG. 10(b), an SiNx film was formed by the CVD method as the gate-insulating film in a thickness of 250 nm (Step S1032).

Then, molybdenum was formed into a film in a thickness of 100 nm, and by using a second mask (not shown), the source electrode 1051a, the source wire 1052a, the drain electrode 1053a and the drain wire 1054a were formed by a photolithographic method (Step S1033).

Furthermore, by using a photolithographic method using a third mask (not shown), above part of the gate wire 1022, the opening 1023 was formed. That is, the gate-insulating film 1030 (SiNx film) corresponding to the opening 1023 was removed by dry etching using a $CHF_3$ gas or the like.

Then, as shown in FIG. 10(c) and FIG. 10(d), using an indium oxide-zinc oxide target mentioned later, an amorphous thin film having a thickness of 50 nm was formed by a sputtering method with the substrate temperature being room temperature. Then, by a photolithographic method, an object to be processed to be the active layer 1041, the source wire 1052, the source electrode 1051, the drain electrode 1053, the drain wire 1054 and the pixel electrode 1055 of a transistor were formed (Step S1034).

Subsequently, the object to be processed to be the active layer 1041 was irradiated with a condensed laser light to allow it to be crystallized to obtain the active layer 1041 (Step S1035). In this way, by using a laser light, only a part which was to be a thin film semiconductor could be crystallized.

[Preparation Example of an Amorphous Oxide and a Crystalline Oxide]

Next, an explanation is made on an amorphous oxide which becomes the above-mentioned source wire 1052, the source electrode 1051, the drain electrode 1053, the drain wire 1054 and the pixel electrode 1055, as well as the crystalline oxide which becomes the active layer 41.

(1) Production and Evaluation of a Sputtering Target
1. Production of a Target

As a raw material, indium oxide with an average diameter of about 3.4 μm and zinc oxide with an average diameter of about 0.6 μm were mixed such that the atomic percentage of indium (=[In]/([In]+[Zn])), where [In] is the number of atoms of indium and [Zn] is the number of atoms of zinc) became 0.95 and the atomic percentage of zinc (=[Zn]/([In]+[Zn])) became 0.05, and the resulting mixture was supplied to a wet ball mill, and pulverized with mixing for about 72 hours, whereby raw material fine powder was obtained.

The resulting raw material fine powder was granulated, and then subjected to press molding to a dimension of about 10 cm in diameter and about 5 mm in thickness. The molded product was put in a firing furnace, and fired under conditions of about 1400° C. for about 48 hours, whereby a sintered body (target) was obtained. The heating rate was about 3° C./min.

2. Evaluation of a Target

For the resulting target, the density and the bulk resistance value were measured. As a result, the theoretical relative density was about 99%, and the bulk resistance value measured by the four probe method was about 80 mΩ.

(2) Film Formation of an Amorphous Oxide

The sputtering target obtained in (1) above was installed in a film formation apparatus of DC magnetron sputtering, which is one of DC sputtering methods, and an oxide film was formed on the gate insulating film 30 on a glass substrate 10 (Corning 1737).

The sputtering conditions were as follows. Substrate temperature; about 25° C., ultimate pressure; about $1 \times 10^{-3}$ Pa, atmospheric gas; Ar about 100%, sputtering pressure (total pressure); about $4 \times 10^{-1}$ Pa, input power; about 100 W, film forming time; about 10 minutes, S-T distance; about 95 mm.

As a result, a thin film of an oxide with a thickness of about 50 nm was formed on the glass substrate.

The composition of the resulting film was analyzed by the ICP method. It was found that the atomic percentage of indium was about 0.95 and the atomic percentage of zinc was about 0.05.

As for the properties of an oxide formed under the above-mentioned production conditions, the oxide was confirmed to be amorphous by the X-ray crystal structure analysis.

The carrier concentration (electron carrier concentration) and the Hall mobility (electron mobility) of the above-mentioned amorphous oxide were measured by means of a Hall measurement apparatus. It was found that the carrier concentration was about $3 \times 10^{20}$ $cm^{-3}$ and the Hall mobility was about 35 $cm^2$/Vs. The specific resistance value measured by the four probe method was about 0.0006 Ωcm. As a result of the analysis of the composition of the thin film, the concentration of Li and Na were 1 ppm or less.

The Hall measurement apparatus and the Hall measurement conditions are as follows.

[Hall Measurement Apparatus]

Resi Test 8310: manufactured by Toyo Corporation

[Measurement Conditions]

Room temperature (about 25° C.), about 0.5 [T], about $10^{-4}$ to $10^{-12}$A, AC magnetic field Hall measurement In addition, as a result of measurement by means of a spectrophotometer, it was found that this semiconductor thin film had a transmittance for light with a wavelength of about 500 nm of about 82% and a refractive index of the thin film (wavelength: about 500 nm) of about 2.1. That is, the thin film was excellent in transparency. In addition, the energy band gap was about 4.2 eV, which was sufficiently large.

[PAN Resistance]

The PAN etching speed of about 10 nm/min or more was evaluated as poor, and other etching speeds were evaluated as good. The PAN resistance was poor.

Here, the PAN resistance was evaluated by using a PAN etching solution of about 45° C. (phosphoric acid: about 91.4 wt %, nitric acid: about 3.3 wt %, acetic acid: about 5.3 wt %). Generally, as the PAN etching solution (an etching solution containing phosphoric acid, nitric acid and acetic acid), an etching solution containing about 20 to 95 wt % of phosphoric acid, about 0.5 to 5 wt % of nitric acid and about 3 to 50 wt % of acetic acid is used.

That is, the above-mentioned amorphous oxide was a transparent conductor.

(3) Crystallization of an Amorphous Oxide

Part of the amorphous oxide obtained in (2) above (object to be processed to be the active layer 1041) was crystallized by irradiating with condensed laser light in an atmosphere (in the presence of oxygen), whereby the active layer 1041 was obtained. That is, by the X-ray crystal structure analysis, it was confirmed that the part was polycrystalline. It was also confirmed that In and Zn had a similar local structure (at least part of zinc Zn replaces the indium site of a bixbite type crystal of indium oxide) by an XFAS measurement.

(4) Evaluation of Physical Properties of a Crystalline Oxide

The carrier concentration (electron carrier concentration) and the Hall mobility (electron mobility) of the above-mentioned amorphous oxide obtained in (3) above were measured by means of a Hall measurement apparatus. It was found that the carrier concentration was about $6\times10^{14}$ cm$^{-3}$ and the Hall mobility was about 5 cm2Ns. The specific resistance value measured by the four probe method was about 2100 Ωcm. As a result of the analysis of the composition of the thin film, the concentration of Li and Na were 1 ppm or less.

In addition, as a result of the measurement by means of a spectrophotometer, it was found that this crystalline oxide had a transmittance for light with a wavelength of about 500 nm of about 85% and a refractive index (wavelength: about 500 nm) of about 1.9. That is, the crystalline oxide was excellent in transparency. In addition, the energy band gap was about 3.6 eV, which was sufficiently large.

In addition, the PAN resistance was good.

That is, the above-mentioned crystalline oxide had excellent properties as a transparent semiconductor thin film.

In the meantime, as the material forming the active layer 1041, the source electrode 1051, the source wire 1052, the drain electrode 1053, the drain wire 1054 and the pixel electrode 1055, the above-mentioned indium oxide-zinc oxide target was used. However, indium oxide alone can also be used. Semiconductor performance is exhibited by increasing crystalline properties. Therefore, when crystallizing by a laser beam, it is possible to increase the power of the laser beam, and increase the number of times of light beam irradiation. In addition, it is effective to irradiate laser beam in an oxygen-containing atmosphere.

As the oxide of the positive divalent metal other than zinc oxide, magnesium oxide, calcium oxide, nickel oxide, copper oxide and cobalt oxide can be used. By adding these metal oxides, generation of carriers due to oxygen deficiency can be effectively suppressed. However, metal oxides such as platinum oxide, ferrous oxide and silver oxide do not have carrier suppressing effects. There are no restrictions on the amount to be added. However, in the case of a metal oxide which inhibits crystallization by a laser beam or the like, it is required to control the added amount to the crystallization region. The crystals which appear by this crystallization have a bixbite structure of indium oxide. There are no problems even though it contains other crystalline phases as long as no adverse effects are exerted on the suppression of carriers. Determination of the crystal structure can be conducted by the X-ray diffraction.

As for the added amount of an oxide of a positive divalent metal, for example, the content of the positive divalent metal in the total metal elements is 15 at % or less, preferably 10 at % or less. The reason therefor is that, if the content exceeds 15 at %, the crystallization temperature may excessively increase, causing the crystallization process to be expensive.

SECOND EXAMPLE

This example corresponds to the third application example of the above-mentioned fourth embodiment.

First, as shown in FIG. 16, FIG. 17(a) and FIG. 17(b), on the transparent glass substrate 1010, using an indium oxide-ytterbium oxide target, a 40 nm-thick amorphous thin film (amorphous oxide layer) was formed by a sputtering method with the temperature of the substrate being at room temperature. Subsequently, titanium as the metal layer was formed into a film by a sputtering method with a thickness of 200 nm.

The indium oxide-ytterbium oxide target was produced in substantially the same manner as in the examples of preparing the above-mentioned amorphous oxide and the crystalline oxide. Mixing was performed such that the atomic percentage of indium (=[In]/([In]+[Yb])), where [In] is the number of atoms of indium and [Yb] is the number of atoms of ytterbium) became 0.95 and the atomic percentage of ytterbium (=[Yb]/([In]+[Yb])) became 0.05.

Then, the object to be processed to be the active layer 1041, the source electrode 1051, the source wire 1052, the drain electrode 1053, the drain wire 1054 and the pixel electrode 1055 were formed by a photolithographic method using a first half-tone mask (not shown) (Step S1061).

Then, a resist which had been formed by the first half-tone mask was re-formed, and using the re-formed resist (not shown), the source electrode 1051a, the source wire 1052a, the drain electrode 1053a and the drain wire 1054a, which were composed of a metal layer, were formed by a photolithographic method (Step S1062). That is, the metal layer (titanium) on the object and the pixe electrode 1055 were removed by using SF$_6$ gas or the like. As a result, the surfaces of the active layer 1041 and the pixel electrode 1055 were exposed. That is, the source electrode, the source wire, the drain electrode and the drain wire of a thin film transistor 1004a was a stacked layer structure of an amorphous metal oxide layer and a metal layer, and the active layer 1041 (thin film transistor part) and the pixel electrode 1055 consisted of an amorphous oxide layer.

Then, as shown in FIG. 17(b), the object to be processed to be the active layer 1041 was irradiated with a condensed laser light, and allowed it to be the active layer 1041 (Step S1063). In this way, by using a laser light, only a part which became a thin film semiconductor could be crystallized. In this case, irradiation of laser light could be conducted from both the metal side and the glass side. If irradiation was conducted from the metal side, only a part which became the active layer 1041 was exposed to laser light. In the metal surface, laser light was reflected or heat was diffused. A part which was in contact with the metal was not crystallized, and only a part which was exposed to light was crystallized, whereby only a part which serves as the active layer 1041 could be crystallized. That is, only the active layer 1041 part could be crystallized more uniformly.

Then, an SiNx film was formed by the chemical vapor deposition (CVD) method as the gate-insulating film 1030 in a thickness of 250 nm (Step S1064). Then, titanium was formed into a film in a thickness of 200 nm, and by using a second mask (not shown), the gate electrode 1021 and the gate wire 1022 were formed in a desired shape by a photolithographic method (Step S1065).

Then, an SiNx film which serves as a protective layer was formed in a thickness of 100 nm. Subsequently, by a photolithographic method using a third mask (not shown), the SiNx film was removed by dry etching using a CHF$_3$ gas or the like, whereby the pixel electrode 1055 was exposed. Then, the opening part 1023 and the opening part 1056 were formed, and part of the gate wire 1022 and part of the source wire 1052a were exposed to become wiring pads.

As the material for forming the active layer 1041, the source electrode 1051, the source wire 1052, the drain electrode 1053, the drain wire 1054 and the pixel electrode 1055, the above-mentioned indium oxide-ytterbium oxide target was used. It is also possible to use together with zinc oxide or the like.

Semiconductor performance is exhibited by increasing crystalline properties. Therefore, when crystallizing by a laser beam, it is possible to increase the power of the laser beam, and increase the number of times of light beam irradiation. In addition, it is effective to irradiate laser beam in an oxygen-containing atmosphere.

Examples of oxides of a positive trivalent metal other than ytterbium oxide include boron oxide, aluminum oxide, gallium oxide, scandium oxide, yttrium oxide, lanthanum oxide, neodymium oxide, samarium oxide, europium oxide, gadolinium oxide, terbium oxide, dysprosium oxide, holmium oxide, erbium oxide, thulium oxide, ytterbium oxide, and lutetium oxide.

By adding these metal oxides, generation of oxygen deficiency can be suppressed, and as a result, carriers generated by oxygen deficiency can effectively be suppressed. However, metal oxides such as thallium oxide do not have carrier suppressing effects. There are no restrictions on the amount to be added. However, in the case of a metal oxide which inhibits crystallization by a laser beam or the like, it is required to control the added amount to the crystallization region. The crystals which appear by this crystallization have a bixbite structure of indium oxide. There are no problems even though it contains other crystalline phases as long as no adverse effects are exerted on the suppression of carriers. Determination of the crystal structure can be conducted by the X-ray diffraction.

As for the added amount of an oxide of a positive divalent metal, for example, the content of the positive trivalent metal in the total metal elements is 20 at % or less, preferably 10 at % or less, more preferably 5 at % or less. The reason therefor is that, if the content exceeds 20 at %, the crystallization temperature may excessively increase, causing the crystallization process to be expensive. An oxide of a positive divalent metal can also be added.

THIRD EXAMPLE

This example corresponds to the first application example of the above-mentioned second embodiment.

First, as shown in FIG. 7, FIG. 8(a) and FIG. 8(b), on the transparent glass substrate 1010, an aluminum alloy (Al—Nd—Ni (98:1:1 wt %)) was formed into a film in a thickness of 200 nm by a sputtering method. Then, by using a first mask (not shown), the gate electrode 1021 and the gate wire 1022 were formed in a desired shape by a photolithographic method (Step S1021). Subsequently, an SiNx film was formed in a thickness of 250 nm by the chemical vapor deposition (CVD) method as the gate-insulating film 1030 (Step S1022).

Then, using an indium oxide-gallium oxide-zinc oxide target, a 50 nm-thick thin film was formed by a sputtering method with the temperature of the substrate being at room temperature. Subsequently, titanium as the metal layer was formed into a film in a thickness of 100 nm by a sputtering method.

The indium oxide-gallium oxide-zinc oxide target was produced in substantially the same manner as in the above-mentioned preparation example of the amorphous oxide and the crystalline oxide. Mixing was performed such that the atomic percentage of indium (=[In]/([In]+[Ga]+[Zn]) became 0.94, where [In] is the number of atoms of indium, [Ga] is the number of atoms of gallium and [Zn] is the number of atoms of zinc), the atomic percentage of gallium (=[Ga]/([In]+[Ga]+[Zn]) became 0.03 and the atomic percentage of zinc (=[Zn]/([In]+[Ga]+[Zn]) became 0.03.

Next, by a photolithographic method using a second halftone mask (not shown), the source electrode 1051, the source wire 1052, the drain electrode 1053, the drain wire 1054, the pixel electrode 1055, and the object to be processed as the active layer 1041 were formed (Step S1023).

Then, a resist which had been formed by the second halftone mask was re-formed, and using the re-formed resist (not shown), titanium above the active layer 1041 and the pixel electrode 1055 was removed, whereby the source wire 1052a, the source electrode 1051a, the drain electrode 1053a and the drain wire 1054a, which were composed of titanium, were formed by a photolithographic method (Step S1024). For etching titanium, reactive ion etching such as $SF_6$ or $CF_4$ was used, and the indium oxide-gallium oxide-zinc oxide layer was etched with an aqueous oxalic acid solution.

Subsequently, the object to be processed to be the active layer 1041 was irradiated with a condensed laser light to allow it to be crystallized to obtain the active layer 1041 (Step S1025). In this way, by using a laser light, only a part which is to be a thin film semiconductor could be crystallized.

In this example, as the material forming the active layer 1041, the source electrode 1051, the source wire 1052, the drain electrode 1053, the drain wire 1054 and the pixel electrode 1055, the above-mentioned indium oxide-gallium oxide-zinc oxide target was used. Semiconductor performance is enhanced by increasing crystalline properties. Therefore, when crystallizing by a laser beam, it is effective to increase the power of the laser beam, and increase the number of times of light beam irradiation. In addition, it is also effective to irradiate laser beam in an oxygen-containing atmosphere.

As the oxide of the positive divalent metal other than zinc oxide, magnesium oxide, calcium oxide, nickel oxide, copper oxide and cobalt oxide can be used. By adding these metal oxides, generation of carriers due to oxygen deficiency can be effectively suppressed. However, metal oxides such as platinum oxide, ferrous oxide and silver oxide do not have carrier suppressing effects. There are no restrictions on the amount to be added. However, in the case of a metal oxide which inhibits crystallization by a laser beam or the like, it is required to control the added amount to the crystallization region. The crystals which appear by this crystallization have a bixbite structure of indium oxide. There are no problems even though it contains other crystalline phases as long as no adverse effects are exerted on the suppression of carriers. Determination of the crystal structure can be conducted by the X-ray diffraction.

As for the added amount of an oxide of a positive divalent metal, for example, the content of the positive divalent metal in the total metal elements is 15 at % or less, preferably 10 at % or less. The reason therefor is that, if the content exceeds 15 at %, the crystallization temperature excessively increases, causing the crystallization process to be expensive.

Examples of oxides of a positive trivalent metal other than gallium oxide include boron oxide, aluminum oxide, scandium oxide, yttrium oxide, lanthanum oxide, neodymium oxide, samarium oxide, europium oxide, gadolinium oxide, terbium oxide, dysprosium oxide, holmium oxide, erbium oxide, thulium oxide, ytterbium oxide, and lutetium oxide.

By adding these metal oxides, generation of oxygen deficiency can be suppressed, and as a result, carriers generated by oxygen deficiency can effectively be suppressed. Metal oxides such as thallium oxide do not have carrier suppressing effects.

There are no restrictions on the amount to be added. However, in the case of a metal oxide which inhibits crystallization by a laser beam or the like, it is required to control the added amount to the crystallization region. The crystals which appear by this crystallization have a bixbite structure of indium oxide. There are no problems even though it contains other crystalline phases as long as no adverse effects are exerted on the suppression of carriers. Determination of the crystal structure can be conducted by the X-ray diffraction.

As for the added amount of an oxide of a positive trivalent metal, for example, the content of the positive trivalent metal in the total metal elements is 20 at % or less, preferably 10 at % or less, more preferably 5 at % or less. The reason therefor is that, if the content exceeds 20 at %, the crystallization temperature excessively increases, causing the crystallization process to be expensive.

The on-off ratio of the thin film transistor in each example was $10^5$ or more. The field-effect mobility was calculated from output properties. As a result, in the saturation range, a field-effect mobility of about 7 cm2V.sec was obtained. Furthermore, the threshold voltage (Vth) was about +2.0V, which means that the thin film transistor showed normally-off properties. In addition, the output properties showed clear pinch-off. Furthermore, when no gate voltage was applied and a voltage of about 5V was applied between the source electrode 1051 and the drain electrode 1053, the current between the source electrode 1051 and the drain electrode 1053 could be about $10^{-7}$A.

The same measurement was conducted by irradiating the thus prepared thin film transistor with visible rays. No change was observed in transistor properties. That is, according to each example, a thin film transistor provided with an active layer having a small electron carrier concentration, a high electric resistance and large electron mobility could be realized.

Furthermore, in each example, a thin film transistor was prepared on the glass substrate 1010. Since film formation itself could be conducted at room temperature and crystallization could be conducted at low temperatures by a low-temperature plasma crystallization method, substrates such as plastic plates or films can be used. The crystalline oxide obtained in each example absorbs almost no visible rays, and hence, a transparent flexible TFT could be realized.

The invention is not limited to the above-mentioned thin film transistor and the production method thereof, and can also be effective as an invention of a semiconductor device and the production method thereof.

Each embodiment of the semiconductor device and the production method thereof will be explained with reference to the drawings.

[First Embodiment of a Semiconductor Device and a Method for Producing the Same]

Figure 18:
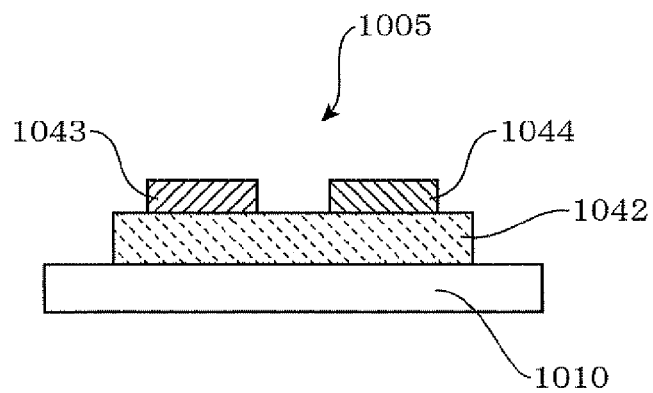
FIG. 18 is a schematic cross-sectional view of essential parts of a Schottky diode, which is a semiconductor device according to the first embodiment of the invention.

FIG. 18 is a schematic cross-sectional view of essential parts of a Schottky diode, which is a semiconductor device according to the first embodiment of the invention.

In FIG. 18, a Schottky diode 1005 is provided with a glass substrate 1010, an N-type semiconductor 1042 formed on the glass substrate 1010 and an electrode 1043 and an electrode 1044 formed on the both ends of the upper surface of the N-type semiconductor 1042.

The semiconductor device of this embodiment is a Schottky diode 1005, in which the crystalline oxide which is the same as that of the above-mentioned active layer 1041 is used as an electron conductor (N-type semiconductor 1042).

The N-type semiconductor 1042 is formed into a film in a crystalline state when forming into a film.

The electrode 1043 is formed of a material which has the same composition as that of the N-type semiconductor 1042, is amorphous, and functions as a conductor. This electrode 1043 ohmically contacts the N-type semiconductor 1042.

As the material of the electrode 1044, a material which has a work function larger than the absolute value of the Fermi level of the N-type semiconductor 1042, Pt, for example, is used. Due to a difference in work function, a barrier layer having a small amount of carriers is formed in the N-type semiconductor 1042.

As mentioned above, according to the Schottky diode 1005 of the embodiment, as for the prescribed materials having the same composition, one is crystallized to allow it to be the N-type semiconductor 1042 (semiconductor) and another is used in an amorphous state to allow it to be the electrode 1043. Since the same material can be used, the management cost can be decreased.

Furthermore, this embodiment is also effective as an invention of a method for producing a Schottky diode 1005.

This is the method for producing a Schottky diode 1005 provided with an N-type semiconductor 1042 and a conductor (electrode 1043) composed of a material having the same composition as that of the prescribed material. This method comprises the steps of forming a crystalline N-type semiconductor 1042, and forming an amorphous conductor (electrode 1043) in a subsequent step. As a result, the same material can be used, whereby the management cost can be reduced.

[Second Embodiment of the Semiconductor Device and a Method for Producing the Same]

Figure 19:
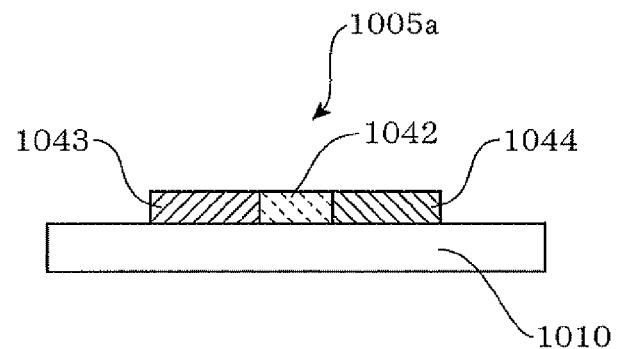
FIG. 19 is a schematic cross-sectional view of essential parts of a Schottky diode, which is a semiconductor device according to the second embodiment of the invention.

FIG. 19 is a schematic cross-sectional view of essential parts of a Schottky diode, which is a semiconductor device according to the second embodiment of the invention.

In FIG. 19, a Schottky diode 1005a is provided with a glass substrate 1010, an N-type semiconductor 1042 formed on the glass substrate 1010 and an electrode 1043 and an electrode 1044 formed on the both ends of the upper surface of the N-type semiconductor 1042.

The semiconductor device of this embodiment is the Schottky diode 1005a. This Schottky diode 1005a differs from the above-mentioned Schottky diode 1005 in that the object to be processed which serves as the N-type semiconductor 1042 and the electrode 1043 are formed into a film simultaneously (simultaneous film formation), shaped simultaneously (simultaneous shaping), and thereafter the object to be processed is crystallized to become the N-type semiconductor 1042. Other configurations are almost the same as those of the Schottky diode 1005.

As mentioned above, according to the Schottky diode 1005a of this embodiment, the object to be processed which serves as the N-type semiconductor 1042 and the electrode 1043, which are composed of a prescribed material which is amorphous, can be simultaneously formed into a film, followed by simultaneous etching.

That is, a thin film composed of a prescribed material which is amorphous is formed by simultaneous film formation, and the resulting film is simultaneously etched. Part of this thin film is locally crystallized to allow it to be the N-type semiconductor 1042, and the remaining part is used as it is in an amorphous state to be the conductor (electrode 1043). As a result, the production steps can be decreased to reduce the production cost.

In addition, since the same material can be used, the management cost can be decreased.

This embodiment is also effective as an invention of production method of the Schottky diode 1005a. In a production method of the Schottky diode 1005a with an N-type semiconductor 1042 formed of a prescribed material and a conductor (electrode 1043) formed of a material having the same composition as the prescribed material, the method comprises the steps of simultaneously forming an object to be processed and a conductor (electrode 1043) which are formed of an amorphous prescribed material, simultaneously shaping these, and crystallizing the object to be an N-type semiconductor 1042. The method can reduce the number of steps and production cost. Since the same material can be used, the management cost can be reduced.

[Third Embodiment of a Semiconductor Device and a Method for Producing the Same]

Figure 20:
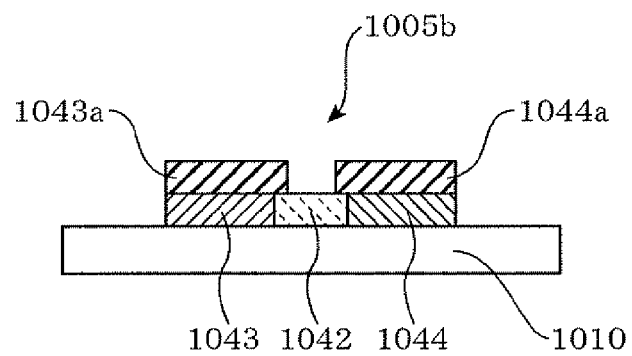
FIG. 20 is a schematic cross-sectional view of a Schottky diode, which is a semiconductor device according to the third embodiment of the invention.

FIG. 20 is a schematic cross-sectional view of essential parts of a Schottky diode, which is a semiconductor device according to the third embodiment of the invention.

In FIG. 20, a Schottky diode 1005b is provided with a glass substrate 1010, an N-type semiconductor 1042 formed on the glass substrate 1010 and an electrode 1043 and an electrode 1044 formed on the both ends of the upper surface of the N-type semiconductor 1042. Further, the Schottky diode 1005b is provided with an electrode 1043a made of a metal layer connecting the N-type semiconductor 1042 and electrode 1043, and an electrode 1044a made of a metal layer connecting the N-type semiconductor 1042 and the electrode 1044.

The semiconductor device of this embodiment is the Schottky diode 1005b. This Schottky diode 1005b differs from the above-mentioned Schottky diode 1005a in that the electrode 1043a and the electrode 1044a are formed. Other configurations are almost the same as those of the Schottky diode 1005a.

As mentioned above, according to the Schottky diode 1005b of the invention, by forming an electrode 1043a and 1044a formed of a metal layer, connection of the N-type semiconductor 1042, the electrode 1043 and the electrode 1044 can be ensured.

This embodiment is also effective as the method for producing a Schottky diode 1005b, and comprises the step of forming a metal layer (electrode 1043a) which connects the N-type semiconductor 1042 and the conductor (electrode 1043). In this way, connection of the N-type semiconductor 1042 and the electrode 1043 can be ensured.

The semiconductor device of the invention is not limited to a thin film transistor or a Schottky diode, but means a semiconductor element, a semiconductor component, a semiconductor apparatus and an integrated circuit. Therefore, for example, semiconductor devices include an integrated circuit (logic circuit, memory circuit, differential amplification circuit, or the like). As examples of the logic circuit, an inverter, an NOR, an NAND, a flip-flop, a shift register, or the like can be given. As examples of the memory transistor, a SRAM (Static Random Access Memory), a ROM (Read Only Memory) or the like can be given. Furthermore, as the differential amplification circuit, a differential amplifier or the like can be given. Also, it may be a radio communication circuit such as an ID tag or an IC tag.

[Fifth Embodiment of the Method for Producing a Thin Film Transistor]

Figure 21:
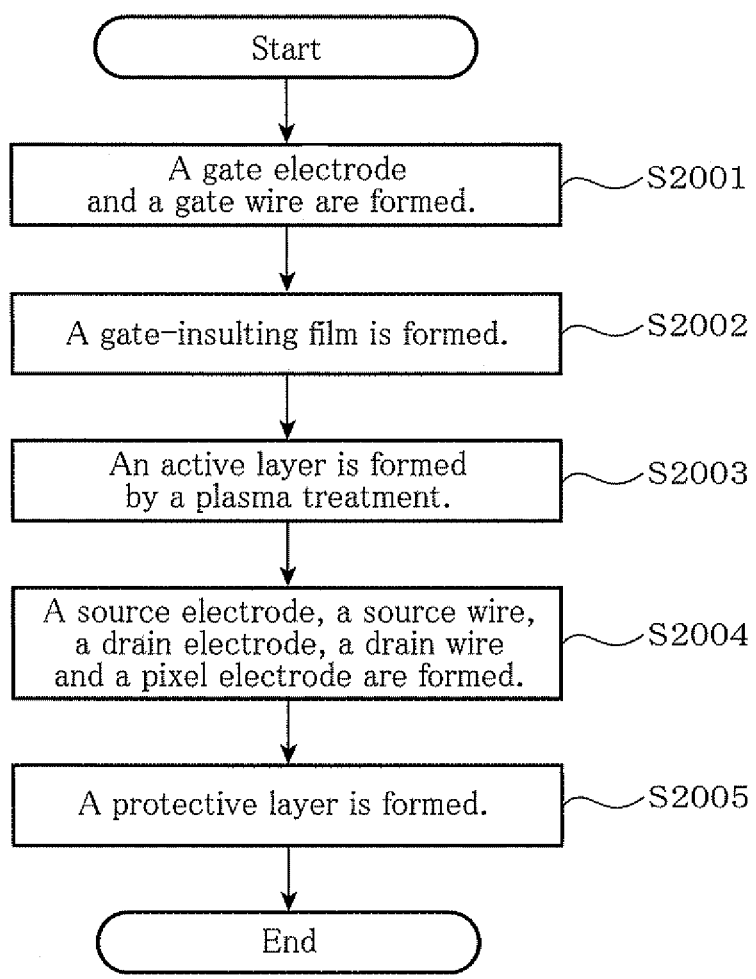
FIG. 21 is a schematic flow chart for explaining the method for producing a thin film transistor according to the fifth embodiment of the invention.

FIG. 21 is a schematic flow chart for explaining the method for producing a thin film transistor according to the fifth embodiment of the invention.

Figure 22:
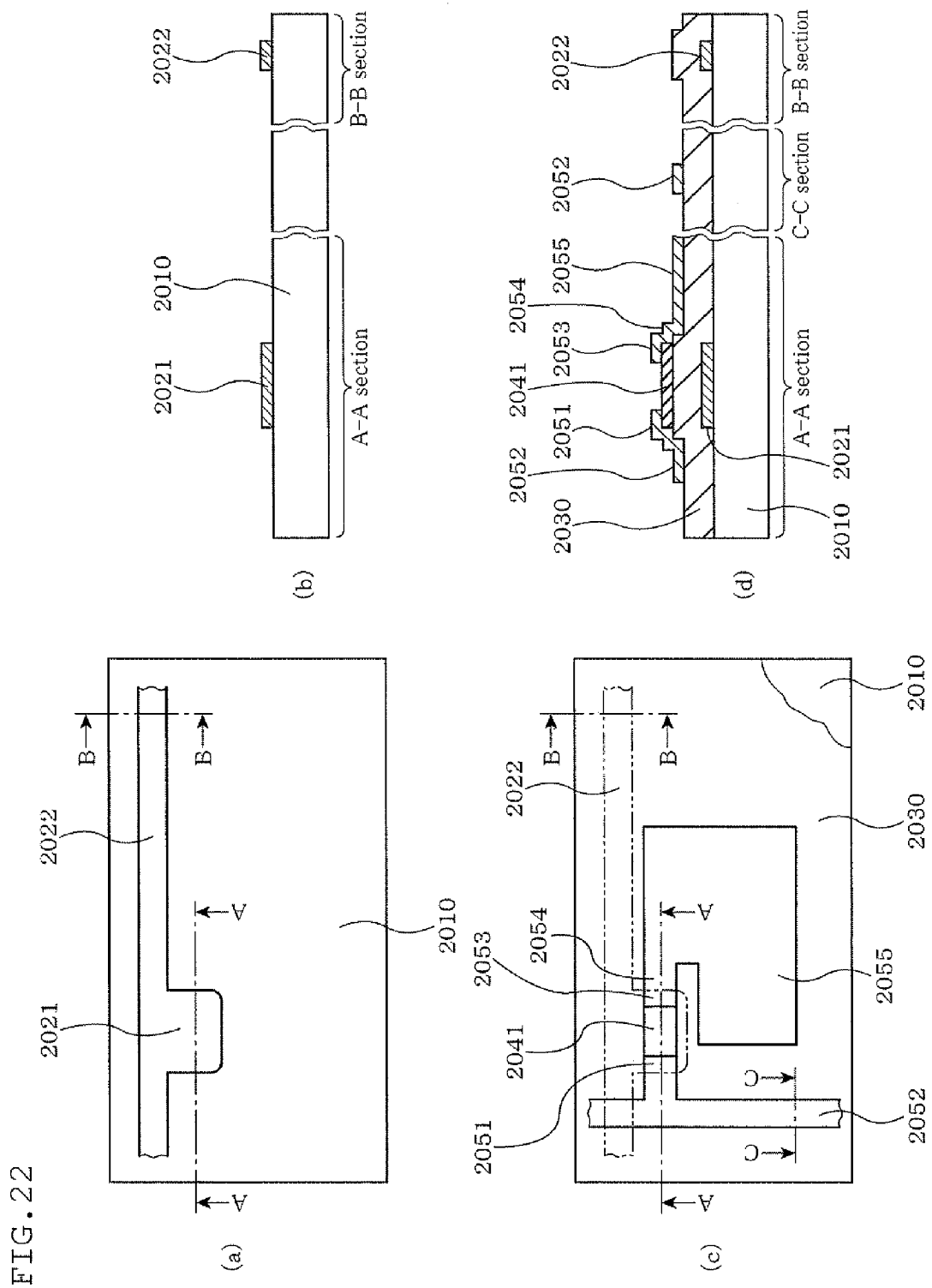
FIG. 22 is a schematic view of essential parts for explaining the method for producing a thin film transistor according to the fifth embodiment of the invention, in which (a) is a plan view showing the state in which a gate electrode and a gate wire are formed, (b) is a cross-sectional view of (a), (c) is a plan view showing the state in which a gate-insulating film, an active layer, a source wire, a source electrode, a drain electrode, a drain wire and a pixel electrode are formed, and (d) is a cross-sectional view of (c)

FIG. 22 is a schematic view of essential parts for explaining the method for producing a thin film transistor according to the fifth embodiment of the invention, in which (a) is a plan view showing the state in which a gate electrode and a gate wire are formed, (b) is a cross-sectional view of (a), (c) is a plan view showing the state in which a gate-insulating film, an active layer, a source wire, a source electrode, a drain electrode, a drain wire and a pixel electrode are formed, and (d) is a cross-sectional view of (c).

In FIG. 21, FIG. 22(a) and FIG. 22(b), at first, a transparent glass substrate 2010 is prepared. On this glass substrate 2010, by a photolithographic method using a first mask (not shown), a gate electrode 2021 and a gate wire 2022, which are composed of a metal thin film, are formed in a desired shape (Step S2001).

The substrate is not limited to the glass substrate 2010, and a substrate formed of various materials can be used according to the application of the thin film transistor 2001. Flexible resin films may be used, for example.

As the material of the above-mentioned metal thin film, Al, Cu, Ti, Mo or Ag, or alloys of them may be used, for example. The thickness of the thin film is normally 50 to 500 nm, preferably 100 to 400 nm. The reason therefor is that, if the thickness is smaller than 50 nm, the resistance of the gate wire 2022 may be increased to cause signal delay. If the thickness is larger than 500 nm, the difference in height becomes too large. As a result, defects may occur due to breakage or thinning of a wire of a gate-insulating film 2030, a source wire 2052, a drain wire 2054 or the like which are thin films formed above the metal thin film. As for the alloys, various metals may be added as long as the resistance value of a base metal is not changed largely. For example, as for Al alloys, alloys in which a metal such as Ni, Nd, La, Mo, W or the like are added are preferable. The above-mentioned metal thin film is a transparent thin film.

Then, as shown in FIG. 21, FIG. 22(c) and FIG. 22(d), an SiNx film as the gate-insulating film 2030 is formed by CVD (chemical vapor deposition method) on the glass substrate 2010, the gate electrode 2021 and the gate wire 2022 (Step S2002). The thickness of this film is normally 100 to 500 nm, preferably 200 to 400 nm. Generally, it is preferred that the thickness of the gate-insulating film 2030 be larger than the thickness of the gate wire 2022. By allowing the thickness of the gate-insulating film 2030 to be larger than the thickness of the gate wire 2022, current leakage from the gate wire 2022 to the source wire 2052 or the drain wire 2054 which are positioned above the gate wire 2022 can be decreased.

On the gate-insulating film 2030 above the gate electrode 2021, the active layer 2041 which becomes a semiconductor by a plasma treatment is formed (Step S2003).

This active layer 2041 is composed of a prescribed material as the base material and has properties as a semiconductor by a plasma treatment. The composition or the like of the active layer 2041 will be mentioned later.

Here, the active layer 2041 is formed into a film in an amorphous state by a sputtering method or the like, then, shaped by a photolithographic method using the second mask. Subsequently, the active layer 2041 becomes a semiconductor by a plasma treatment. However, the method is not limited thereto. For example, the active layer 2041 is formed into a film in an amorphous state, and subjected to a plasma treatment, and then shaped into a prescribed shape.

In the invention, an amorphous state means a state in which a harrow pattern is observed in an X-ray diffraction spectrum and shows no specific diffraction spectrum. On the other hand, the crystalline state means a state in which a specific diffraction pattern is observed.

In the invention, by subjecting the above-mentioned prescribed material to a plasma treatment, this prescribed material is activated to allow it to be a semiconductor. The activation conditions vary depending on the type of a plasma treatment apparatus or a plasma gas. Although various plasma gases can be selected, normally, oxygen, nitrogen, argon, and a mixture of these or the like can be used. In the case of oxygen plasma, oxygen atoms which have been activated are jumped into the active layer of the thin film transistor to suppress the occurrence of oxygen deficiency. In the case of nitrogen plasma, nitrogen atoms which have been activated are jumped into the active layer of the thin film transistor to suppress the occurrence of oxygen deficiency. Argon plasma has effects of activating free oxygen atoms to suppress oxygen deficiency. As usable plasma, atmospheric plasma, plasma jet, plasma which is generated by a plasma gun in a vacuum, a low-temperature plasma or the like can be used.

The method of irradiating plasma in an oxygen-containing atmosphere can activate the active layer 2041 most effectively.

In the invention, by controlling the material of the base material to be active layer 2041, the composition ratio, the production conditions, the plasma process conditions or the like, the electron carrier concentration is allowed to be $10^{10}/cm^3$ or more and less than $10^{18}/cm^3$. It is preferred that the electron carrier concentration be $10^{11}/cm^3$ or more and $10^{17}/cm^3$ or less, further preferably $10^{12}/cm^3$ or more and $10^{16}/cm^3$ or less. With this range, a prescribed electron mobility can be attained and a sufficiently large on-off ratio can be obtained. In addition, a normally-off thin film transistor can be obtained in a high yield.

The electron carrier concentration according to the invention is a value measured at room temperature. The room temperature is 25° C., for example. Specifically, room temperature is a temperature which is appropriately selected from a range of about 0 to 40° C. The electron carrier concentration can be measured by the Hall effect measurement. It is preferred to perform the AC Hall measurement when measuring an electron carrier concentration of less than about $10^{17}/cm^3$. The reason therefor is that, in the case of the DC Hall measurement, there is a large degree of variation in measurement values, which may cause measurement reliability to be deteriorated.

In addition, plasma treatment is conducted under conditions under which no crystalline peak is generated in XRD (X-ray diffraction). However, the conditions of a plasma treatment are not limited thereto. For example, crystal peaks may appear by the plasma treatment.

Furthermore, it is preferred that the energy band gap between the conduction band and the valence band of the active layer 2041 (semiconductor thin film) be about 2.8 eV or more. Due to such a band gap, a disadvantage that electrons of the valence band are excited by the irradiation of visible rays to allow a leak current to be flown easily can be effectively avoided.

Furthermore, it is preferred that the above-mentioned crystalline oxide 2041 be a nondegenerate semiconductor.

In this way, the off-current can be rendered small and the on/off ratio can be increased.

Subsequently, on the gate-insulating film 2030 and the active layer 2041, the source wire 2052, the source electrode 2051, the drain electrode 2053, the drain wire 2054 and the pixel electrode 2055 are formed (Step S2004).

The source wire 2052, the source electrode 2051, the drain electrode 2053, the drain wire 2054 and the pixel electrode 2055 are composed of a material which has the same composition as that of the base material which serves as the active layer 2041 (prescribed material). This material exhibits properties as a conductor when allowing it to be amorphous. These properties as a conductor or the like will be mentioned later.

Here, the source electrode 2051, the source wire 2052, the drain electrode 2053, the drain wire 2054 and the pixel electrode 2055 are simultaneously formed into a film in an amorphous state by a sputtering method or the like, and are shaped by simultaneous etching by a photolithographic method using a third mask (not shown). In this way, the production steps can be decreased to reduce the production cost.

Figure 23:
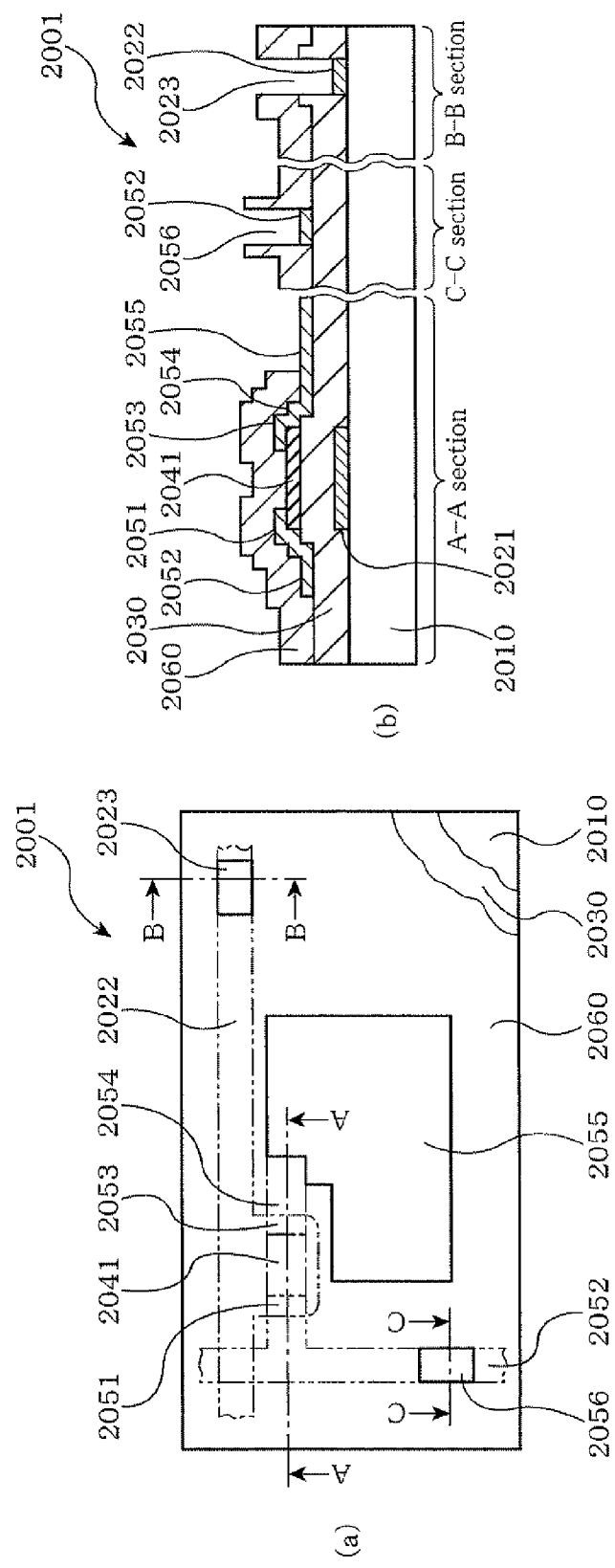
FIG. 23 is a schematic view of essential parts for explaining the method for producing a thin film transistor according to the fifth embodiment of the invention, in which (a) is a plan view showing the state in which a protective layer is formed, and (b) is a cross-sectional view of (a)

FIG. 23 is a schematic view of essential parts for explaining the method for producing a thin film transistor according to the fifth embodiment of the invention, in which (a) is a plan view showing the state in which a protective layer is formed, and (b) is a cross-sectional view of (a).

As shown in FIG. 23, on the gate-insulating film 2030, the source wire 2052, the source electrode 2051, the active layer 2041, the drain electrode 2053, the drain wire 2054 and the pixel electrode 2055, an SiNx film as the protective layer 2060 is formed by CVD (Step S2005).

Here, the protective layer 2060 which has been formed into a film is subjected to dry etching by a photolithographic method using a fourth mask (not shown), whereby the pixel electrode 2055 is exposed. An opening part 2023 and an opening part 2056 are formed, and part of the gate wire 2022 and part of the source wire 2052 are respectively exposed.

In this way, according to this embodiment, the thin film transistor 2001 provided with the protective layer 2060 can be formed by a production process using four masks.

Although not shown, when the active layer 2041 is formed also between the source wire 2052, the drain wire 2054 and the pixel electrode 2055, and the gate-insulating layer 2030 the active layer 2041, the source electrode 2051, the source wire 2052, the drain electrode 2053, the drain electrode 2054 and the pixel electrode 2055 can be formed by using one half-tone mask. That is, the base material which serves as the active layer 2041 is formed, then, the resulting film is subjected to a plasma treatment, and a thin film which serves as a conductor is formed. Then, using a half-tone mask, the active layer 2041, the source wire 2052, the drain wire 2054 and the pixel electrode 2055 are formed, and then, the source electrode 2051 and the drain electrode 2053 are formed. In this way, the thin film transistor provided with the protective layer 2060 can be formed by the production process using three masks.

Next, an explanation is made on the above-mentioned prescribed material which is used in the source electrode 2051, the source wire 2052, the drain electrode 2053, the drain wire 2054 and the pixel electrode 2055, and the above-mentioned prescribed material used as the base material of the active layer 2041.

First, the prescribed material used in the source electrode 2051 or the like and the prescribed material used as the base material of the active layer 2041 are the same. In this way, the same material can be used to reduce the management cost.

The above-mentioned prescribed material is an amorphous metal oxide. This amorphous metal oxide generates carriers by oxygen deficiency. Therefore, carrier concentration can be easily controlled by controlling oxygen deficiency by a plasma treatment. That is, the nature of a thin film composed of the prescribed material can be freely controlled. For example, the conductor and the semiconductor can be provided by using prescribed material, or the conductivity of the conductor or the properties of the semiconductor can be easily set.

Furthermore, it is preferred that the above-mentioned amorphous metal oxide contain at least one of indium oxide, zinc oxide and tin oxide.

For example, by using an amorphous thin film composed of indium oxide and zinc oxide, both stable conductivity and stable semiconductor properties can be obtained. As for the composition ratio of indium oxide and zinc oxide, $[In]/([In]+[Zn])=0.2$ to 1.0 (0.2 or more and 1.0 or less). Preferably, $[In]/([In]+[Zn])=0.5$ to 0.95 (0.5 or more and 0.95 or less), more preferably $[In]/([In]+[Zn])=0.6$ to 0.9) (0.6 or more and 0.9 or less). [In] is the number of indium atoms and [Zn] is the number of zinc atoms.

For example, by using an amorphous thin film composed of tin oxide and zinc oxide, both stable conductivity and stable semiconductor properties can be obtained. As for the composition ratio of tin oxide and zinc oxide, $[Sn]/([Sn]+[Zn])=0.2$ to 0.95 (0.2 or more and 0.95 or less). Preferably, $[Sn]/([Sn]+$

[Zn])=0.4 to 0.90 (0.4 or more and 0.90 or less), more preferably [Sn]/([Sn]+[Zn])=0.5 to 0.6 (0.5 or more and 0.6 or less). Here, [Sn] is the number of atoms of tin.

Furthermore, it is preferred that the above-mentioned amorphous metal oxide contain at least one of an oxide of a positive divalent metal, an oxide of a positive trivalent metal and an oxide of a positive tetravalent metal.

For example, it is preferred that the above-mentioned amorphous metal oxide contain an oxide of a positive divalent metal. By containing an oxide of a positive divalent metal, generation of carriers in the active layer 2041 can be suppressed efficiently by a plasma treatment, and hence, a thin film transistor can be operated stably even if driven for a long period of time. As the oxide of a positive divalent metal, magnesium oxide, calcium oxide, nickel oxide, copper oxide or the like are effective. They have a strong bonding power with oxygen, and generation of carriers due to occurrence of oxygen deficiency can be suppressed. Due to the presence of an oxide of a positive divalent metal, properties of a thin film transistor can be stabilized effectively.

By containing an oxide of a divalent metal, generation of carriers is stabilized by the effects of stabilizing amorphous components (inhibition of crystallization during production process or the like), and a thin film transistor can operate stably even if driven for a long period of time.

It is preferred that the added amount of an oxide of a positive divalent metal be small enough not to affect conductivity of a transparent conductive film (source electrode 2051 or the like). If the amount is too large, the conductivity of the transparent conductive film may be impaired. The added amount is 40 at % or less, preferably 20 at % or less.

Furthermore, for example, it is preferred that the above-mentioned amorphous metal oxide contain an oxide of a positive trivalent metal. By containing an oxide of a positive trivalent metal, generation of carriers in the active layer 2041 can be efficiently suppressed by a plasma treatment, and a thin film transistor can be stably operated even if driven for a long period of time. Examples of oxides of a positive trivalent metal include boron oxide, aluminum oxide, gallium oxide, scandium oxide, yttrium oxide, lanthanum oxide, neodymium oxide, samarium oxide, europium oxide, gadolinium oxide, terbium oxide, dysprosium oxide, holmium oxide, erbium oxide, thulium oxide, ytterbium oxide, and lutetium oxide. Since these metal oxides can strongly combine with oxygen, carriers generated by oxygen deficiency can effectively be suppressed. Due to the presence of an oxide of a positive trivalent metal, properties of a thin film transistor can be effectively stabilized.

By containing an oxide of a divalent metal, generation of carriers is stabilized by the effects of stabilizing amorphous components (inhibition of crystallization or the like during the production process), and a thin film transistor can operate stably even if driven for a long period of time.

It is preferred that the added amount of an oxide of a positive trivalent metal be small enough not to affect conductivity of a transparent conductive film. If the amount is too large, the conductivity of the transparent conductive film may be impaired. The added amount is 40 at % or less, preferably 20 at % or less relative to the total amount of the metals.

Furthermore, for example, it is preferred that the above-mentioned amorphous metal oxide contain an oxide of a positive divalent metal and an oxide of a positive trivalent metal. By containing an oxide of a positive divalent metal and an oxide of a positive trivalent metal, generation of carriers in the active layer 2041 can be efficiently suppressed by a plasma treatment, and a thin film transistor can be stably operated even if driven for a long period of time. As examples of an oxide of a positive divalent metal, magnesium oxide, calcium oxide, nickel oxide, copper oxide and the like are useful. As examples of oxides of a positive trivalent metal, boron oxide, aluminum oxide, gallium oxide, scandium oxide, yttrium oxide, lanthanum oxide, neodymium oxide, samarium oxide, europium oxide, gadolinium oxide, terbium oxide, dysprosium oxide, holmium oxide, erbium oxide, thulium oxide, ytterbium oxide, lutetium oxide and the like are useful. They, which are the positive divalent metal oxides and the positive trivalent metal oxides, have a strong bonding power with oxygen. Accordingly, occurrence of oxygen deficiency due to generation of carriers can be suppressed. Thus, containing the positive divalent metal oxide and the positive trivalent metal oxide can make the transistor characteristics stable effectively.

By containing an oxide of a positive divalent metal, and an oxide of a positive trivalent metal, generation of carriers can be stabilized by the effect of stabilizing the amorphous nature (i.e. prohibiting crystallization during the production process), enabling stable long-term driving.

It is preferred that the added amounts of an oxide of a positive divalent metal and an oxide of a positive trivalent metal be small enough not to affect conductivity of a transparent conductive film. If the amount is too large, the conductivity of the transparent conductive film may be impaired. The added amount is 40 at % or less, preferably 20 at % or less relative to the total amount of the metal elements Furthermore, for example, it is preferred that the above-mentioned amorphous metal oxide contain an oxide of a tetravalent metal. By containing an oxide of a tetravalent metal, since the valence number will be well-balanced, it is expected that the state will be stabilized to improve reliability. As the positive tetravalent metal oxide, germanium oxide, silicon oxide, titanium oxide, zirconium oxide, hafnium oxide or the like are useful.

Here, the positive divalent element means an element which can have two positive valences as the valence in the ionic state, the positive trivalent element means an element which can have three positive valences as the valence in the ionic state and the positive tetravalent element means an element which can have four positive valences as the valence in the ionic state.

As mentioned above, according to the method for producing thin film transistor of this embodiment, the active layer 2041 can be formed by subjecting a base material composed of a prescribed material to a plasma treatment. The source electrode 2051, the source wire 2052, the drain electrode 2053, the drain wire 2054 and the pixel electrode 2055 composed of the same prescribed material as that of the above-mentioned base material which is amorphous are simultaneously formed into a film, and followed by simultaneous etching.

In the invention, as for the prescribed materials having the same composition, one is crystallized to allow it to be the active layer 2041 (semiconductor) and another is used in an amorphous state as it is to allow it to be a conductor, the same material can be used, whereby the management cost can be decreased.

In addition, since the source electrode 2051, the source wire 2052, the drain electrode 2053, the drain wire 2054 and the pixel electrode 2055 are simultaneously formed into a film in an amorphous state, followed by simultaneous etching, the production steps can be decreased to reduce the production cost.

[Fifth Embodiment of the Thin Film Transistor]

The thin film transistor 2001 in the above-mentioned embodiment is also effective as an invention of a thin film transistor.

The thin film transistor 2001 has a configuration in which it is provided with the conductor which is composed of the above-mentioned prescribed material and serves as a source electrode 2051, a source wire 2052, a drain electrode 2053, a drain wire 2054 and a pixel electrode 2055, and the active layer 2041 which has become a semiconductor by subjecting the prescribed material to a plasma treatment (see FIG. 23).

As mentioned above, the thin film transistor 2001 of this embodiment can reduce the management cost since the same material can be used. In addition, since the source electrode 2051, the source wire 2052, the drain electrode 2053, the drain wire 2054 and the pixel electrode 2055 are simultaneously formed into a film in an amorphous state, followed by simultaneous etching, the production steps can be decreased to reduce the production cost.

[Sixth Embodiment of the Method for Producing a Thin Film Transistor]

Figure 24:
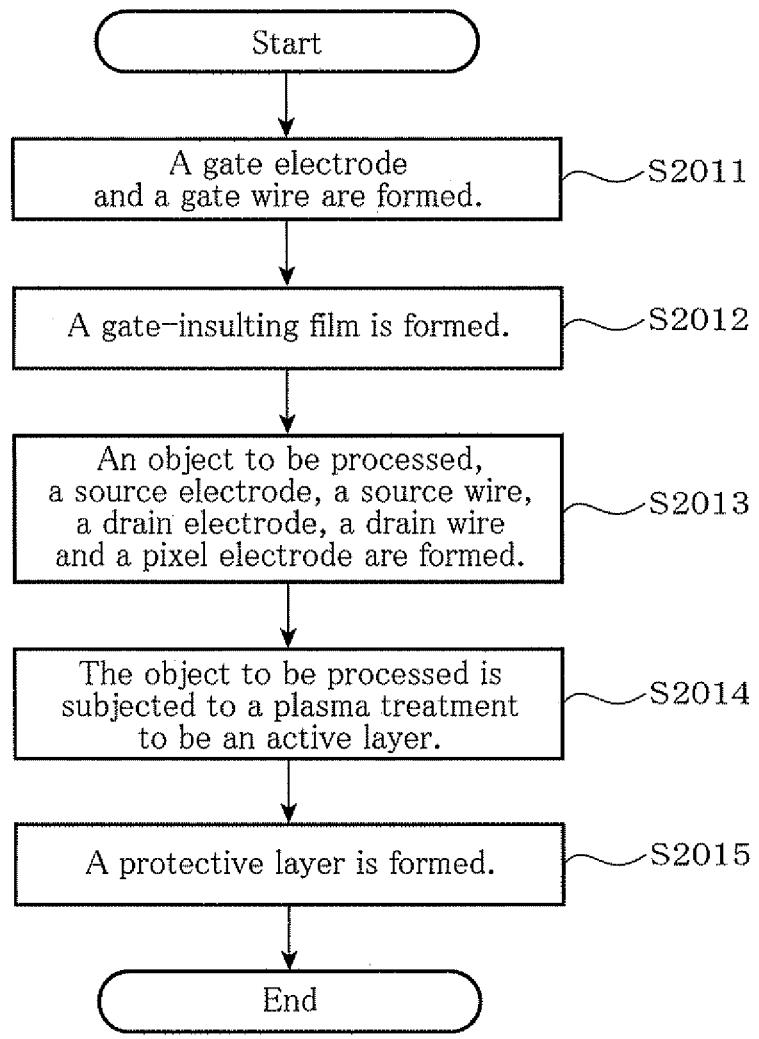
FIG. 24 is a schematic flow chart for explaining the method for producing a thin film transistor according to a sixth embodiment of the invention.

FIG. 24 is a schematic flow chart for explaining the method for producing a thin film transistor according to a sixth embodiment of the invention.

Figure 25:
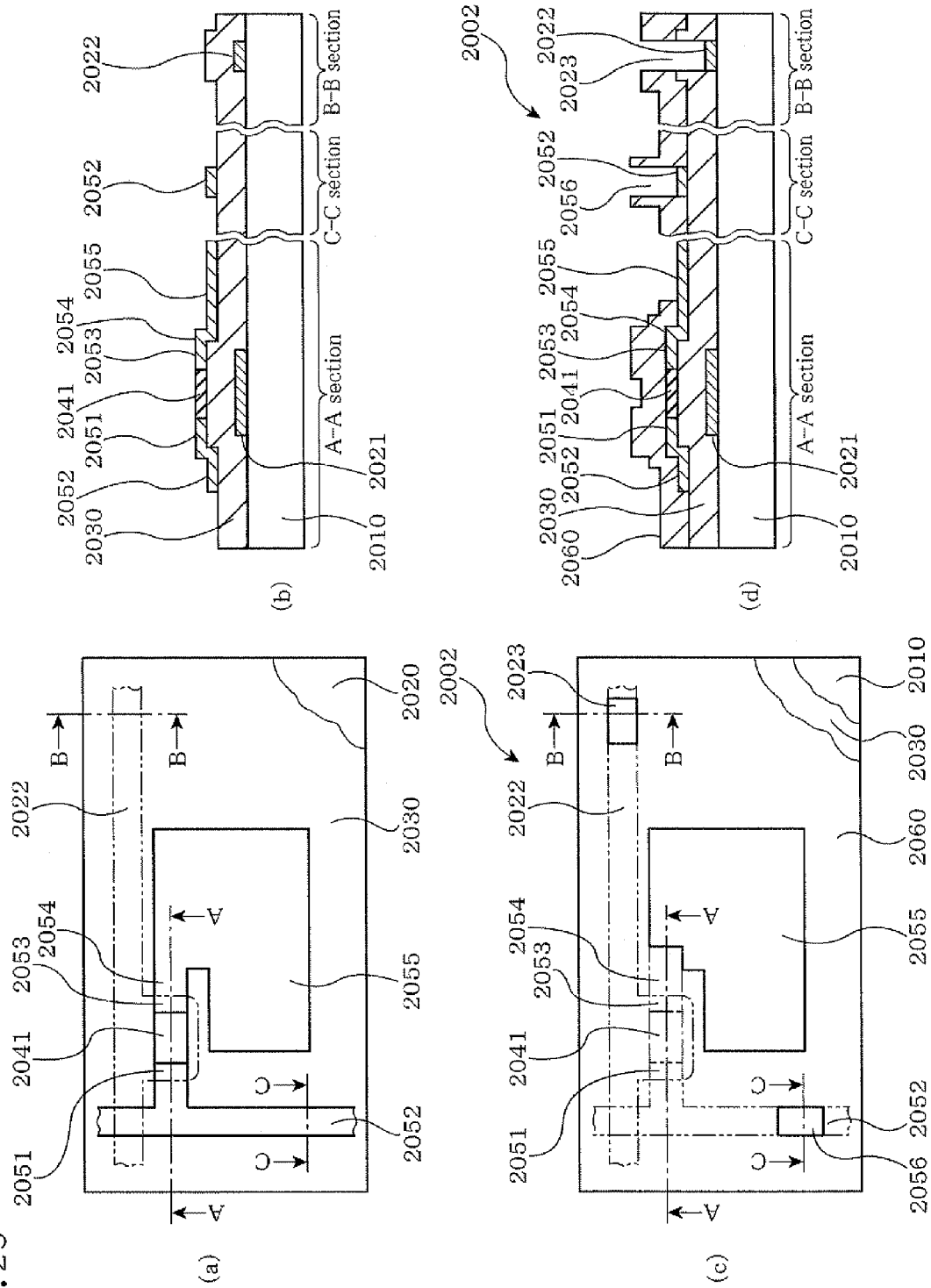
FIG. 25 is a schematic view of essential parts for explaining the method for producing a thin film transistor according to the sixth embodiment of the invention, in which (a) is a plan view showing the state in which a gate electrode, a gate wire, a gate-insulating film, an active layer, a source wire, a source electrode, a drain electrode, a drain wire and a pixel electrode are formed, (b) is a cross-sectional view of (a), (c) is a plan view showing the state in which a protective layer is formed, and (d) is a cross-sectional view of (c)

FIG. 25 is a schematic view of essential parts for explaining the method for producing a thin film transistor according to the sixth embodiment of the invention, in which (a) is a plan view showing the state in which a gate electrode, a gate wire, a gate-insulating film, an active layer, a source wire, a source electrode, a drain electrode, a drain wire and a pixel electrode are formed, (b) is a cross-sectional view of (a), (c) is a plan view showing the state in which a protective layer is formed, and (d) is a cross-sectional view of (c).

In FIG. 24 and FIG. 25, the method for producing a thin film transistor of this embodiment differs from the above-mentioned fifth embodiment in that, instead of the Step S2003 and the Step S2004 (see FIG. 21), the object to be processed to be the active layer 2041, the source electrode 2051, the source wire 2052, the drain electrode 2053, the drain wire 2054 and the pixel electrode 2055 are formed (Step S2013), followed by a plasma treatment to allow the object to be processed to be the active layer 2041 (Step S2014). Other methods are substantially the same as those in the fifth embodiment.

In the same manner as in the fifth embodiment, on the glass substrate 2010, the gate electrode 2021 and the gate wire 2022 are formed (Step S2011), and then, the gate-insulating film 2030 is formed (Step S2012).

Subsequently, on the gate-insulating film 2030, the object to be processed to be the active layer 2041, the source electrode 2051, the source wire 2052, the drain electrode 2053, the drain wire 2054 and the pixel electrode 2055 are formed (Step S2013).

That is, as shown in FIG. 25(a) and FIG. 25(b), the object to be processed to be the active layer 2041, the source electrode 2051, the source wire 2052, the drain electrode 2053, the drain wire 2054 and the pixel electrode 2055 are composed of the above-mentioned prescribed material, are simultaneously formed into a film in an amorphous state by a sputtering method or the like, and are shaped by simultaneous etching by a photolithographic method using a second half-tone mask (not shown). In this way, the production steps can be decreased to reduce the production cost.

The resist formed by the above-mentioned second half-tone mask has a shape that a part covering the source electrode 2051, the source wire 2052, the drain electrode 2053, the drain wire 2054 and the pixel electrode 2055 is thicker than the part covering the object to be processed to be the active layer 2041.

Then, the resist formed by the second half-tone mask is re-formed, the object to be processed to be the active layer 2041 is exposed, whereby the resist has a shape such that it covers the source electrode 2051, the source wire 2052, the drain electrode 2053, the drain wire 2054 and the pixel electrode 2055.

Subsequently, by conducting a plasma treatment using this re-formed resist (not shown), the object to be processed becomes a semiconductor to be the active layer 2041 (Step S2014). That is, the re-formed resist covers a region which serves as a conductor such as the source electrode 2051, and functions as a shielding layer which has an opening part for bringing plasma into contact with a region which is allowed to be a semiconductor (the object to be processed). As a result, the shape or arrangement of the active layer 2041 can be arbitrarily adjusted. In addition, as compared with the fifth embodiment, since no dedicated mask for forming the active layer 2041 is required, the production steps can be decreased to reduce the production cost.

Figure 26:
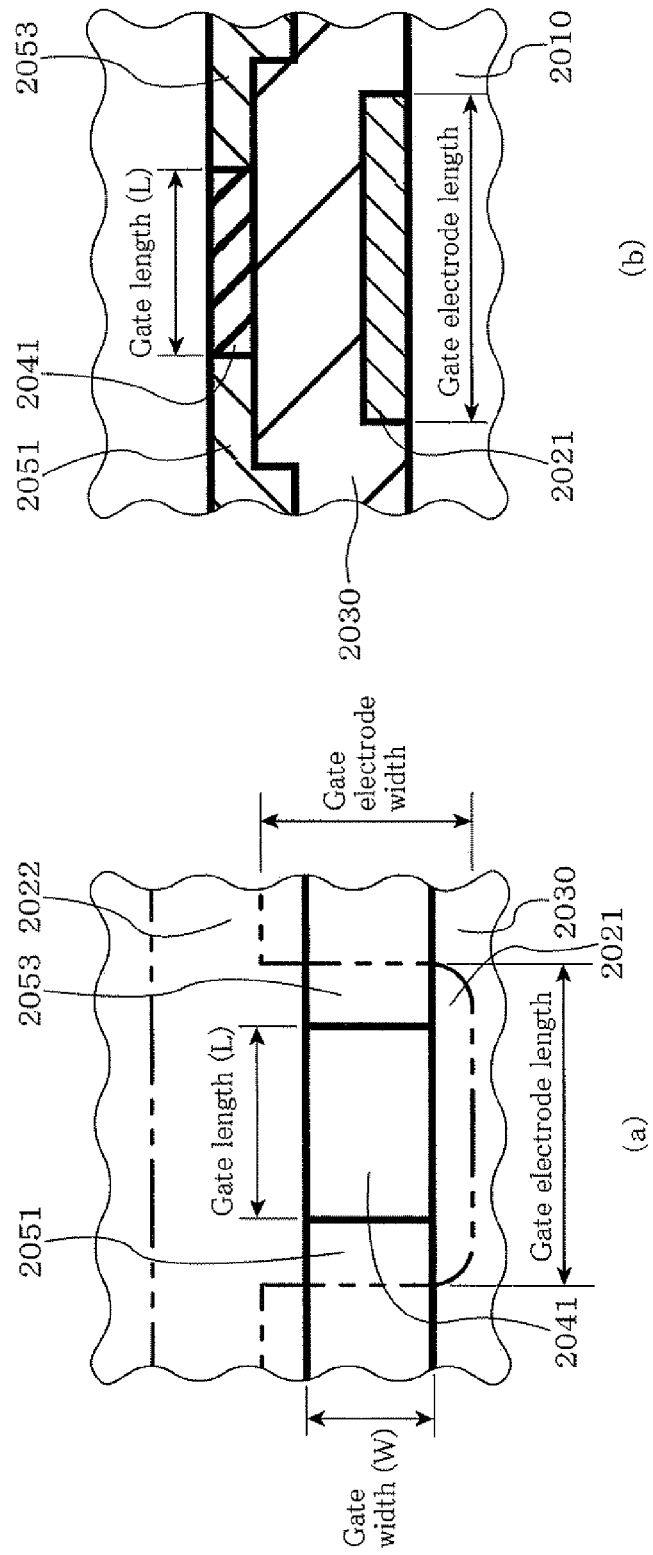
FIG. 26 is a schematic enlarged view for explaining a gate length and a gate width, in which (a) is a plan view, and (b) is a cross-sectional view of (a)

As for the shape of a part which is allowed to be the active layer 2041 by a local plasma treatment, as shown in FIG. 26, it is preferred that the gate length be shorter than the gate electrode length, and the gate width be shorter than the gate electrode width. In this way, the active layer 2041 can effectively accept influences brought about by the application of a voltage to the gate electrode 2021, whereby transistor characteristics can be improved.

When forming a thin film which becomes the object to be processed to be the active layer 2041, the source electrode 2051, the source wire 2052, the drain electrode 2053, the drain wire 2054 and the pixel electrode 2055 (hereinafter, appropriately abbreviated as the "amorphous metal oxide layer"), a sputtering method is effective.

The sputtering gas used in this case, an argon gas is preferable. By this using an argon gas, the resistance of the source electrode 2051, the source wire 2052, the drain electrode 2053, the drain wire 2054 and the pixel electrode 2055 can be lowered.

Furthermore, the above-mentioned amorphous metal oxide layer is formed with the temperature of the substrate being at room temperature. By forming a film at such a low temperature, an amorphous metal oxide layer can be formed. This amorphous metal oxide layer generates carriers by oxygen deficiency due to the amorphous structure, and is improved in conductivity and transparency.

The sputtering gas is not limited to 100% argon gas, and may be an argon gas containing a slight amount of oxygen, nitrogen or the like. By forming into a film in an argon gas atmosphere containing oxygen, nitrogen or the like, it operates as a stable transparent electrode in an amorphous state, and, if subjected to a plasma treatment, oxygen deficiency is decreased, whereby semiconductor performance (carrier concentration) can be effectively stabilized.

In this way, in this embodiment, since a transparent conductive film and a semiconductor film can be obtained from one thin film, productivity can be significantly improved.

Subsequently, in FIG. 24, FIG. 25(c) and FIG. 25(d), in substantially the same manner as in the fifth embodiment, on the gate-insulating film 2030, the active layer 2041, the source electrode 2051, the source wire 2052, the drain electrode 2053, the drain wire 2054 and the pixel electrode 2055, an SiNx film as the protective layer 2060 is formed by CVD (Step S2015).

The protective layer 2060 which has been formed is then subjected to dry etching by a photolithographic method using a third mask (not shown), whereby the pixel electrode 2055 is exposed. Then, the opening part 2023 and the opening part 2056 are formed, and part of the gate wire 2022 and part of the source wire 2052 are exposed to become wiring pads.

In this way, according to this embodiment, the thin film transistor 2002 provided with the protective layer 2060 can be produced by a production process using three masks.

As mentioned above, according to the method for producing a thin film transistor in this embodiment, the object to be processed to be the active layer 2041, the source electrode 2051, the source wire 2052, the drain electrode 2053, the drain wire 2054 and the pixel electrode 2055 are simultaneously formed into a film, followed by simultaneous shaping. Subsequently, a plasma treatment is conducted using the re-formed resist as a shielding layer, thereby allowing the object to be processed to be the active layer 2041. That is, a thin film formed of a prescribed material which is amorphous is simultaneously formed into a film, followed by simultaneous shaping. Part of this thin film is locally subjected to a plasma treatment to allow it to be the active layer 2041 (semiconductor), and the remaining part is used as it is in an amorphous state to allow it to be the conductor. As a result, the production steps can be decreased to reduce the production cost.

In addition, since the same material can be used, the management cost can be decreased.

Furthermore, in the conventional silicon-based TFT for driving a liquid crystal panel, since the materials of a transistor differ from the materials of a transparent electrode (pixel electrode) for driving a liquid crystal panel, the active layer or the pixel electrode could not be formed as the same layer. In the invention, by allowing a material for forming the transparent electrode for driving a liquid crystal and a material for forming the thin film transistor (active layer) to be the same, and the electrode part is allowed to have an amorphous structure and the active layer part is subjected to a plasma treatment, the production steps can be drastically reduced.

[Sixth Embodiment of the Thin Film Transistor]

The thin film transistor 2002 in the above-mentioned embodiment is also effective as an invention of a thin film transistor.

The thin film transistor 2002 has a configuration in which it is provided with a conductor which is composed of the above-mentioned prescribed material and serves as the source electrode 2051, the source wire 2052, the drain electrode 2053, the drain wire 2054 and the pixel electrode 2055, and the active layer 2041 which is the same layer as that of the conductor and is allowed to be a semiconductor by subjecting this prescribed material to a plasma treatment (see FIG. 26).

As mentioned above, the thin film transistor 2002 of this embodiment can reduce the management cost since the same material can be used. In addition, since the object to be processed to be the active layer 2041, the source electrode 2051, the source wire 2052, the drain electrode 2053, the drain wire 2054 and the pixel electrode 2055 are simultaneously formed into a film in an amorphous state, followed by simultaneous etching, the production steps can be decreased to reduce the production cost.

FOURTH APPLICATION EXAMPLE

The above-mentioned sixth embodiment of the method for producing a thin film transistor and the above-mentioned sixth embodiment of the thin film transistor have various application examples.

Then, the fourth application example will be explained with reference to the drawings.

Figure 27:
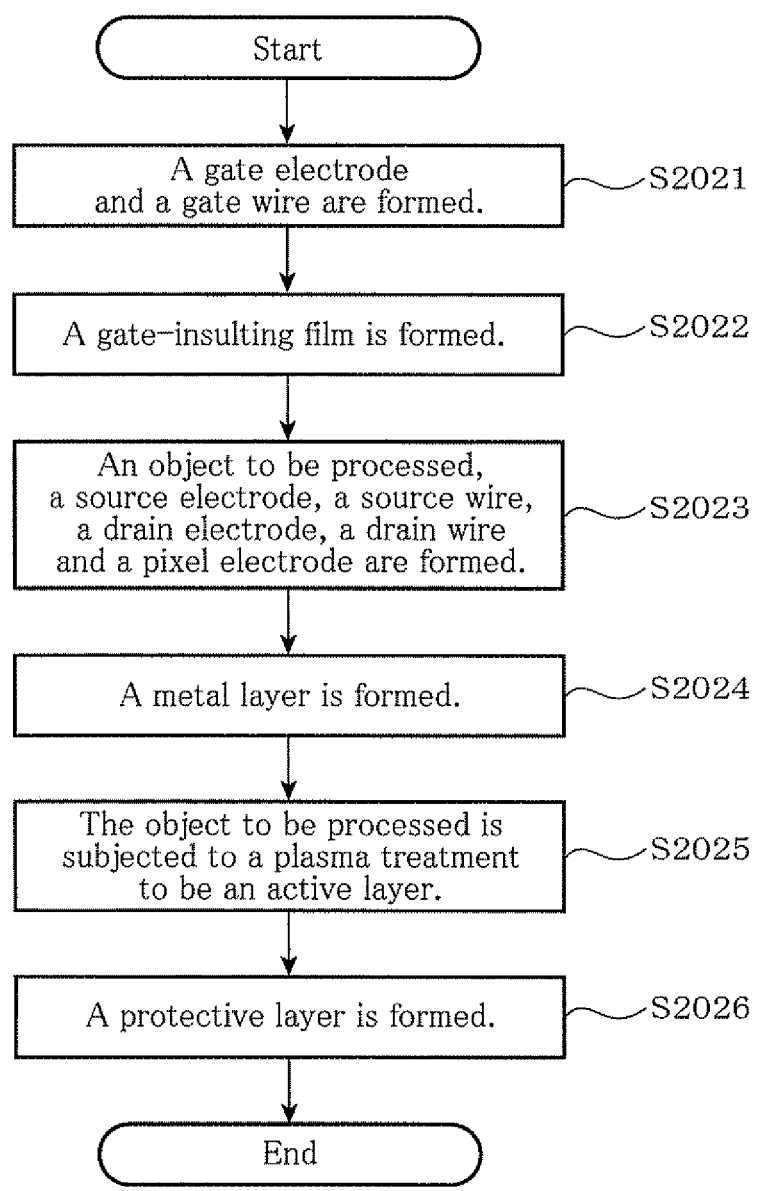
FIG. 27 is a schematic flow chart for explaining a fourth application example of the method for producing a thin film transistor according to the sixth embodiment of the invention.

FIG. 27 is a schematic flow chart for explaining a fourth application example of the method for producing a thin film transistor according to the sixth embodiment of the invention.

Figure 28:
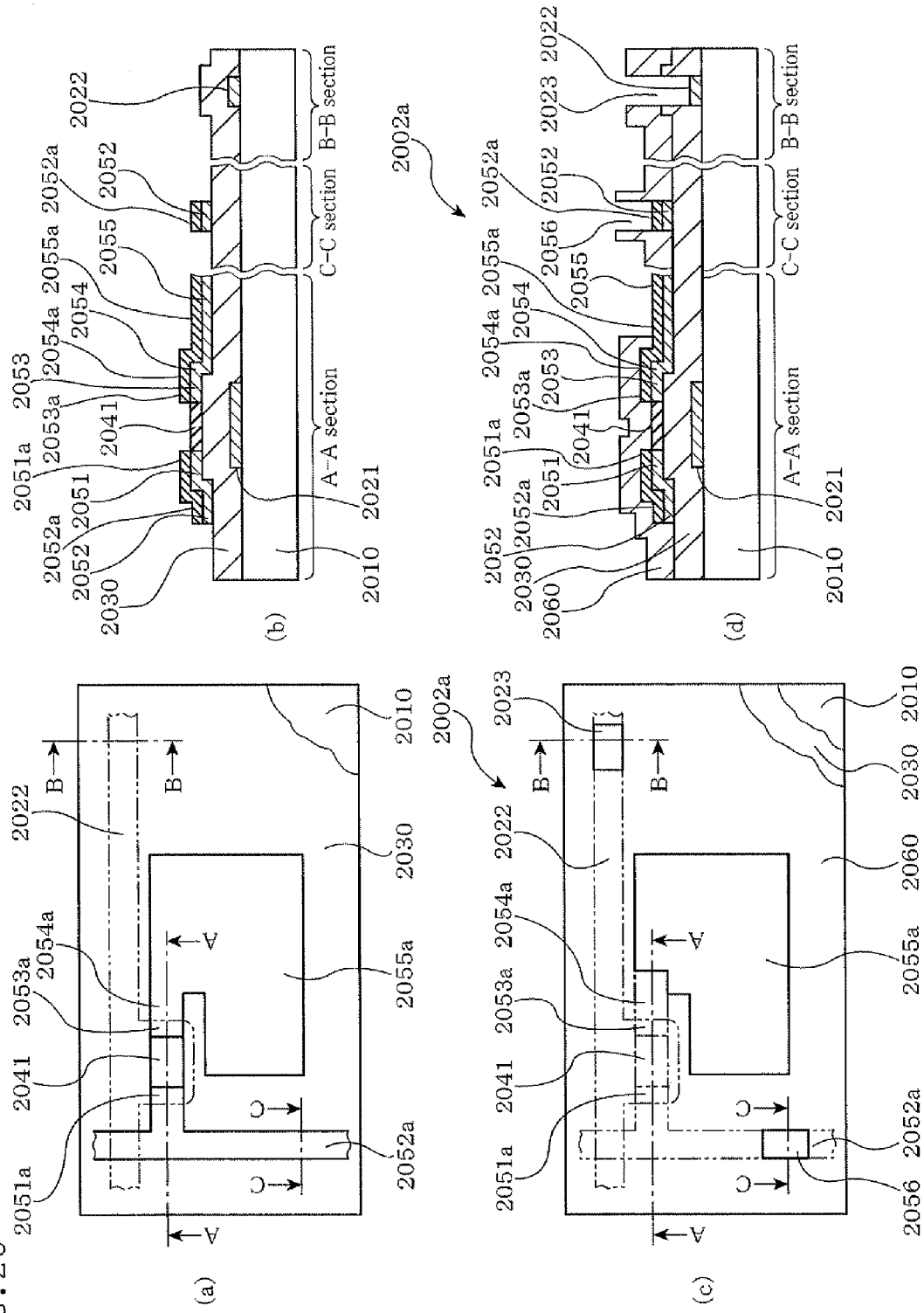
FIG. 28 is a schematic view of essential parts for explaining the fourth application example of the method for producing a thin film transistor according to the sixth embodiment of the invention; in which (a) is a plan view showing the state in which a gate electrode, a gate wire, a gate-insulating film, an active layer, a source wire, a source electrode, a drain electrode, a drain wire, a pixel electrode and a metal layer are formed, (b) is a cross-sectional view of (a), (c) is a plan view showing the state in which a protective layer is formed, and (d) is a cross-sectional view of (c)

FIG. 28 is a schematic view for explaining the fourth application example of the method for producing a thin film transistor according to the sixth embodiment of the invention; in which (a) is a plan view showing the state in which a gate electrode, a gate wire, a gate-insulating film, an active layer, a source wire, a source electrode, a drain electrode, a drain wire, a pixel electrode and a metal layer are formed, (b) is a cross-sectional view of (a), (c) is a plan view showing the state in which a protective layer is formed, and (d) is a cross-sectional view of (c).

In FIG. 27 and FIG. 28, the method for producing a thin film transistor 2002a of this application example differs from the above-mentioned sixth embodiment in that, between the Step S2013 and the Step S2014 (see FIG. 24), a source electrode 2051a, a source wire 2052a, a drain electrode 2053a, a drain wire 2054a and a pixel electrode 2055a, which are composed of the metal layer, are formed (Step S2024). The other methods are substantially the same as those in the sixth embodiment.

At first, in substantially the same manner as in the sixth embodiment, the gate electrode 2021 and the gate wire 2022 are formed on the glass substrate 2010 (Step S2021), and then, the gate-insulating film 2030 is formed (Step S2022).

In substantially the same manner as in the sixth embodiment, an amorphous metal oxide layer is formed in order to provide on the gate-insulating film 2030, the object to be processed to be the active layer 2041, the source electrode 2051, the source wire 2052, the drain electrode 2053, the drain wire 2054 and the pixel electrode 2055, and then a metal layer is formed by a sputtering method or the like.

Then, on the gate-insulating film 2030, the object to be processed to be the active layer 2041, the source electrode 2051, the source wire 2052, the drain electrode 2053, the drain wire 2054 and the pixel electrode 2055 are formed by a photolithographic method using a second half-tone mask (not shown) (Step S2023). At the time, the source wire 2052a, the drain wire 2054a and the pixel electrode 2055a, which are composed of the metal layer, are also formed.

The resist formed by the above-mentioned second half-tone mask has a shape such that part above the source electrode 2051, the source wire 2052, the drain electrode 2053, the drain wire 2054 and the pixel electrode 2055 are thicker than part above the object to be processed to be the active layer 2041.

Then, a resist formed by the second half-tone mask is re-formed, and using the re-formed resist (not shown), a source electrode 2051a and a drain electrode 2053a, which are formed of a metal layer, are formed by a photolithographic method (Step S2024). As a result, the surface of the active layer 2041 is exposed. That is, the source electrode, the source wire, the drain electrode, the drain wire and the pixel electrode of a thin film transistor 2002a are constituted as a stacked layer structure of an amorphous metal oxide layer and a metal layer, and the active layer 2041 (thin film transistor part) is formed of only an amorphous metal oxide layer. The re-formed resist is removed.

Subsequently, by conducting a plasma treatment, the object to be processed becomes a semiconductor, and is allowed to be the active layer 2041 (Step S2025). That is, the source electrode 2051a, the source wire 2052a, the drain electrode 2053a, the drain wire 2054a and the pixel electrode 2055a which are composed of a metal layer function as a shielding layer which covers a region which serves as a conductor such as the source electrode 2051 or the like and has an opening part for bringing plasma into contact with a region which is allowed to be a semiconductor (the object to be processed). As a result, the shape or arrangement of the active layer 2041 can be arbitrarily adjusted. In addition, as compared with the first embodiment, since no dedicated mask for forming the active layer 2041 is required, the production steps can be decreased to reduce the production cost.

In this application example, the re-formed resist is removed before conducting a plasma treatment. The method is, however, not limited to this. For example, when removing the re-formed resist by a plasma ashing apparatus, the object to be processed may become a semiconductor by means of this plasma ashing apparatus so as to allow it to become the active layer 2041. In this way, the re-formed resist can be removed and the object to be processed can become the active layer 2041 in a single step, whereby the productivity can be improved.

The shielding layer is not limited to a resist or a metal layer (conductor layer). It may be an insulating layer or the like, for example. It is possible to use a material which is capable of shielding plasma.

Subsequently, as shown in FIG. 28(*c*) and FIG. 28(*d*), in substantially the same manner as in the sixth embodiment, on the gate-insulating film 2030, the active layer 2041, the source electrode 2051*a*, the source wire 2052*a*, the drain electrode 2053*a*, the drain wire 2054*a* and the pixel electrode 2055*a*, an SiNx film as the protective layer 2060 is formed by CVD (Step S2026).

The protective layer 2060 which has been formed is then subjected to dry etching by a photolithographic method using a third mask (not shown), whereby the pixel electrode 2055*a* is exposed. Then, the opening part 2023 and the opening part 2056 are formed, and part of the gate wire 2022 and part of the source wire 2052*a* are exposed to become wiring pads.

In this way, according to this application example, the thin film transistor 2002 provided with the protective layer 2060 can be produced by a production process using three masks.

Although not shown, it is preferred that the pixel electrode 2055*a* be removed by a photolithographic method by using a third half-tone mask instead of the above-mentioned third mask, whereby the pixel electrode 2055 is exposed. That is, by using a photolithographic method using the third half-tone mask, the protective layer 2060 above the pixel electrode 2055*a* is subjected to dry etching ($CHF_3$ or the like used as an etching gas), and, further, the pixel electrode 2055*a* is subjected to dry etching ($SF_6$ or the like is used as an etching gas). Then, using the resist which has been re-formed, the protective layer 2060 and the gate-insulating film 2030 are subjected to dry etching ($CHF_3$ or the like used as an etching gas). As a result, the opening part 2023 and the opening part 2056 are formed, and part of the gate wire 2022 and part of the source wire 2052*a* are exposed to become wiring pads. In this way, the pixel electrode 2055 composed only of an amorphous metal oxide can be obtained, whereby light transmittance can be improved.

As mentioned above, according to the method for producing a thin film transistor 2002*a* in this application example, the object to be processed to be the active layer 2041, and the source electrode 2051, the source wire 2052, the drain electrode 2053, the drain wire 2054 and the pixel electrode 2055 composed of a prescribed material which is amorphous are formed into a film simultaneously, followed by simultaneous shaping. Furthermore, the source electrode 2051*a*, the source wire 2052*a*, the drain electrode 2053*a*, the drain wire 2054*a* and the pixel electrode 2055*a*, which are composed of a metal layer, can be formed efficiently.

The thin film transistor 2002*a* in this application example is also effective as an invention of a thin film transistor.

FIFTH APPLICATION EXAMPLE

Then, the fifth application example will be explained with reference to the drawings.

Figure 29:
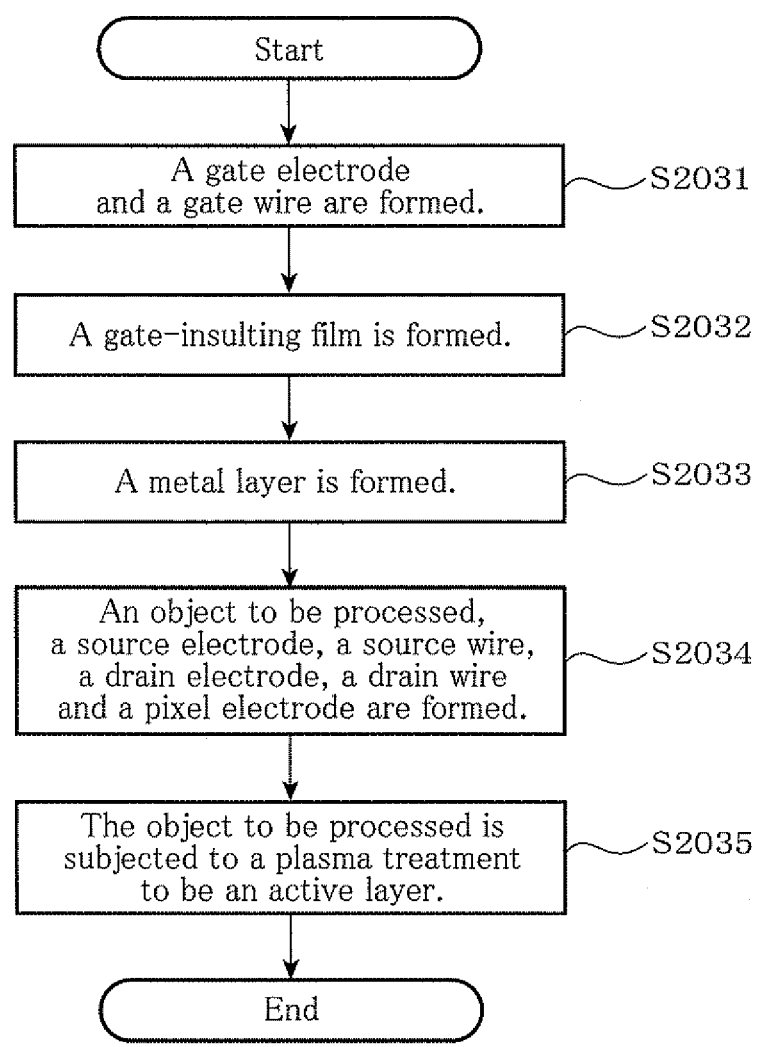
FIG. 29 is a schematic flow chart for explaining a fifth application example of the method for producing a thin film transistor according to the sixth embodiment of the invention.

FIG. 29 is a schematic flow chart for explaining the fifth application example of the method for producing a thin film transistor according to the sixth embodiment of the invention.

Figure 30:
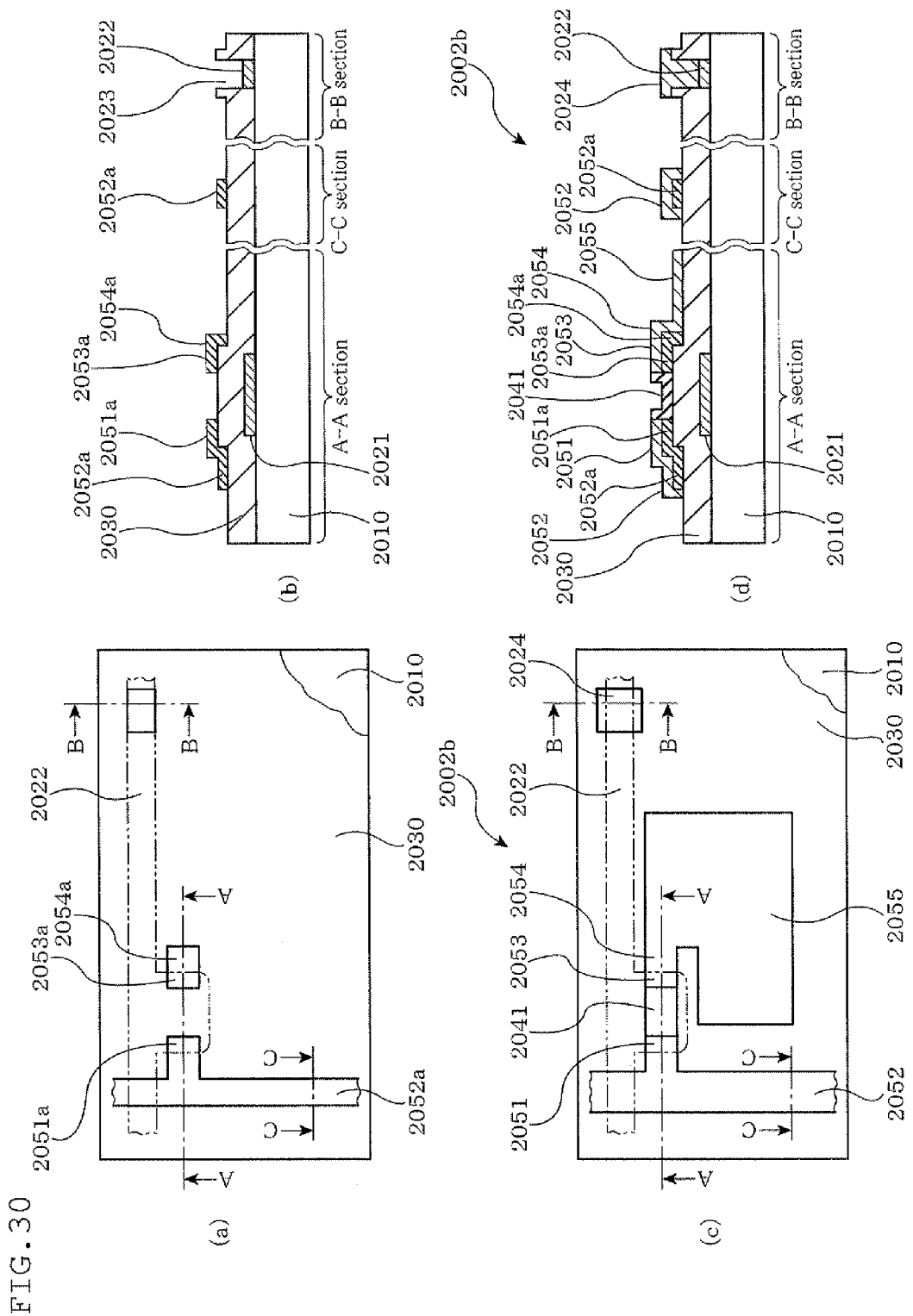
FIG. 30 is a schematic view of essential parts for explaining the fifth application example of the method for producing a thin film transistor according to the sixth embodiment of the invention, in which (a) is a plan view showing the state in which a gate electrode, a gate wire, a gate-insulating film, a metal layer and an opening part are produced, (b) is a cross-sectional view of (a), (c) is a plan view in which a source electrode, a source wire, an active layer, a drain electrode, a drain wire, a pixel electrode and a gate wire pad are formed, and (d) is a cross-sectional view of (c)

FIG. 30 is a schematic view of essential parts for explaining the fifth application example of the method for producing a thin film transistor according to the sixth embodiment of the invention, in which (a) is a plan view showing the state in which a gate electrode, a gate wire, a gate-insulating film, a metal layer and an opening part are produced, (b) is a cross-sectional view of (a), (c) is a plan view in which a source electrode, a source wire, an active layer, a drain electrode, a drain wire, a pixel electrode and a gate wire pad are formed, and (d) is a cross-sectional view of (c).

In FIG. 29 and FIG. 30, the method for producing a thin film transistor of this application example differs from the above-mentioned sixth embodiment in that, between the Step S2012 and the Step S2013 (see FIG. 24), a source electrode 2051*a*, a source wire 2052*a*, a drain electrode 2053*a* and a drain wire 2054*a*, which are composed of a metal layer, are formed (Step S2033) and the protective layer 2060 is not formed. The other methods are substantially the same as those in the sixth embodiment.

At first, in substantially the same manner as in the sixth embodiment, the gate electrode 2021 and the gate wire 2022 are formed on the glass substrate 2010 (Step S2031), and then, the gate-insulating film 2030 is formed (Step S2032).

Subsequently, a metal layer is formed by a sputtering method or the like, and by a photolithographic method using a second mask (not shown), the source electrode 2051*a*, the source wire 2052*a*, the drain electrode 2053*a* and the drain wire 2054*a* which are composed of a metal layer are formed (Step S2033). Subsequently, as shown in FIG. 30(*b*), a photolithographic method using the third mask (not shown), the opening part 2023 is formed above part of the gate wire 2022.

Then, on the gate-insulating film 2030, the source electrode 2051*a*, the source wire 2052*a*, the drain electrode 2053*a*, the drain wire 2054*a* and part of the exposed gate wire 2022, by a sputtering method or the like, a thin film composed of the above-mentioned prescribed material which is amorphous (amorphous metal oxide layer) is formed.

Subsequently, by a photolithographic method using a fourth half-tone mask (not shown), the object to be processed to be the active layer 2041, the source electrode 2051, the source wire 2052, the drain electrode 2053, the drain wire 2054, the pixel electrode 2055 and the gate wire pad 2024 are simultaneously shaped (Step S2034).

The resist formed by the above-mentioned fourth half-tone mask has a shape that a part covering the source electrode 2051, the source wire 2052, the drain electrode 2053, the drain wire 2054, the pixel electrode 2055 and the gate wire pad 2024 is thicker than a part covering the object to be processed to be the active layer 2041.

Then, the resist formed by the fourth half-tone mask is re-formed to have a shape such that the object to be processed to be the active layer 2041 is exposed and it covers the source electrode 2051, the source wire 2052, the drain electrode 2053, the drain wire 2054, the pixel electrode 2055, and the gate wire pad 2024.

Subsequently, by conducting a plasma treatment using this re-formed resist (not shown), the object to be processed becomes a semiconductor so as to serve as the active layer 2041 (Step S2035). That is, the re-formed resist covers a region which serves as a conductor such as the source electrode 2051, and functions as a shielding layer which has an opening part for bringing plasma into contact with a region which is allowed to be a semiconductor (the object to be processed). As a result, the shape, arrangement or the like of the active layer 2041 can be arbitrarily adjusted.

In this way, according to this application example, the thin film transistor 2002b can be produced by a production process using four masks.

As mentioned above, according to the method for producing the thin film transistor 2002b of this application example, the object to be processed to be the active layer 2041, and the source electrode 2051, the source wire 2052, the drain electrode 2053, the drain wire 2054, the pixel electrode 2055 and the gate wire pad 2024, which are composed of a prescribe material which is amorphous, can be formed into a film simultaneously, followed by simultaneous etching. In addition, by forming the source electrode 2051a, the source wire 2052a, the drain electrode 2053a and the drain wire 2054a, conductivity can be improved.

The thin film transistor 2002b of this application example is also effective as an invention of a thin film transistor.

[Seventh Embodiment of the Method for Producing a Thin Film Transistor]

Figure 31:
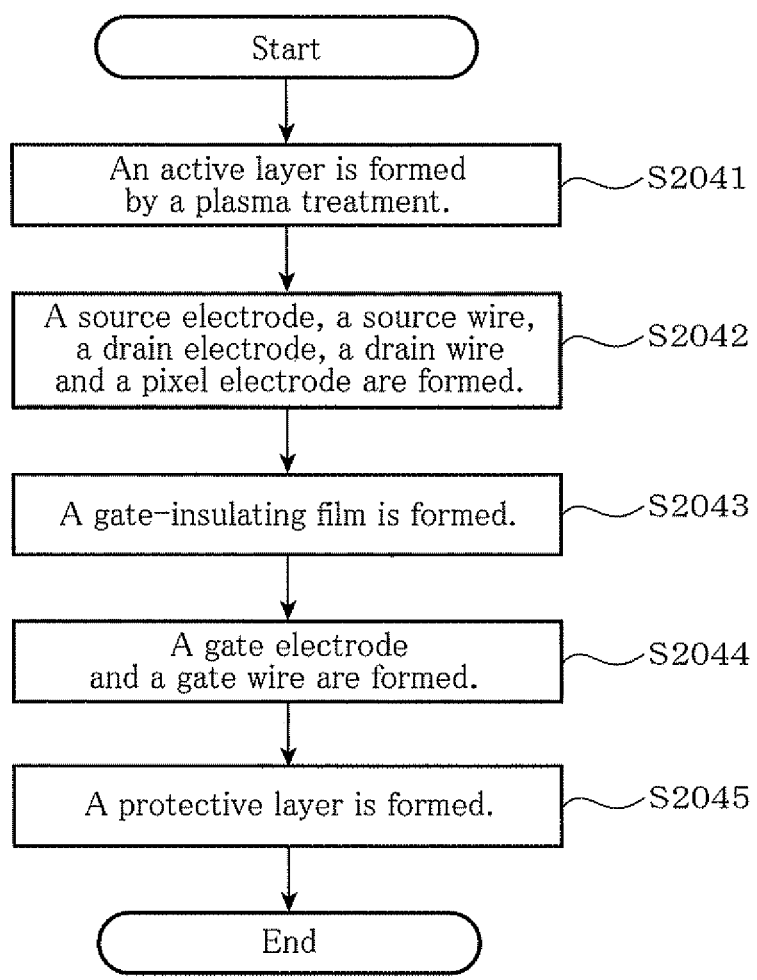
FIG. 31 is a schematic flow chart for explaining the method for producing a thin film transistor according to the seventh embodiment of the invention.

FIG. 31 is a schematic flow chart for explaining the method for producing a thin film transistor according to the seventh embodiment of the invention.

Figure 32:
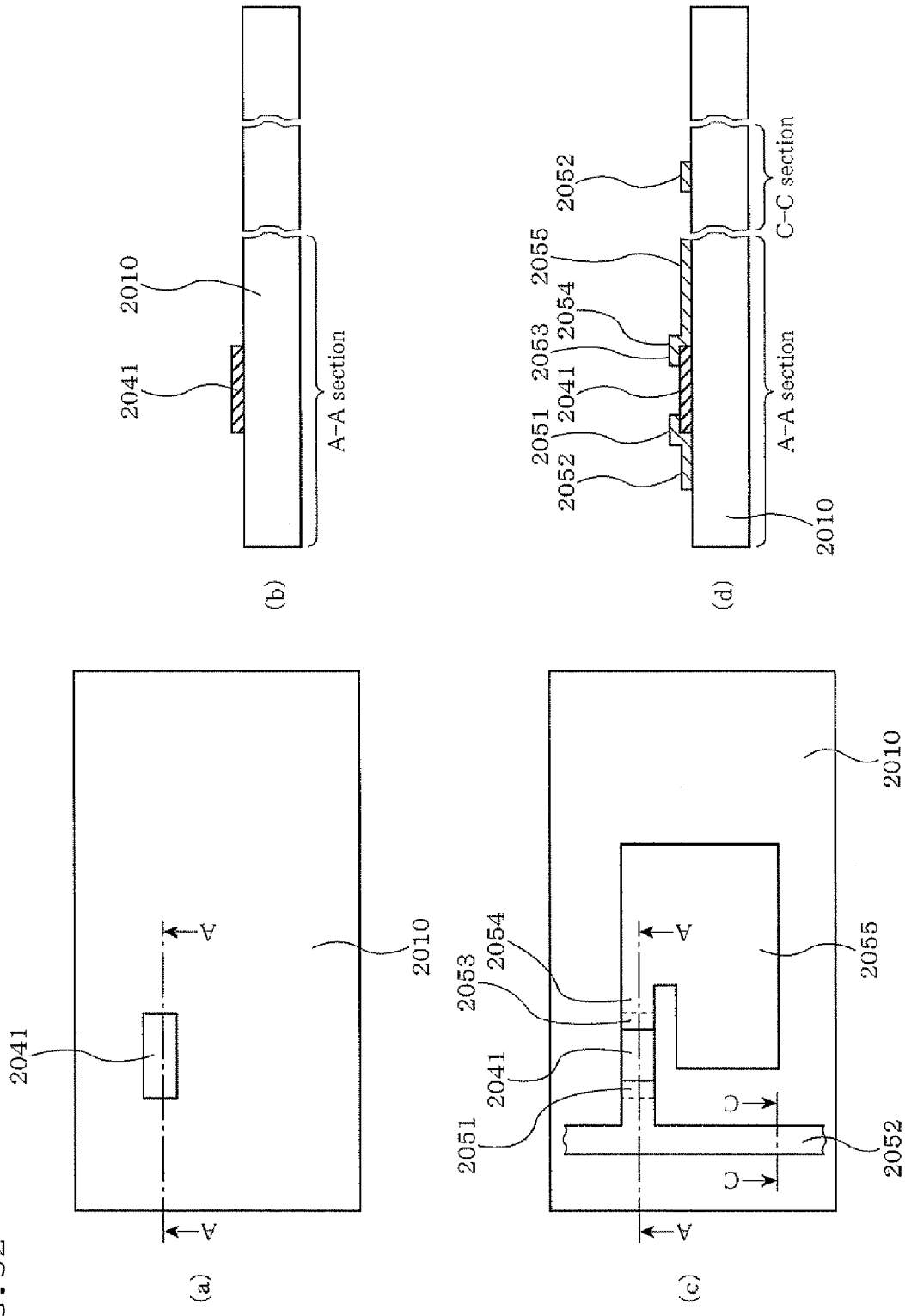
FIG. 32 is a schematic view of essential parts for explaining the method for producing a thin film transistor according to the seventh embodiment of the invention, in which (a) is a plan view showing the state in which an active layer is formed, (b) is a cross-sectional view of (a), (c) is a plan view showing the state in which a source wire, a source electrode, a drain electrode, a drain wire and a pixel electrode are formed, and (d) is a cross-sectional view of (c)

FIG. 32 is a schematic view of essential parts for explaining the method for producing a thin film transistor according to the seventh embodiment of the invention, in which (a) is a plan view showing the state in which an active layer is formed, (b) is a cross-sectional view of (a), (c) is a plan view showing the state in which a source wire, a source electrode, a drain electrode, a drain wire and a pixel electrode are formed, and (d) is a cross-sectional view of (c).

In FIG. 31, FIG. 32(a) and FIG. 32(b), at first, a transparent glass substrate 2010 is prepared. On this glass substrate 2010, by a photolithographic method using a first mask (not shown), the active layer 2041 is formed (Step S2041). This active layer 2041 has properties as a semiconductor by using the above-mentioned prescribed material as the base material, followed by a plasma treatment.

Here, the active layer 2041 is formed into a film in an amorphous state by a sputtering method or the like, and then shaped by a photolithographic method using a first mask (not shown), and becomes a semiconductor by a plasma treatment. The method is, however, not limited thereto. For example, film formation is conducted in an amorphous state, the resulting film may be allowed to be a semiconductor by a plasma treatment, and shaped by a photolithographic method by using a first mask (not shown).

Subsequently, on the glass substrate 2010 and the active layer 2041, the source electrode 2051, the source wire 2052, the drain electrode 2053, the drain wire 2054 and the pixel electrode 2055 are formed (Step S2042).

The source electrode 2051, the source wire 2052, the drain electrode 2053, the drain wire 2054 and the pixel electrode 2055 are composed of the same material as that constitutes the active layer 2041. By allowing it to be amorphous, it exhibits properties as the conductor.

Here, the source electrode 2051, the source wire 2052, the drain electrode 2053, the drain wire 2054 and the pixel electrode 2055 are simultaneously formed into a film in an amorphous state by sputtering and the like, followed by simultaneous etching by photolithography using a second mask (not shown). Therefore, the production steps can be decreased to reduce the production cost.

Figure 33:
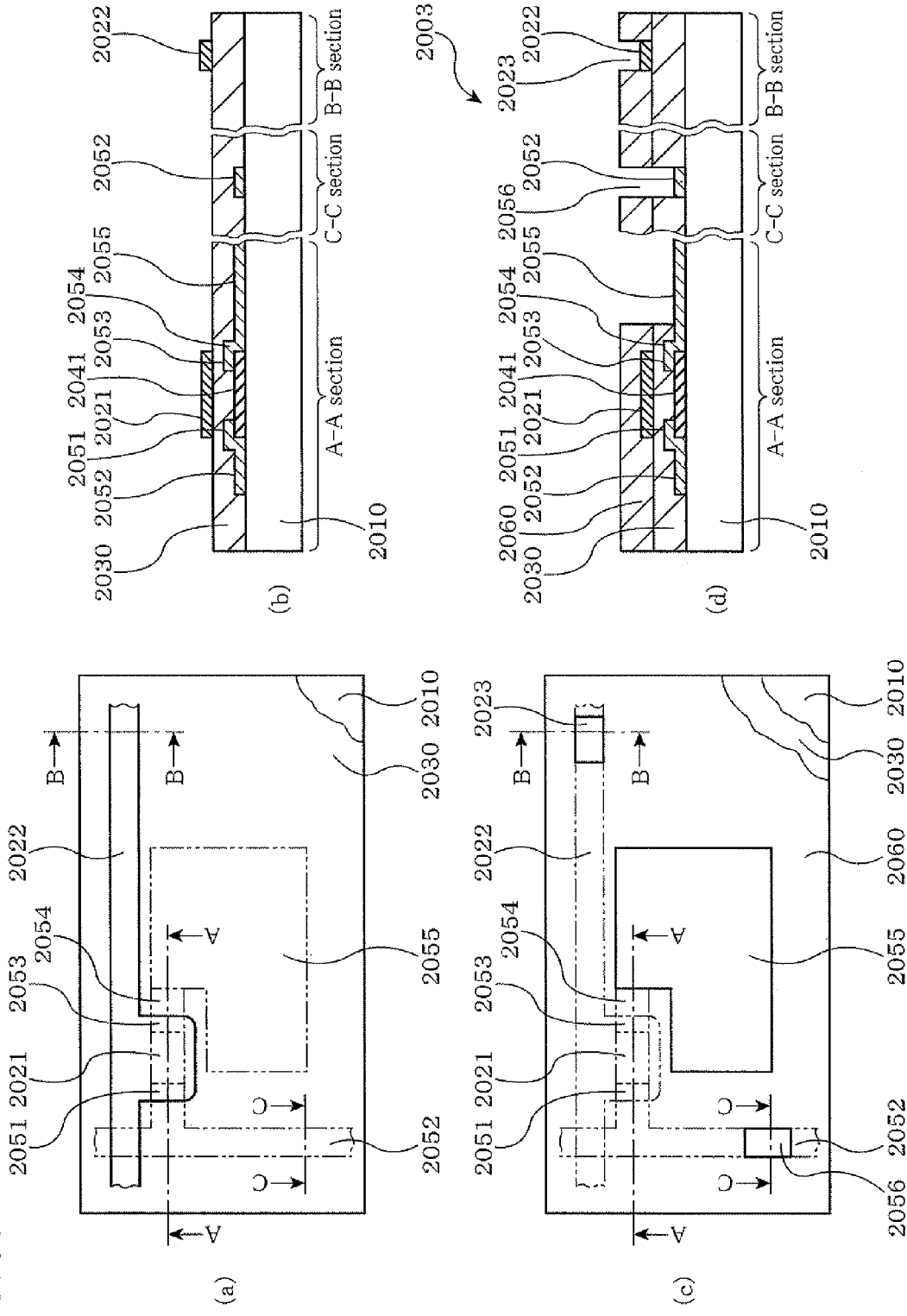
FIG. 33 is a schematic view of essential parts for explaining the method for producing a thin film transistor according to a seventh embodiment of the invention, in which (a) is a plan view showing the state in which a gate-insulating film, a gate electrode and a gate wire are formed, (b) is a cross-sectional view of (a), (c) is a plan view showing the state in which a protective layer is formed, and (d) is a cross-sectional view of (c)

FIG. 33 is a schematic view of essential parts for explaining the method for producing a thin film transistor according to the seventh embodiment of the invention, in which (a) is a plan view showing the state in which a gate-insulating film, a gate electrode and a gate wire are formed, (b) is a cross-sectional view of (a), (c) is a plan view showing the state in which a protective layer is formed, and (d) is a cross-sectional view of (c).

As shown in FIG. 31, FIG. 33(a) and FIG. 33(b), an SiNx film as the gate-insulating film 2030 is formed by CVD (chemical vapor deposition method) on the glass substrate 2010, the source wire 2052, the source electrode 2051, the active layer 2041, the drain electrode 2053, the drain wire 2054 and the pixel electrode 2055 (Step S2043).

Subsequently, on the gate-insulating film 2030, the gate electrode 2021 and the gate wire 2022, which are composed of a metal thin film, are formed in a desired shape (Step S2044).

Then, as shown in FIG. 33(c) and FIG. 33(d), an SiNx film as the protective layer 2060 is formed by CVD on the gate-insulating film 2030, the gate electrode 2021 and the gate wire 2022 (Step S2045).

The protective layer 2060 which has been formed is then subjected to dry etching by a photolithographic method using a fourth mask (not shown), whereby the pixel electrode 2055 is exposed. Then, the opening part 2023 and the opening part 2056 are formed, and part of the gate wire 2022 and part of the source wire 2052 are exposed to become wiring pads.

In this way, according to this embodiment, the top-gate type thin film transistor 2003 provided with the protective layer 2060 can be produced by a production process using four masks.

As mentioned above, according to the method for producing a thin film transistor 2003 of this embodiment, the active layer 2041 is formed by subjecting the base material composed of a prescribed material to a plasma treatment, and the amorphous source electrode 2051, source wire 2052, drain electrode 2053, drain wire 2054 and pixel electrode 2055 composed of the same prescribed material of the base material of the active layer 2041 are formed into a film simultaneously, followed by simultaneous etching.

That is, in the invention, the prescribed material having the same composition is subjected to a plasma treatment to allow it to be the active layer 2041 (semiconductor) and is used in an amorphous state to allow it to be a conductor. Since the same material can be used, the management cost can be decreased.

In addition, the source electrode 2051, the source wire 2052, the drain electrode 2053, the drain wire 2054 and the pixel electrode 2055 are provided by simultaneously forming into a film in an amorphous state, followed by simultaneous etching. Therefore, the production steps are decreased to reduce the production cost.

[Seventh Embodiment of the Thin Film Transistor]

The thin film transistor 2003 in the above-mentioned embodiment is also effective as an invention of a thin film transistor.

The thin film transistor 2003 has a configuration in which it is provided with the active layer 2041 which is composed of the above-mentioned prescribed material and serves as the semiconductor and the source electrode 2051, the source wire 2052, the drain electrode 2053, the drain wire 2054 and the pixel electrode 2055 which are composed of the above-mentioned prescribed material and serve as the conductor (see FIG. 33).

As mentioned above, the thin film transistor 2003 of this embodiment can reduce the management cost since the same material can be used. In addition, since the source electrode 2051, the source wire 2052 and the drain electrode 2053, the drain wire 2054 and the pixel electrode 2055 are simultaneously formed into a film in an amorphous state, followed by simultaneous etching, the production steps can be decreased to reduce the production cost.

[Eighth Embodiment of the Method for Producing a Thin Film Transistor]

Figure 34:
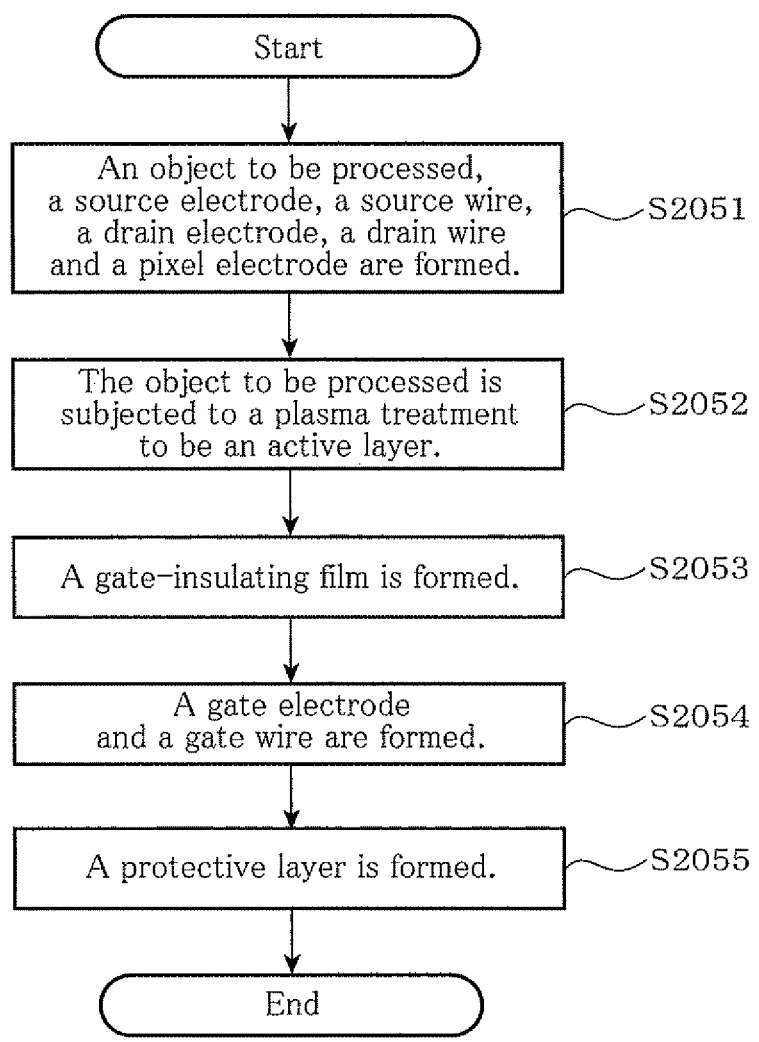
FIG. 34 is a schematic flow chart for explaining the method for producing a thin film transistor according to an eighth embodiment of the invention.

FIG. 34 is a schematic flow chart for explaining the method for producing a thin film transistor according to an eighth embodiment of the invention.

Figure 35:
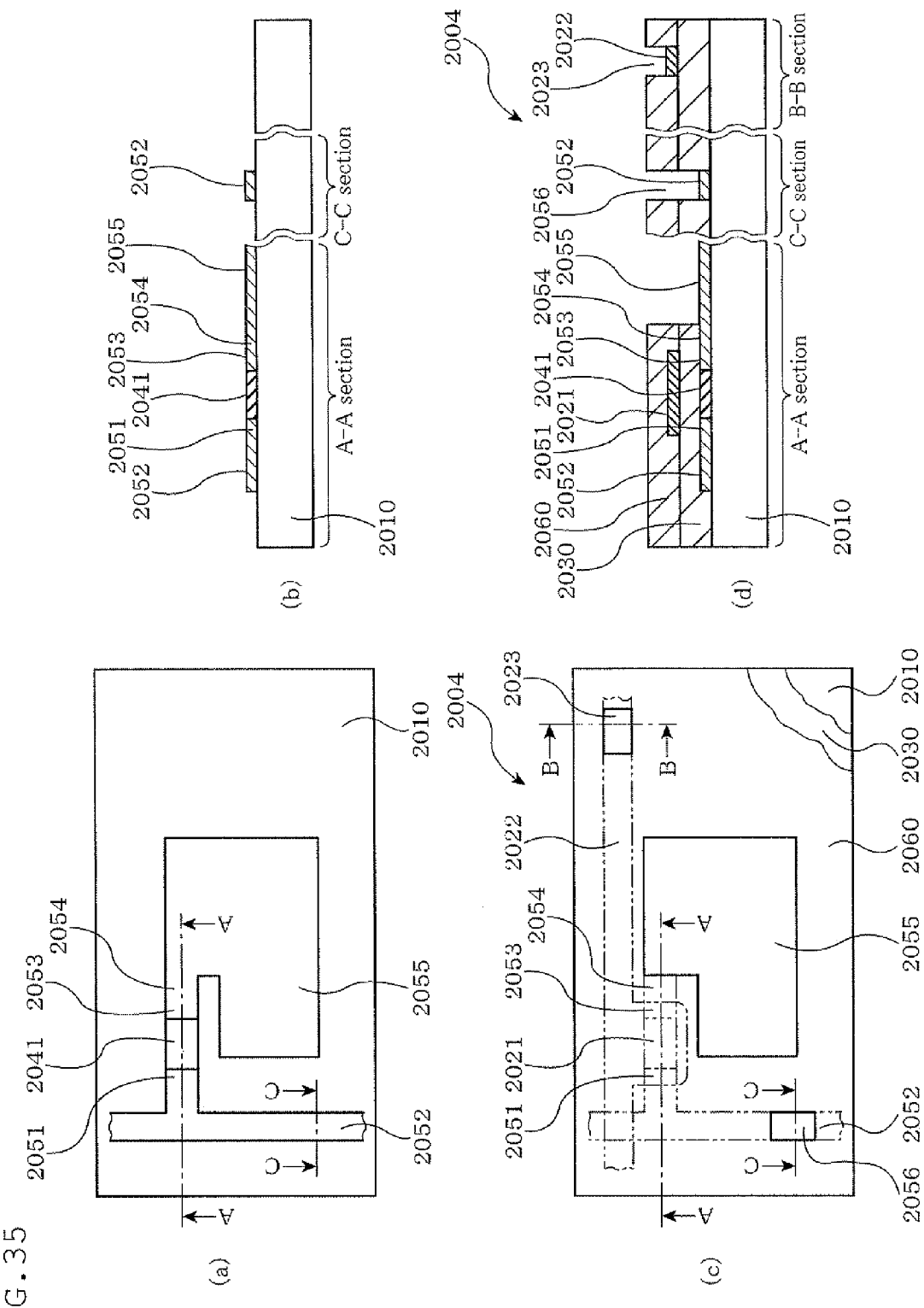
FIG. 35 is a schematic view of essential parts for explaining the method for producing a thin film transistor according to the eighth embodiment of the invention, in which (a) is a plan view showing the state in which an active layer, a source wire, a source electrode, a drain electrode, a drain wire and a pixel electrode are formed, (b) is a cross-sectional view of (a), (c) is a plan view showing the state in which a gate-insulating film, a gate electrode, a gate wire and a protective layer are formed, and (d) is a cross-sectional view of (c)

FIG. 35 is a schematic view of essential parts for explaining the method for producing a thin film transistor according to the eighth embodiment of the invention, in which (a) is a plan view showing the state in which an active layer, a source wire, a source electrode, a drain electrode, a drain wire and a pixel electrode are formed, (b) is a cross-sectional view of (a), (c) is a plan view showing the state in which a gate-insulating film, a gate electrode, a gate wire and a protective layer are formed, and (d) is a cross-sectional view of (c).

In FIG. 34 and FIG. 35, the method for producing a thin film transistor of this embodiment differs from the above-mentioned seventh embodiment in that, instead of the Step S2041 and the Step S2042 (see FIG. 31), an object to be processed to be the active layer 2041, the source electrode 2051, the source wire 2052, the drain electrode 2053, the drain wire 2054 and the pixel electrode 2055 are formed (Step S2051), and then the object is subjected to a plasma treatment to be the active layer 2041 (Step 2052). The other methods are substantially the same as those in the seventh embodiment.

Subsequently, on the gate-insulating film 2030, the object to be processed to be the active layer 2041, the source electrode 2051, the source wire 2052, the drain electrode 2053, the drain wire 2054 and the pixel electrode 2055 are formed (Step S2051).

That is, as shown in FIG. 35(a) and FIG. 35(b), the object 2041, the source electrode 2051, the source wire 2052, the drain electrode 2053, the drain wire 2054 and the pixel electrode 2055 are composed of the above-mentioned prescribed material and are simultaneously formed into a film in an amorphous state by a sputtering method or the like, and are simultaneously shaped by a photolithographic method using a first half-tone mask (not shown). In this way, the production steps can be decreased to reduce the production cost.

For a resist formed with the first half-tone mask, the part thereof covering the source electrode 2051, the source wire 2052, the drain electrode 2053, the drain wire 2054 and the pixel electrode 2055 is thicker than the part thereof covering the object 2041.

Next, the resist formed with the second half-tone mask is re-formed into a shape in which the object 2041 is exposed and the source electrode 2051, the source wire 2052, the drain electrode 2053, the drain wire 2054 and the pixel electrode 2055 are covered.

Subsequently, by conducting a plasma treatment using this re-formed resist (not shown), the object to be processed becomes a semiconductor so as to serve as the active layer 2041 (Step S2052). That is, the re-formed resist covers a region which serves as a conductor such as the source electrode 2051, and functions as a shielding layer which has an opening part for bringing plasma into contact with a region which is allowed to be a semiconductor (the object to be processed). As a result, the shape or arrangement of the active layer 2041 can be arbitrarily selected. In addition, as compared with the seventh embodiment, since no dedicated mask for forming the active layer 2041 is required, the production steps can be decreased to reduce the production cost.

When forming a thin film which becomes the object to be processed to be the active layer 2041, the source electrode 2051, the source wire 2052, the drain electrode 2053, the drain wire 2054 and the pixel electrode 2055 (hereinafter, appropriately abbreviated as the "amorphous metal oxide layer"), a sputtering method is effective.

As the sputtering gas used in this case, an argon gas is preferable. By using an argon gas, the resistance of the source electrode 2051, the source wire 2052, the drain electrode 2053, the drain wire 2054 and the pixel electrode 2055 can be lowered.

Furthermore, the above-mentioned amorphous metal oxide layer is formed with the temperature of the substrate being at room temperature. By forming a film at such a low temperature, an amorphous metal oxide layer can be formed. This amorphous metal oxide layer generates carriers by oxygen deficiency due to the amorphous structure, and is improved in conductivity and transparency.

The sputtering gas is not limited to 100% argon gas, and may be an argon gas containing a slight amount of oxygen, nitrogen or the like. By forming into a film in an argon gas atmosphere containing oxygen, nitrogen or the like, it operates as a stable transparent electrode in an amorphous state, and, if subjected to a plasma treatment, oxygen deficiency is decreased, whereby semiconductor performance (carrier concentration) can be stabilized.

In this way, in this embodiment, a transparent conductive film and a semiconductor film can be obtained from one thin film, whereby productivity can be drastically improved.

Then, as shown in FIG. 35(c) and FIG. 35(d), an SiNx film as the gate-insulating film 2030 is formed by CVD (chemical vapor deposition method) on the glass substrate 2010, the source wire 2052, the source electrode 2051, the active layer 2041, the drain electrode 2053, the drain wire 2054 and the pixel electrode 2055 in substantially the same manner as in the seventh embodiment (Step S2053).

Subsequently, on the gate-insulating film 2030, the gate electrode 2021 and the gate wire 2022, which are composed of a metal thin film, are formed in a desired shape by photolithography using a second mask (not shown) (Step S2054).

Then, an SiNx film as the protective layer 2060 is formed by CVD on the gate-insulating film 2030, the gate electrode 2021 and the gate wire 2022 (Step S2055).

The protective layer 2060 which has been formed is then subjected to dry etching by a photolithographic method using a third mask (not shown), whereby the pixel electrode 2055 is exposed. The opening part 2023 and the opening part 2056 are formed, and part of the gate wire 2022 and part of the source wire 2052 are exposed to become wiring pads.

In this way, according to this embodiment, a top-gate type thin film transistor 2004 provided with the protective layer 2060 can be produced by a production process using three masks.

As mentioned above, according to the method for producing a thin film transistor of this embodiment, the object to be processed to be the active layer 2041, the source electrode 2051, the source wire 2052, the drain electrode 2053, the drain wire 2054 and the pixel electrode 2055, which are composed of an amorphous prescribed material, are simultaneously formed into a film, followed by simultaneous shaping. Subsequently, a plasma treatment is conducted using the re-formed resist as a shielding layer, thereby allowing the object to be processed to be the active layer 2041. That is, a thin film formed of an amorphous prescribed material is simultaneously formed, followed by simultaneous shaping. Part of this thin film is locally subjected to a plasma treatment to allow it to be the active layer 2041 (semiconductor), and the remaining part is used as it is in an amorphous state to be the conductor. As a result, the production steps can be decreased to reduce the production cost.

In addition, since the same material can be used, the management cost can be decreased.

In the conventional silicon-based TFT for driving a liquid crystal panel, since the materials of a transistor differ from the materials of a transparent electrode (pixel electrode) for driving a liquid crystal panel, the active layer and the pixel electrode could not be formed as the same layer. In the invention, by using the same material as a material for forming the transparent electrode for driving a liquid crystal and a material for forming the thin film transistor (active layer), using the material in an amorphous state in the electrode part and subjecting the active layer part to a plasma treatment, the production steps can be drastically reduced.

[Eighth Embodiment of the Thin Film Transistor]

The thin film transistor 2004 in the above-mentioned embodiment is also effective as an invention of a thin film transistor.

The thin film transistor 2004 has a configuration in which it is provided with the active layer 2041 which is composed of the above-mentioned prescribed material and serves as a semiconductor, and the source electrode 2051, the source wire 2052, the drain electrode 2053, the drain wire 2054 and the pixel electrode 2055 which are composed of a material having the same composition as that of the above-mentioned prescribed material and serves as a conductor (see FIG. 35).

As mentioned above, the thin film transistor 2004 of this embodiment can reduce the management cost since the same material can be used. In addition, since the object to be processed to be the active layer 2041, the source electrode 2051, the source wire 2052, the drain electrode 2053, the drain wire 2054 and the pixel electrode 2055 are simultaneously formed into a film in an amorphous state, followed by simultaneous etching, the production steps can be decreased to reduce the production cost.

SIXTH APPLICATION EXAMPLE

The above-mentioned eighth embodiment of the method for producing the thin film transistor and the above-mentioned eighth embodiment of the thin film transistor have various application examples.

Then, the sixth application example will be explained with reference to the drawings.

Figure 36:
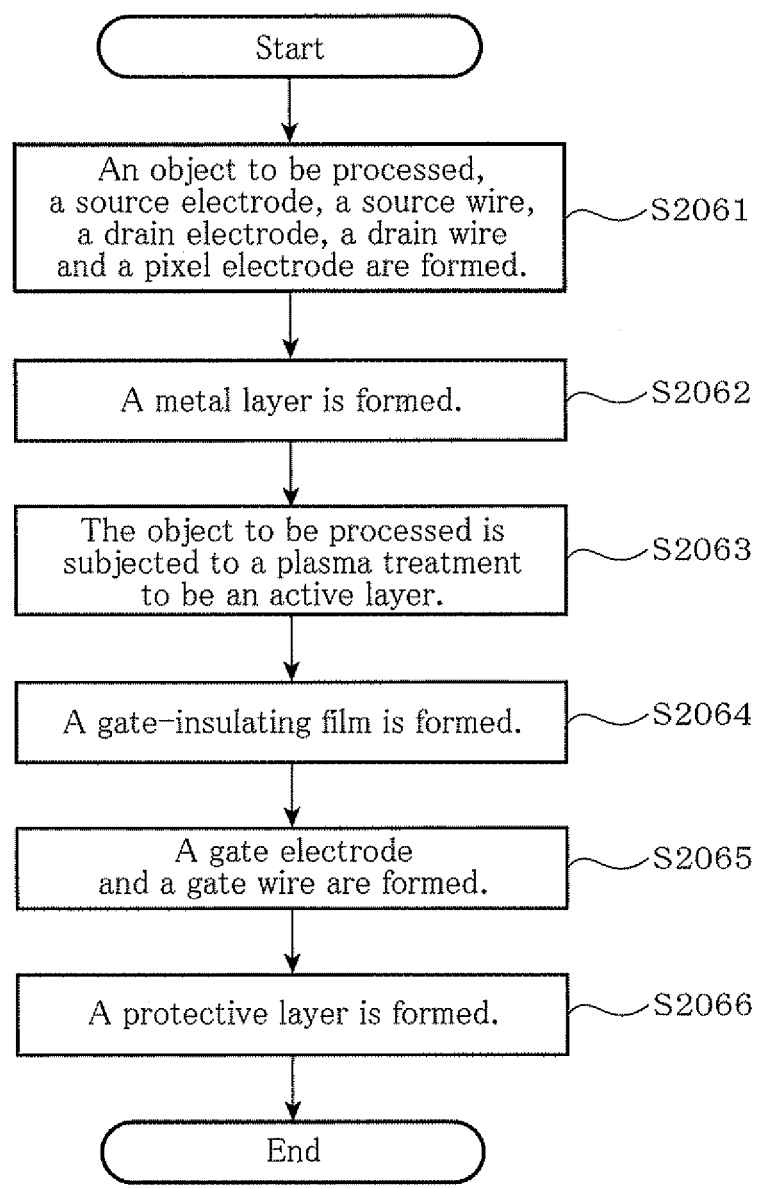
FIG. 36 is a schematic flow chart for explaining a sixth application example of the method for producing a thin film transistor according to the eighth embodiment of the invention.

FIG. 36 is a schematic flow chart for explaining the sixth application example of the method for producing a thin film transistor according to the eighth embodiment of the invention.

Figure 37:
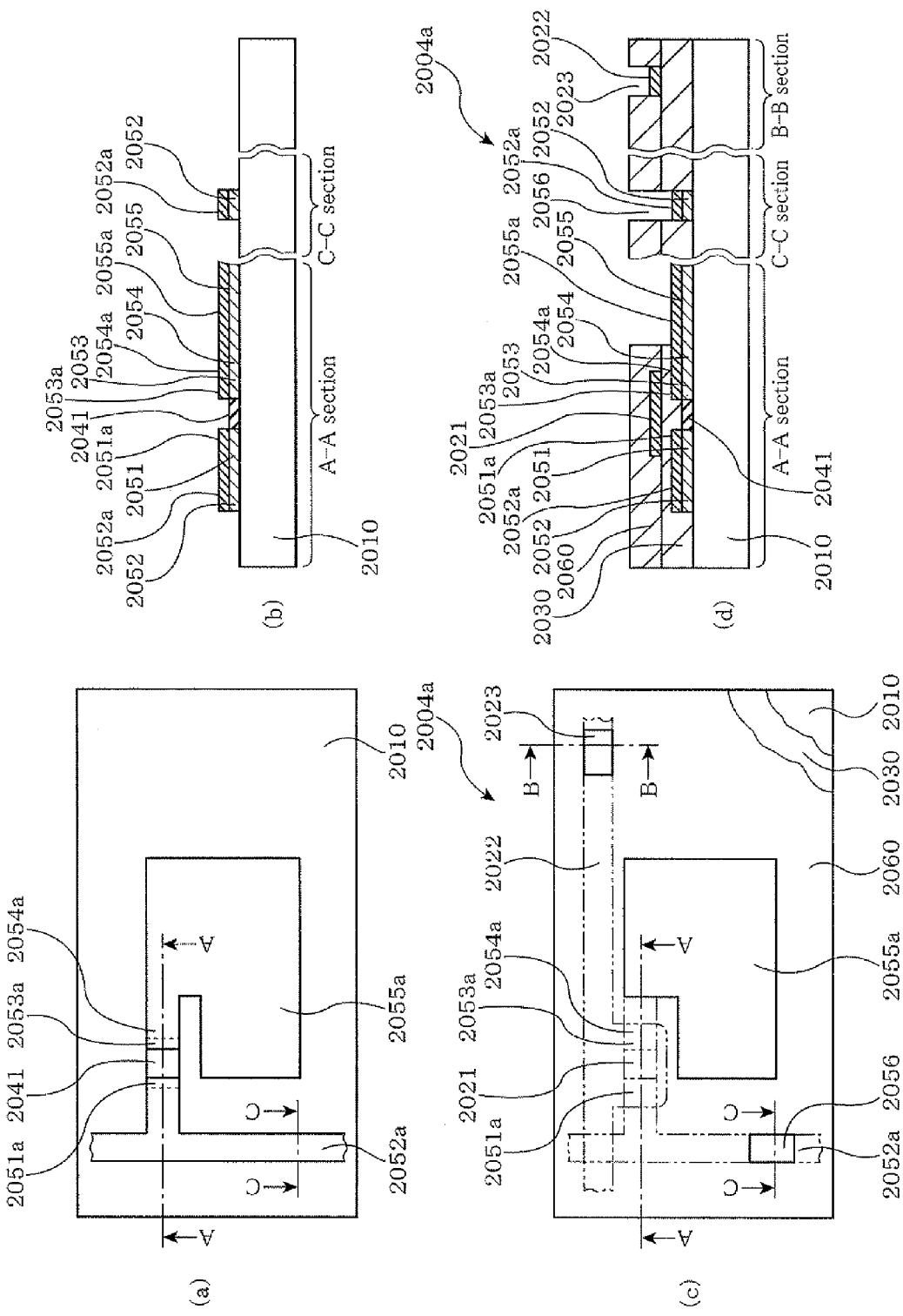
FIG. 37 is a schematic view of essential parts for explaining the sixth application example of the method for producing a thin film transistor according to the eighth embodiment of the invention, in which (a) is a plan view showing the state in which an active layer, a source wire, a source electrode, a drain electrode, a drain wire, a pixel electrode and a metal layer are formed, (b) is a cross-sectional view of (a), (c) is a plan view showing the state in which a gate-insulating film, a gate electrode, a gate wire and a protective layer are formed, and (d) is a cross-sectional view of (c)

FIG. 37 is a schematic view of essential parts for explaining the method for producing a thin film transistor according to the sixth application example according to the eighth embodiment of the invention, in which (a) is a plan view showing the state in which an active layer, a source wire, a source electrode, a drain electrode, a drain wire, a pixel electrode and a metal layer are formed, (b) is a cross-sectional view of (a), (c) is a plan view showing the state in which a gate-insulating film, a gate electrode, a gate wire and a protective layer are formed, and (d) is a cross-sectional view of (c).

In FIG. 36 and FIG. 37, the method for producing a thin film transistor 2004a of this embodiment differs from the above-mentioned eighth embodiment in that, between Step S2051 and S2052 (see FIG. 34), the source electrode 2051a, the source wire 2052a, the drain electrode 2053a, the drain wire 2054a and the pixel electrode 2055a, which are composed of a metal layer, are formed (Step S2062). The other methods are substantially the same as those in the eighth embodiment.

In substantially the same manner as in the eighth embodiment, an amorphous metal oxide layer is formed on the glass substrate 2010 for forming an object to be processed to be the active layer 2041, the source electrode 2051, the source wire 2052, the drain electrode 2053, the drain wire 2054 and the pixel electrode 2055, and a metal layer is then formed by a sputtering method or the like.

Then, on the glass substrate 2010, the object to be processed to be the active layer 2041, the source electrode 2051, the source wire 2052, the drain electrode 2053, the drain wire 2054 and the pixel electrode 2055 are formed by a photolithographic method using a first half-tone mask (not shown) (Step S2061). At this time, the source wire 2052a, the drain wire 2054a and the pixel electrode 2055a are also formed.

The resist formed by using the above-mentioned first half-tone mask has a shape such that part above the source electrode 2051, the source wire 2052, the drain electrode 2053, the drain wire 2054 and the pixel electrode 2055 are thicker than part above the object to be processed to be the active layer 2041.

Then, a resist formed by using the first half-tone mask is re-formed. Using the re-formed resist (not shown), a source electrode 2051a and a drain electrode 2053a, which are formed of a metal layer, are formed by a photolithographic method (Step S2062). As a result, the surface of the active layer 2041 is exposed. That is, the source electrode, the source wire, the drain electrode, the drain wire and the pixel electrode of a thin film transistor 2004a is of a stacked layer structure of an amorphous metal oxide layer and a metal layer, and the active layer 2041 (thin film transistor part) is formed of only the amorphous metal oxide layer. The re-formed resist is removed.

Then, the object to be processed changes to a semiconductor by a plasma treatment, thereby forming an active layer 2041 (Step S2063). That is, the source electrode 2051a, the source wire 2052a, the drain electrode 2053a, the drain wire 2054a and the pixel electrode 2055a, which are formed of a metal layer, function as a shielding layer covering a region which serves as the conductor such as the source electrode 2051 and having an opening part for brings plasma into contact with a region which serves as the semiconductor (the object to be processed). Due to such a configuration, the shape or arrangement of the active layer 2041 can be arbitrarily adjusted. In addition, as compared with the seventh embodiment, since no dedicated mask for forming the active layer 2041 is required, the production steps can be decreased to reduce the production cost.

Then, as shown in FIG. 37(c) and FIG. 37(d), in substantially the same manner as in the eighth embodiment, an SiNx film as a gate-insulating film 2030 is formed by CVD on the glass substrate 2010, the active layer 2041, the source electrode 2051a, the source wire 2052a, the drain electrode 2053a, the drain wire 2054a and the pixel electrode 2055a (Step S2064).

Subsequently, by a photolithographic method using a second mask (not shown), a gate electrode 2021 and a gate wire 2022, which are composed of a metal thin film, are formed in a desired shape on the gate-insulating film 2030 (Step S2065).

Subsequently, an SiNx film as a protective layer 2060 is formed by CVD on the gate-insulating film 2030, the gate electrode 2021 and the gate wire 2022 (Step S2066).

The protective layer 2060 which has been formed is then subjected to dry etching by a photolithographic method using a third mask (not shown), whereby the pixel electrode 2055a is exposed. The opening part 2023 and the opening part 2056 are formed, and part of the gate wire 2022 and part of the source wire 2052a are exposed to become wiring pads.

In this way, according to this application example, the top-gate type thin film transistor 2004 provided with the protective layer 2060 can be produced by a production process using three masks.

As explained above, according to the method for producing a thin film transistor 2004a of this application example, the object to be processed to be the active layer 2041, the source electrode 2051, the source wire 2052, the drain electrode 2053, the drain wire 2054 and the pixel electrode 2055, which are composed of an amorphous prescribed material, are formed into a film simultaneously, followed by simultaneous shaping. In addition, the source electrode 2051a, the source wire 2052a, the drain electrode 2053a, the drain wire 2054a and the pixel electrode 2055a, which are formed of a metal layer, can be formed efficiently.

The thin film transistor 2004a in this application example is also effective also as an invention of a thin film transistor.

In this application example, the plasma treatment is conducted after the re-formed resist (not shown) is removed. The manner of plasma treatment is not limited thereto. For example, the re-formed resist may be removed after the plasma treatment using the re-formed resist as the shielding layer.

SEVENTH APPLICATION EXAMPLE

Then, the seventh application example will be explained with reference to the drawings.

Figure 38:
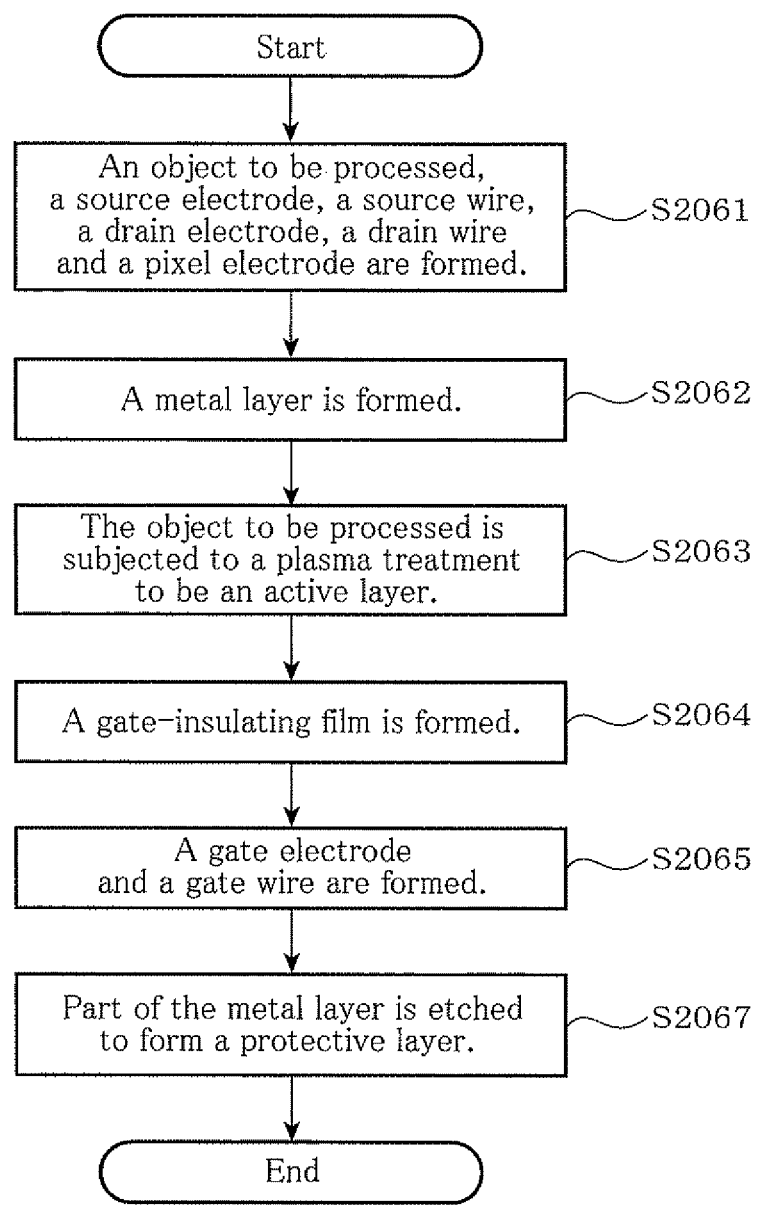
FIG. 38 is a schematic flow chart for explaining a seventh application example of the method for producing a thin film transistor according to the eighth embodiment of the invention.

FIG. 38 is a schematic flow chart for explaining a seventh application example of the method for producing a thin film transistor according to the eighth embodiment of the invention.

Figure 39:
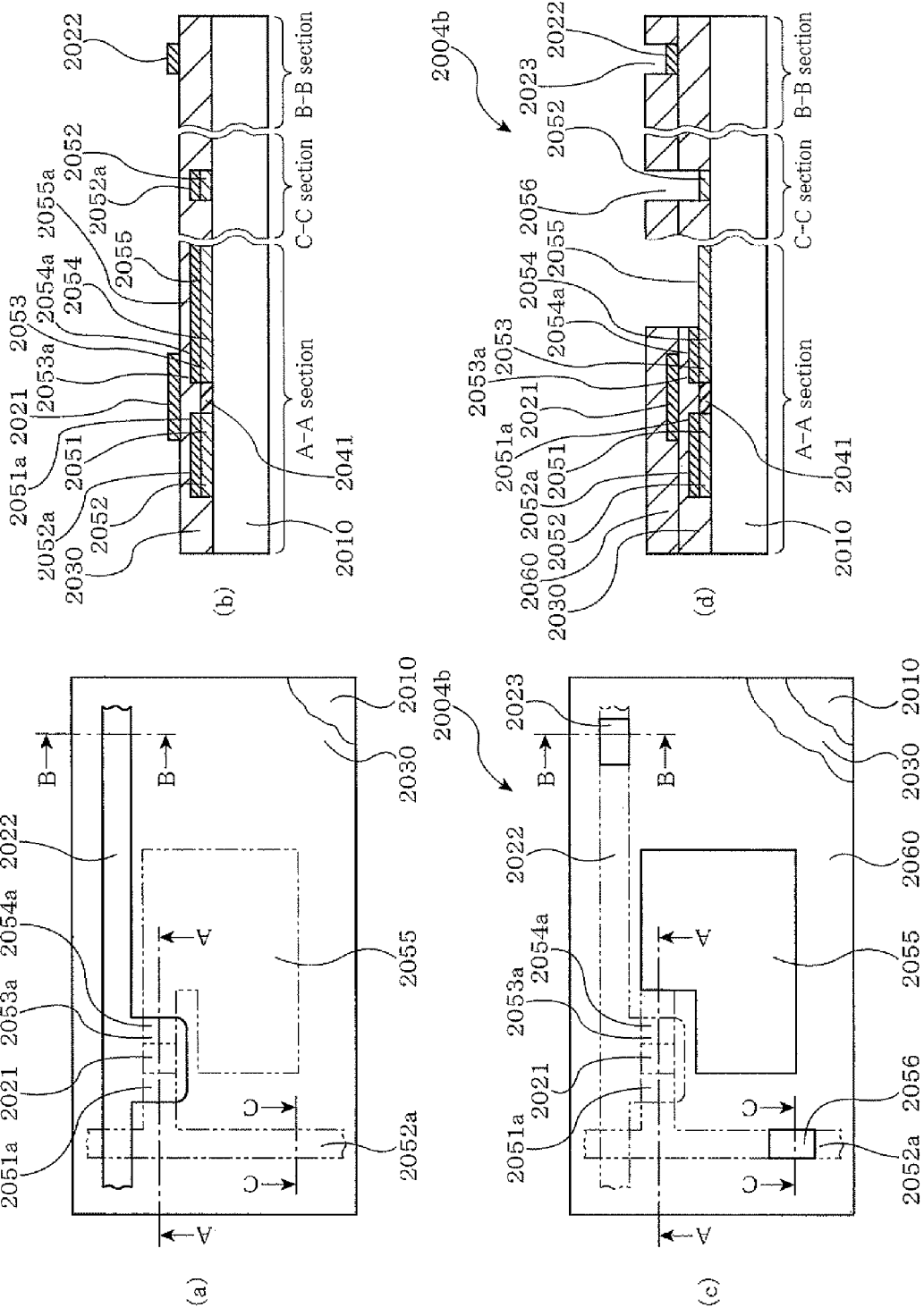
FIG. 39 is a schematic view of essential parts for explaining the seventh application example of the method for producing a thin film transistor according to the eighth embodiment of the invention, in which (a) is a plan view showing the state in which an active layer, a source wire, a source electrode, a drain electrode, a drain wire, a pixel electrode, and a metal layer, are formed, (b) is a cross-sectional view of (a), (c) is a plan view showing the state in which a protective layer is formed and part of a metal layer is etched, and (d) is a cross-sectional view of (c)

FIG. 39 is a schematic view of essential parts for explaining the seventh application example of the method for producing a thin film transistor according to the eighth embodiment of the invention, in which (a) is a plan view showing the state in which an active layer, a source wire, a source electrode, a drain electrode, a drain wire, a pixel electrode, a metal layer, a gate-insulating film, a gate electrode and a gate wire are formed, (b) is a cross-sectional view of (a), (c) is a plan view showing the state in which a protective layer is formed and part of the metal layer is etched, and (d) is a cross-sectional view of (c).

In FIG. 38 and FIG. 39, the method for producing a thin film transistor 2004b of this application example differs from the above-mentioned sixth embodiment in that, part of the metal layer (the pixel electrode 2055a and the source wire 2052a in the opening part 2056) is etched to form the protective layer 2060 (Step S2067), instead of Step S2066 (see FIG. 36). Other methods are almost the same as those of the sixth example.

At first, in substantially the same manner as in the sixth application example, the object to be processed to be the active layer 2041, the source electrode 2051, the source wire 2052, the drain electrode 2053, the drain wire 2054 and the pixel electrode 2055 are formed on the glass substrate 2010 (Step S2061). At this time, a source wire 2052a, a drain wire 2054a and a pixel electrode 2055a, which are formed of a metal layer, are also formed. Subsequently, a source electrode 2051a and a drain electrode 2053a, which are formed of a metal layer, are formed (Step S2062). Then, the object to be processed which is exposed becomes a semiconductor by a plasma treatment to be the active layer 2041 (Step S2063).

Then, as shown in FIG. 39(a) and FIG. 39(b), in substantially the same manner as in the sixth application example, an SiNx film as a gate-insulating film 2030 is formed by CVD on the glass substrate 2010, an active layer 2041, a source electrode 2051a, a source wire 2052a, a drain electrode 2053a, a drain wire 2054a and a pixel electrode 2055a (Step S2064).

Subsequently, by a photolithographic method using a second mask (not shown), the gate electrode 2021 and the gate wire 2022, which are composed of a metal thin film, are formed in a desired shape on the gate-insulating film 2030 (Step S2065).

Then, as shown in FIG. 39(c) and FIG. 39(d), in substantially the same manner as in the sixth application example, an SiNx film as the protective layer 2060 is formed by CVD on the gate-insulating layer 2030, the gate electrode 2021 and the gate wire 2022. Subsequently, by a photolithographic method using a third half-tone mask (not shown), part of the metal layer (the pixel electrode 2055a and the source wire 2052a in the opening part 2056) is etched to form the protective layer 2060 (Step S2067).

That is, at first, by a photolithographic method using a third half-tone mask (not shown), the protective layer 2060 and the gate-insulating film 2030 on the pixel electrode 2055a as well as a region for the opening part 2056 of the protective layer 2060 and the gate-insulating film 2030 are dry-etched (using $CHF_3$ or the like as an etching gas), and then the pixel electrode 2055a and the source wire 2052a in the opening part 2056 are dry-etched (using $SF_6$ or the like as an etching gas). Then, using the re-formed resist, the protective layer 2060 is dry-etched (using $CHF_3$ or the like as an etching gas) to form an opening part 2023. In this way, part of the gate wire 2022 and part of the source wire 2052 are exposed to become wiring pads. In addition, the pixel electrode 2055 which is formed of only an amorphous metal oxide can be obtained, whereby light transmittance can be improved.

In this way, according to this application example, the top-gate type thin film transistor 2004 provided with the protective layer 2060 can be produced by a production process using three masks.

As explained above, according to the method for producing the thin film transistor 2004b of this application example, since the pixel electrode 2055 is exposed, light transmittance can be improved.

The thin film transistor 2004b of this application example is also effective as an invention of a thin film transistor.

FOURTH EXAMPLE

The example according to the above-mentioned embodiments and application examples will be now explained.

This example corresponds to the above-mentioned seventh application example.

First, as shown in FIG. 38, FIG. 39(a) and FIG. 39(b), on the transparent glass substrate 2010, using an indium oxide-gallium oxide-zinc oxide target, a 40 nm-thick amorphous thin film was formed by a sputtering method with the temperature of the substrate being at room temperature. Here, the above-mentioned target is composed of indium oxide, gallium oxide and zinc oxide. The atomic percentage of indium (=[In]/([In]+[Ga]+[Zn]), where [In] is the number of atoms of Indium, [Ga] is the number of atoms of gallium and [Zn] is the number of atoms of zinc) was 45%. In addition, the atomic percentage of gallium (=[Ga]/([In]+[Ga]+[Zn])) was 30%. Furthermore, the atomic percentage of zinc (=[Zn]/([In]+[Ga]+[Zn])) was 25%.

Subsequently, a 200 nm-thick titanium film was formed by a sputtering method.

Then, on the glass substrate 2010, the object to be processed to be the active layer 2041, the source electrode 2051, the source wire 2052, the drain electrode 2053, the drain wire 2054 and the pixel electrode 2055 were formed by a photolithographic method using a first half-tone mask (not shown) (Step S2061). At this time, the source wire 2052a, the drain wire 2054a and the pixel electrode 2055a, which were composed of a titanium layer, were also formed.

In addition, the resist formed by using the above-mentioned first half-tone mask had a shape that a part above the source electrode 2051, the source wire 2052, the drain electrode 2053, the drain wire 2054 and the pixel electrode 2055 was thicker than a part above the object to be processed to be the active layer 2041.

Then, a resist formed by using the first half-tone mask was re-formed, and using the re-formed resist (not shown), the source electrode 2051a and the drain electrode 2053a, which was formed of a titanium layer, were formed by a photolithographic method (Step S2062). As a result, titanium above the object to be processed to be the active layer 2041 was removed by dry etching using $SF_6$ or the like and the surface of the object is exposed.

Then, the re-formed resist was removed with a plasma ashing apparatus used for removing a resist and the object to be processed was activated by the plasma treatment to be the active layer 2041 (Step S2063).

In the plasma ashing apparatus, gases which can be normally used include oxygen, nitrogen, argon, and a mixture thereof. Among them, oxygen gas is most effective.

In the case of oxygen plasma, gas pressure is allowed to be 100 Pa or more and 2000 Pa or less, preferably 300 Pa or more and 1000 Pa or less. In addition, a treatment time is from 0.1 to 10 minutes, preferably from 0.5 to 5 minutes. Furthermore, plasma output is 50 to 1000 W, preferably 100 to 800 W, and more preferably 300 to 500 W.

When a mixture gas of nitrogen, argon gas and oxygen is used, an object to be processed can be activated under conditions which are almost the same as the above-mentioned conditions.

Furthermore, the activation of an object to be processed means to control the electron carrier concentration of the active layer 2041 in the thin film transistor. Although there are no restrictions on the lower limit of the electron carrier concentration, the electron carrier concentration is $10^{10}/cm^3$ or more and less than $10^{18}/cm^3$. It is also preferred that the electron carrier concentration be $10^{11}/cm^3$ or more and $10^{17}/cm^3$ or less with $10^{12}/cm^3$ or more and $10^{16}/cm^3$ or less being more preferable. In this way, the thin film transistor according to this example can be a normally-off transistor, and the on-off ratio can be increased sufficiently.

Then, as shown in FIG. 39(a) and FIG. 39(b), in substantially the same manner as in the seventh application example, a 250 nm-thick SiNx film which is to be the gate-insulating film 2030 is formed by CVD on the glass substrate 2010, the active layer 2041, the source electrode 2051a, the source wire 2052a, the drain electrode 2053a, the drain wire 2054a and the pixel electrode 2055a (Step S2064).

Then, titanium was formed into a film with a thickness of 200 nm on the gate-insulating film 2030, and by using a second mask (not shown), the gate electrode 2021 and the gate wire 2022 were formed in a desired shape by a photolithographic method (Step S2065).

Then, on the gate-insulating film 2030, the gate electrode 2021 and the gate wire 2022, an SiNx film as the protective layer 2060 was formed into a film with a thickness of 100 nm, part of the metal layer was etched and the protective layer 2060 was formed (Step S2067).

That is, at first, by a photolithographic method using a third half-tone mask (not shown), the protective layer 2060 and the gate-insulating film 2030 on the pixel electrode 2055a as well as a region for the opening part 2056 of the protective layer 2060 and the gate-insulating film 2030 were removed by dry etching using a $CHF_3$ gas or the like. Subsequently, the pixel electrode 2055a and the source wire 2052a in the opening part 2056 were removed by dry etching using a $SF_6$ gas or the like. Then, using the re-formed resist, the protective layer 2060 was dry-etched (using $CHF_3$ or the like as an etching gas) to form an opening part 2023. In this way, part of the gate wire 2022 and part of the source wire 2052 were exposed to become wiring pads. In addition, it was possible to obtain the pixel electrode 2055 which consisted of an amorphous metal oxide, whereby light transmittance could be improved.

As explained above, according to the method for producing a thin film transistor of this example, the object to be processed to be the active layer 2041, the source electrode 2051, the source wire 2052, the drain electrode 2053, the drain wire 2054 and the pixel electrode 2055, which were formed of the amorphous prescribed material, could be simultaneously formed into a film, followed by simultaneous shaping. In addition, it was possible to form efficiently the source electrode 2051a, the source wire 2052a, the drain electrode 2053a, the drain wire 2054a and the pixel electrode 2055a, which were composed of a metal layer.

In addition, the thin film transistor according to this example was a normally-off transistor, and the on-off ratio could be increased sufficiently.

In this example, although the above-mentioned material composed of indium oxide, gallium oxide and zinc oxide was used as the amorphous prescribed material, magnesium oxide can be used instead of zinc oxide. As the oxide of the positive divalent metal, zinc oxide, magnesium oxide, calcium oxide or a mixture of these can be used. By adding these metal oxide, generation of carriers due to oxygen deficiency associated with the activation of the active layer 2041 can be effectively suppressed. However, a metal oxide such as nickel oxide, copper oxide, cobalt oxide, platinum oxide, ferrous oxide, silver oxide or the like has poor carrier suppressing effects. In this case, during the activation by the plasma treatment, a method is used such as increasing the power of the plasma treatment apparatus or conducting a plurality of times of plasma irradiation so as to allow semiconductor performance to be exhibited.

In addition, the ratio of indium oxide to zinc oxide in the above-mentioned prescribed amorphous material can be selected appropriately. The atomic percentage of indium (=[In]/([In]+[Zn]), where [In] is the number of atoms of indium and [Zn] is the number of atoms of zinc) is 20 to 95%, preferably 50 to 90%, in order to allow the active layer and the transparent conductive film part of the semiconductor to be formed in an amorphous state. The reason therefor is that, if the content of indium oxide is too large, oxide thin film may be crystallized, thereby causing residues to generate during etching. On the other hand, if the content of indium oxide is too small, the active layer 2041 which becomes a semiconductor may not be activated even by a plasma treatment.

In addition, part of zinc oxide can be replaced with other oxides of the positive divalent metal. In this case, the ratio of zinc oxide to the oxide of the positive divalent metal is set such that zinc oxide becomes a main component. A main component means that the content of zinc oxide is larger than that of the oxide of the positive divalent metal to be added. It is important that indium oxide or zinc oxide is a main component.

Furthermore, as the oxide of a positive trivalent metal other than gallium oxide, boron oxide, aluminum oxide, scandium oxide, yttrium oxide, lanthanum oxide, neodymium oxide, samarium oxide, europium oxide, gadolinium oxide, terbium oxide, dysprosium oxide, holmium oxide, erbium oxide, thulium oxide, ytterbium oxide, and lutetium oxide can be used. By adding these metal oxides, generation of carriers due to oxygen deficiency can be effectively suppressed. However, metal oxides such as thallium oxide or the like do not have carrier suppressing effects.

There are no restrictions on the amount to be added. However, in the case of a metal oxide which inhibits activation by a plasma treatment or the like, it is required to control the added amount such that the activation occurs. There are no problems as long as this activation has no adverse effect on the suppression of carriers. The amorphous structure can be confirmed when no peaks are observed by the X-ray diffraction.

As for the added amount of an oxide of a positive trivalent metal, for example, the content of the positive trivalent metal in the total metal elements is 40 at % or less, preferably 20 at % or less. The reason therefor is that, if the content exceeds 40 at %, the conductivity of the transparent conductive film (pixel electrode 55) may excessively decrease, making the driving of liquid crystal and EL difficult. It can also be added together with an oxide of a positive divalent metal.

As the sputtering gas used in forming a film, an argon gas may be used. By using an argon gas, the resistance of the source electrode 2051, the source wire 2052, the drain electrode 2053, the drain wire 2054 and the pixel electrode 2055 can be lowered. The amorphous metal oxide layer can be formed with the temperature of the substrate being at room temperature (without heating the substrate). By forming a film at such a low temperature, an amorphous metal oxide layer can be formed. These amorphous metal oxide layers generate carriers due to oxygen deficiency from the amorphous structure, and are excellent in conductivity and transparency. Although there are no restrictions on the carrier concentration, the carrier concentration is preferably $10^{19}/cm^3$ or more and $10^{21}/cm^3$ or less, more preferably $10^{20}/cm^3$ or more and $10^{21}/cm^3$ or less.

As the sputtering gas, an argon gas containing a slight amount of oxygen and nitrogen can be used. By forming into a film in an argon gas containing oxygen and nitrogen, it may operate as a stable transparent electrode in an amorphous state. In addition, oxygen deficiency may be decreased by the plasma treatment, whereby semiconductor performance (electron carrier concentration) can be effectively stabilized.

FIFTH EXAMPLE

This example corresponds to the seventh application example.

This example differs from the fourth example in that a tin oxide-zinc oxide-gallium oxide target was used instead of the indium oxide-gallium oxide-zinc oxide target. The other methods were almost the same as those in the fourth example.

First, as shown in FIG. 38, FIG. 39(a) and FIG. 39(b), on the transparent glass substrate 2010, using an tin oxide-zinc oxide-gallium oxide target, a 40 nm-thick amorphous thin film was formed by a sputtering method with the temperature of the substrate being at room temperature. Here, the above-mentioned target is composed of tin oxide, zinc oxide and gallium oxide. The atomic percentage of tin (=[Sn]/([Sn]+[Zn]+[Ga]), where [Sn] is the number of atoms of tin, [Zn] is the number of atoms of zinc and [Ga] is the number of atoms of gallium) was 40%. The atomic percentage of zinc (=[Zn]/([In]+[Zn]+[Ga])) was 50%. The atomic percentage of gallium (=[Ga]/([In]+[Zn]+[Ga])) was 10%.

Subsequently, titanium was formed into a film in a thickness of 200 nm by a sputtering method.

Then, on the glass substrate 2010, the object to be processed to be the active layer 2041, the source electrode 2051, the source wire 2052, the drain electrode 2053, the drain wire 2054 and the pixel electrode 2055 were formed by a photo-lithographic method using a first half-tone mask (not shown) (Step S2061). The source wire 2052a, the drain wire 2054a and the pixel electrode 2055a, which were composed of a titanium layer, were simultaneously formed.

The resist formed by the first half-tone mask had a shape that a part above the source electrode 2051, the source wire 2052, the train electrode 2053, the drain wire 2054 and the pixel electrode 2055 was thicker than a part above the object to be processed to be the active layer 2041.

Then, a resist which had been formed by using the first half-tone mask was re-formed, and by a photolithographic method using the re-formed resist (not shown), the source electrode 2051a and the drain electrode 2053a were formed, which were composed of a titanium layer (Step S2062). In this way, titanium above the object to be processed to be the active layer 2041 was removed by dry etching using a $SF_6$ gas or the like, whereby the surface of the object to be processed was exposed.

Then, the re-formed resist was removed with a plasma ashing apparatus used for removing a resist and the object to be processed was activated by a plasma treatment to be the active layer 2041 (Step S2063). Furthermore, as in the fourth example, the thin film transistor according to this example was a normally-off transistor and an on-off ratio could be increased sufficiently.

Then, as shown in FIG. 39(a) and FIG. 39(b), in substantially the same manner as in the fourth example, a 250 nm-thick SiNx film as the gate-insulating film 2030 was formed by CVD on the glass substrate 2010, the active layer 2041, the source electrode 2051a, the source wire 2052a, the drain electrode 2053a, the drain wire 2054a and the pixel electrode 2055a (Step S2064).

Then, titanium was formed into a film with a thickness of 200 nm on the gate-insulating film 2030, and using a second mask (not shown), the gate electrode 2021 and the gate wire 2022, which are composed of a titanium thin film, were formed in a desired shape by a photolithographic method (Step S2065).

Then, on the gate-insulating film 2030, the gate electrode 2021 and the gate wire 2022, an SiNx film as the protective layer 2060 was formed with a thickness of 100 nm by CVD, part of the metal layer was etched and the protective layer 2060 was formed (Step S2067).

As explained above, according to the method for producing a thin film transistor of this example, the object to be processed to be the active layer 2041, the source electrode 2051, the source wire 2052, the drain electrode 2053, the drain wire 2054 and the pixel electrode 2055, which were composed of an amorphous prescribed material, could be simultaneously formed into a film, followed by simultaneous shaping. In addition, it was possible to form efficiently the source electrode 2051a, the source wire 2052a, the drain electrode 2053a, the drain wire 2054a and the pixel electrode 2055a, which were composed of a metal layer.

In addition, the thin film transistor according to this example was a normally-off transistor and an on-off ratio could be increased sufficiently.

In this example, the above-mentioned material composed of tin oxide, zinc oxide and gallium oxide was used as the amorphous prescribed material. It is also possible to use together with magnesium oxide or the like. In this case, during the activation by a plasma treatment, a method is used such as increasing the power of a plasma treatment apparatus or conducting a plurality of times of plasma irradiation so as to allow semiconductor performance to be exhibited.

In addition, the ratio of tin oxide to zinc oxide in the above-mentioned prescribed amorphous material can be selected appropriately. The atomic percentage of zinc (=[Zn]/([Sn]+[Zn]), where [Sn] is the number of atoms of tin and [Zn] is the number of atoms of zinc) is 5 to 95%, preferably 50 to 90%, in order to allow the active layer and the transparent conductive film part of a semiconductor to be formed in an amorphous state. The reason therefor is that, if the content of tin oxide is not within the above-mentioned range, the active layer 2041 which is a semiconductor may not be activated even by a plasma treatment.

In addition, part of zinc oxide can be replaced with other oxides of a positive divalent metal. In this case, the ratio of zinc oxide to the oxide of the positive divalent metal is such that zinc oxide becomes a main component. A main component means that a content of zinc oxide is larger than that of the oxide of the positive divalent metal to be added. It is important that indium oxide or zinc oxide is a main component.

Furthermore, by appropriately selecting the contents of tin oxide and zinc oxide, it is possible to etch using oxalic acid and to etch using mixed acid of phosphoric acid, acetic acid and nitric acid, as well as to give a selective etching property (specifically, it can be etched using oxalic acid but is resistant to a mixed acid of phosphoric acid, acetic acid and nitric acid).

As for the added amount of an oxide of a positive trivalent metal, for example, the content of the positive trivalent metal in the total metal elements is 20 at % or less, preferably 10 at % or less, more preferably 5 at % or less. The reason therefor is that, if the content exceeds 20 at %, the conductivity of the transparent conductive film may be excessively decreased, making the driving of liquid crystal and EL difficult.

An oxide of a positive divalent metal can also be added within a range which exerts no effects on the performance of the transparent conductive film (pixel electrode 2055).

The oxide layer may be formed with the temperature of the substrate being at room temperature (without heating the substrate). However, the film formation may be conducted with the substrate being heated. In the case of a resin substrate which has poor heat stability, it is preferable to form a film at room temperature (without heating the substrate). By forming a film at such a low temperature, an amorphous oxide layer can be formed. These amorphous layers generate carriers due to oxygen deficiency from the amorphous structure, and are excellent in conductivity and transparency. Although there are no restrictions on the carrier concentration, the carrier concentration is preferably $10^{19}/cm^3$ or more and $10^{21}/cm^3$ or less, more preferably $10^{20}/cm^3$ or more and $10^{21}/cm^3$ or less.

The invention is not limited to the above-mentioned thin film transistor and the production method thereof, and can also be effective as an invention of a semiconductor device and the production method thereof.

Each embodiment of the semiconductor device and the production method thereof will be now explained with reference to the drawings.

[Fourth Embodiment of the Semiconductor Device and a Method for Producing the Same]

Figure 40:
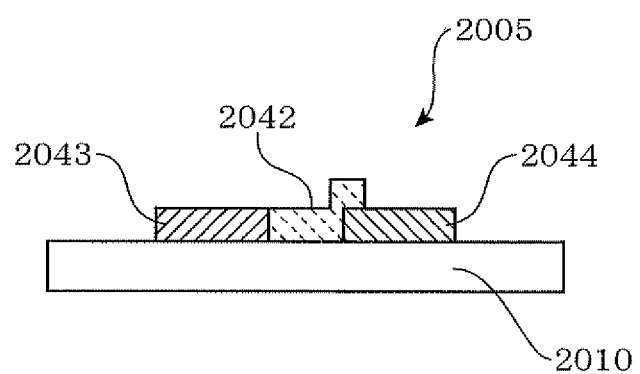
FIG. 40 is a schematic cross-sectional view of essential parts of a Schottky diode, which is a semiconductor device according to the fourth embodiment of the invention.
Figure 41:
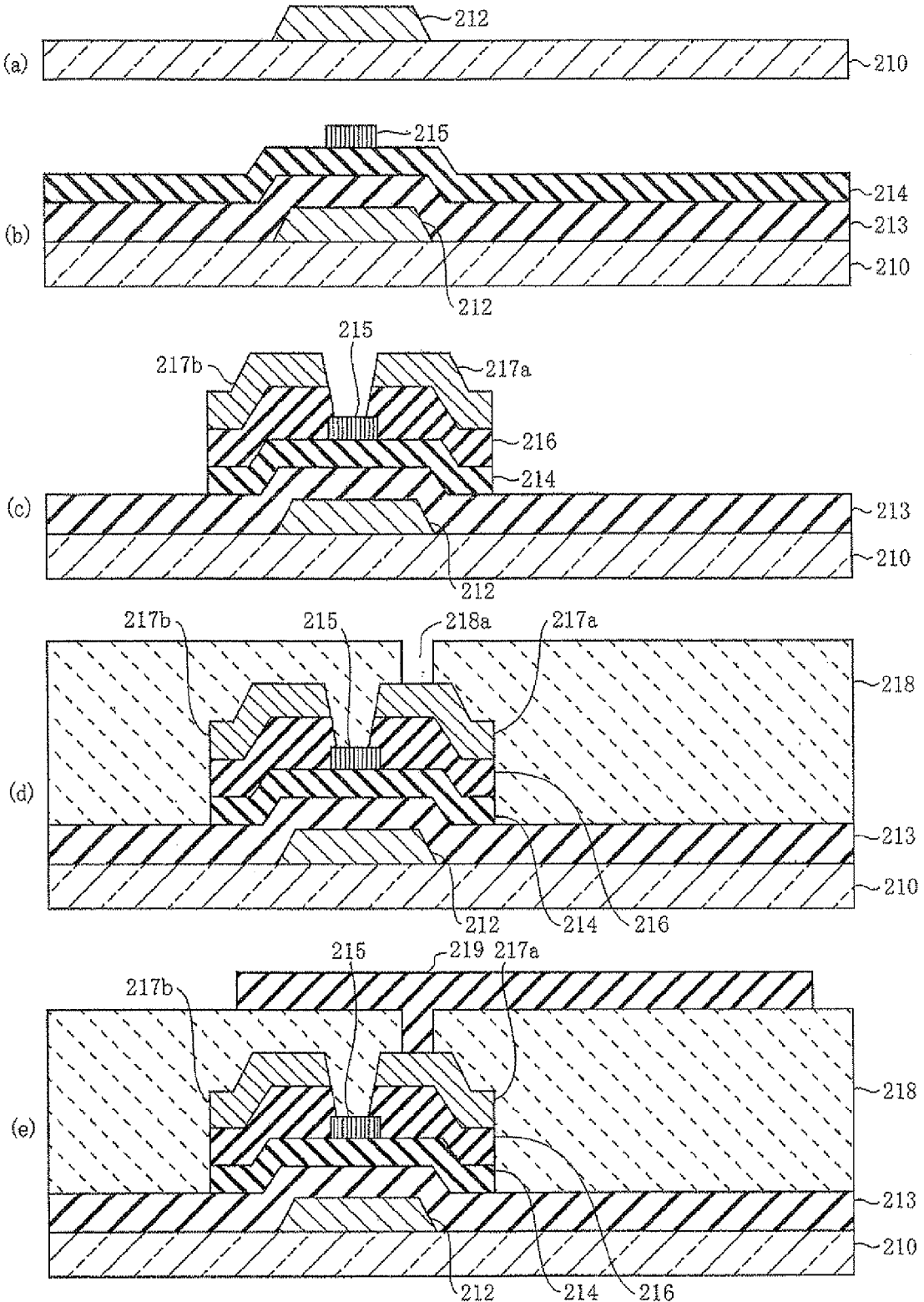
FIG. 41 is a schematic view for explaining the conventional method for producing a TFT substrate, in which (a) is a cross-sectional view showing the state in which a gate electrode is formed, (b) is a cross-sectional view showing the state in which an etch stopper is formed, (c) is a cross-sectional view showing the state in which a source electrode and a drain electrode are formed, (d) is a cross-sectional view showing the state in which an interlayer insulating film is formed, and (e) is a cross-sectional view showing the state in which a transparent electrode is formed.

FIG. 40 is a schematic cross-sectional view of essential parts of a Schottky diode, which is a semiconductor device according to the fourth embodiment of the invention.

In FIG. 40, a Schottky diode 2005 is provided with a glass substrate 2010, an N-type semiconductor 2042, an electrode 2043 and an electrode 2044.

In FIG. 40, the semiconductor device according to this embodiment is a Schottky diode 2005, in which the amorphous metal oxide, which is the same as that of the above-mentioned active layer 2041 which has been subjected to a plasma treatment, is used as an electron conductor (N-type semiconductor 2042).

At first, a transparent glass substrate 2010 is prepared. On this glass substrate 2010, by a photolithographic method using a first mask (not shown), an electrode 2044 which is composed of a metal thin film is formed in a desired shape. As the material of the electrode 2044, a material which has a work function larger than the absolute value of the Fermi level of the N-type semiconductor 2042, Pt, for example, is used. Due to a difference in work function, a barrier layer having a small amount of carriers is formed in the N-type semiconductor 2042.

Then, the object to be processed which serves as the N-type semiconductor 2042 and the electrode 2043 are formed on the glass substrate 2010 and the electrode 2044. That is, as shown in FIG. 40, the object to be processed which serves as the N-type semiconductor 2042 and the electrode 2043, which are composed of the above-mentioned prescribed material, are formed simultaneously by a sputtering method or the like in an amorphous state, followed by simultaneous etching by a photolithographic method using a second half-tone mask (not shown). In this way, the production steps can be decreased to reduce the production cost.

In addition, the resist formed by the above-mentioned second half-tone mask has a shape that a part covering the electrode 2043 is thicker than a part covering the object to be processed which serves as the N-type semiconductor 2042.

Then, a resist which is formed by the second half-tone mask is re-formed to expose the object to be processed which serves as the N-type semiconductor 2042 and it becomes a resist having a shape which covers the electrode 2043.

Subsequently, by the plasma treatment using the re-formed resist (not shown), the object to be processed becomes a semiconductor, whereby it serves as the N-type semiconductor 2042. That is, the re-formed resist functions as a shielding layer covering a region which becomes the conductor of the electrode 2043 and having an opening part for bringing plasma into contact with a region which becomes the semiconductor (the object to be processed). Accordingly, the shape or arrangement of the N-type semiconductor 2042 can be arbitrarily adjusted.

In addition, the electrode 2043 is formed of the same material as the base material of the N-type semiconductor 2042, is amorphous, and functions as a conductor. This electrode 2043 ohmically contacts the N-type semiconductor 2042.

As mentioned above, according to the Schottky diode 2005 of this embodiment, the prescribed material is allowed to be the N-type semiconductor 2042 by subjecting it to a plasma treatment and the same prescribed material is allowed to be the electrode 2043 by using it in an amorphous state. Accordingly, the same material can be used, whereby the management cost can be decreased.

Furthermore, this embodiment is also effective as an invention of a method for producing a Schottky diode 2005. This is the method for producing a Schottky diode 2005 provided with a conductor (electrode 2043) composed of a prescribed material and a semiconductor (N-type semiconductor 2042) of which the base material is the prescribed material, which comprises the steps of: forming into a film the prescribed material to form the object to be processed which serves as the N-type semiconductor 2042 and the conductor (electrode 2043); and subjecting the object to be processed to a plasma treatment to allow it to be a semiconductor (N-type semiconductor 2042). In this manner, the same material can be used, whereby the management cost can be decreased.

Although not shown, as compared with the case where the electrode 2043 and the N-type semiconductor 2042 are separately formed and shaped, the number of masks can be reduced. Therefore, the production steps can be decreased to reduce the production cost.

Furthermore, the Schottky diode 2005 according to the above-mentioned embodiment is produced by the method comprising the steps of: forming into a film a prescribed material to form an object to be processed and the electrode 2043, and subjecting the object to be processed to a plasma treatment to allow it to be the N-type semiconductor 2042. The method is, however, not limited thereto.

For example, although not shown, the prescribed material is formed into a film, followed by formation of the resist using the second half-tone mask (not shown). This resist has an opening part through which the object to be processed which serves as the N-type semiconductor 2042 is exposed and has a shape that a part covering the electrode 2043 is thicker than other parts. By a plasma treatment using this resist as a shielding layer, the object to be processed becomes a semiconductor, which is served as the N-type semiconductor 2042. Then, a resist which is formed by the second half-tone mask is re-formed to become a resist having a shape that covers the electrode 2043. Subsequently, the electrode 2043 and the N-type semiconductor 2042 may be formed using the re-formed resist (not shown). In this way, the same material can be used, whereby the management cost can be decreased. The number of the process steps and production cost can be reduced.

The semiconductor device of the invention is not limited to a thin film transistor or a Schottky diode, but means a semiconductor element, a semiconductor component, a semiconductor apparatus, an integrated circuit and the like. Therefore, for example, semiconductor devices include an integrated circuit (logic circuit, memory circuit, differential amplification circuit, or the like). As examples of the logic circuit, an inverter, an NOR, an NAND, a flip-flop, a shift register, or the like can be given. As examples of the memory transistor, a SRAM (Static Random Access Memory), a ROM (Read Only Memory) or the like can be given. Furthermore, as the differential amplification circuit, a differential amplifier or the like can be given. Also, it may be a radio communication circuit such as an ID tag or an IC tag.

Heretofore, a description has been made on preferred embodiments of the semiconductor device, the thin film transistor and the method for producing the same according to the invention. However, the semiconductor device, the thin film transistor and the method for producing the same according to the invention are not limited to the above-mentioned embodiments, and it is needless to say various modifications are possible within the scope of the invention.

For example, a method for locally crystallizing an amorphous metal oxide layer is not limited to the above-mentioned laser annealing, plasma treatment, lamp heating or the like. Various crystallization methods can be used.

Furthermore, the thin film transistor and the method for producing the same of the invention is also effective as an invention of a TFT substrate (thin film transistor substrate)

INDUSTRIAL APPLICABILITY

A semiconductor device and a thin film transistor and a method for producing the same according to the invention can be employed as a method for producing a switching element for an LCD and an organic EL display. In addition, by forming a thin film of a semiconductor on flexible materials such as a plastic film, the invention can be widely applied to a method for producing a flexible disk, an IC card and an ID tag.

The invention claimed is:

1. A semiconductor device provided with a crystalline semiconductor comprising indium oxide as the main component and an oxide of a positive divalent metal and/or an oxide of a positive trivalent metal, wherein
said semiconductor is an IYbO (indium oxide-ytterbium oxide) or an IGZO (indium oxide-gallium oxide-zinc oxide), and
the semiconductor device is provided with an amorphous conductor having the same composition as that of said semiconductor.

2. A method for producing a semiconductor device according to claim 1, said method comprising:
forming said semiconductor which is crystalline and forming said conductor which is amorphous in a subsequent step, or forming said conductor which is amorphous and forming said semiconductor Which is crystalline in a subsequent step.

3. The method for producing a semiconductor device according to claim 2, wherein said prescribed material, is composed mainly of indium oxide.

4. The method for producing a semiconductor device according to claim 3, wherein said prescribed material contains an oxide of a positive divalent metal and/or an oxide of a positive trivalent metal.

5. A method for producing a semiconductor device according to claim 1, said method comprising:
simultaneously forming into a film an object to be processed and said conductor composed of said prescribed material which is amorphous, followed by simultaneous shaping, and
crystallizing said object to be processed which has been shaped to allow it to be said semiconductor device.

6. The method for producing a semiconductor device according to claim 5, which further comprises the step of forming a metal layer connecting said semiconductor and said conductor.

7. The method for producing a semiconductor device according to claim 5, wherein said prescribed material is composed mainly of indium oxide.

8. The method for producing a semiconductor device according to claim 7, wherein said prescribed material contains an oxide of a positive divalent metal and/or an oxide of a positive trivalent metal.

9. A thin film transistor provided with a gate electrode, a gate-insulating film, an active layer, a source electrode, a drain electrode and a pixel electrode, which comprises a crystalline semiconductor which comprises indium oxide as the main component and an oxide of a positive divalent metal and/or an oxide of a positive trivalent metal and serves as said active layer, and an amorphous conductor which is composed of a material having the same composition as that of said semiconductor and serves as said source electrode, said drain electrode and said pixel electrode, wherein
said semiconductor is an IYbO (indium oxide-ytterbium oxide) or an IGZO (indium oxide-gallium oxide-zinc oxide).

10. A method for producing a thin film transistor according, to claim 9, said method comprising:
forming said semiconductor which is crystalline and forming said conductor which is amorphous in a subsequent step, or forming said conductor which is amorphous and forming said semiconductor which is crystalline in a subsequent step.

11. The method for producing a thin film transistor according to claim 10, which further comprises the step of forming a protective layer.

12. The method for producing a thin film transistor according to claim 10, wherein said prescribed material is composed mainly of indium oxide.

13. The method for producing a thin film transistor according to claim 12, wherein said prescribed material contains an oxide of a positive divalent metal and/or an oxide of a positive trivalent metal.

14. A method for producing a thin film transistor according to claim 9, said method comprising:
simultaneously forming into a film an object to be processed and said conductor which are composed of said prescribed material which is amorphous, followed by simultaneous shaping, and
crystallizing said object to be processed which has been shaped to allow it to be said semiconductor.

15. The method for producing a thin film transistor according to claim 14, which further comprises the step of forming a protective layer.

16. The method for producing a thin film transistor according to claim 14, wherein said prescribed material is composed mainly of indium oxide.

17. The method for producing a thin film transistor according to claim 16, wherein said prescribed material contains an oxide of a positive divalent metal and/or an oxide of a positive trivalent metal.

18. A method for producing a thin film transistor according to claim 9, said method comprising:
forming a gate electrode above a substrate,
forming a gate-insulating film above said substrate and said gate electrode, and
above said gate-insulating film, forming said semiconductor which is crystalline and forming said conductor which is amorphous in a subsequent step, or forming said conductor which is amorphous and forming said semiconductor which is crystalline in a subsequent step.

19. The method for producing a thin film transistor according to claim 18, which further comprises the step of forming a protective layer.

20. The method for producing a thin film transistor according to claim 18, wherein said prescribed material is composed mainly of indium oxide.

21. The method for producing a thin film transistor according to claim 20, wherein said prescribed material contains an oxide of a positive divalent metal and/or an oxide of a positive trivalent metal.

22. A method for producing a thin film transistor according to claim 9, said method comprising:
forming a gate electrode above a substrate,
forming a gate-insulating film above said substrate and said gate electrode, and
above said gate-insulating film, simultaneously forming into a film an object to be processed which serves as said active layer and said conductor which are composed of said prescribed material which is amorphous, followed by simultaneous shaping, and
crystallizing said object to be processed which has been shaped to allow it to be said semiconductor.

23. The method for producing a thin film transistor according to claim 22, further comprises the step of forming a metal layer connecting said semiconductor and said conductor.

24. The method for producing a thin film transistor according to claim 22, which further comprises the step of forming a protective layer.

25. The method for producing a thin film transistor according to claim 22, wherein said prescribed material is composed mainly of indium oxide.

26. The method for producing a thin film transistor according to claim 25, wherein said prescribed material contains an oxide of a positive divalent metal and/or an oxide of a positive trivalent metal.

27. A method for producing a thin film transistor according to claim 9, said method comprising:
forming said semiconductor which is crystalline above a substrate and forming said conductor which is amorphous in a subsequent step, or forming said conductor which is amorphous and forming said semiconductor which is crystalline in a subsequent step,
forming a gate-insulating film above said substrate, said semiconductor and said conductor, and
forming a gate electrode above said gate-insulating film which is above said semiconductor.

28. The method for producing a thin film transistor according to claim 27, which further comprises the step of forming a protective layer.

29. The method for producing a thin film transistor according to claim 27, wherein said prescribed material is composed mainly of indium oxide.

30. The method for producing a thin film transistor according to claim 29, wherein said prescribed material contains an oxide of a positive divalent metal and/or an oxide of a positive trivalent metal.

31. A method for producing a thin film transistor according to claim 9, said method comprising:
above a substrate, simultaneously forming into a film an object to be processed which serves as said active layer and said conductor which are composed of said prescribed material which is amorphous, followed by simultaneous shaping, and
crystallizing said object to be processed to allow it to be said semiconductor,
forming a gate-insulating film above said substrate, said semiconductor and said conductor,
forming a gate electrode above said gate-insulating film which is above said semiconductor.

32. The method for producing a thin film transistor according to claim 31, further comprises the step of forming a metal layer connecting said semiconductor and said conductor.

33. The method for producing a thin film transistor according to claim 31, which further comprises the step of forming a protective layer.

34. The method for producing a thin film transistor according to claim 31, wherein said prescribed material is composed mainly of indium oxide.

35. The method for producing a thin film transistor according to claim 34, wherein said prescribed material contains an oxide of a positive divalent metal and/or an oxide of a positive trivalent metal.

36. The thin film transistor according to claim 9, wherein the active layer, the source electrode, the drain electrode and the pixel electrode have a structure formed by simultaneously forming into a film, simultaneously etching, and crystallizing to allow the active layer to be a semiconductor, and a gate length of the active layer is shorter than the gate electrode length, and a gate width of the active layer is shorter than the gate electrode width.

37. A semiconductor device provided with a conductor which is composed of an amorphous metal oxide comprising indium oxide as the main component and an oxide of a positive divalent metal and/or an oxide of a positive trivalent metal, wherein
the semiconductor device is provided with a semiconductor which is allowed to be a semiconductor by subjecting said conductor to a plasma treatment,
said semiconductor is an IYbO (indium oxide-ytterbium oxide) or an IGZO (indium oxide-gallium oxide-zinc oxide).

38. A method for producing a semiconductor device according to claim 37, said method comprising:
forming said conductor of said prescribed material and
forming said semiconductor by subjecting said prescribed material to a plasma treatment to allow it to be said semiconductor.

39. The method for producing a semiconductor device according to claim 38, wherein said prescribed material is an amorphous metal oxide.

40. The method for producing a semiconductor device according to claim 39, wherein said amorphous metal oxide contains at least one of indium oxide, zinc oxide and tin oxide.

41. The method for producing a semiconductor device according to claim 40, wherein said amorphous metal oxide contains at least one of an oxide of a positive divalent metal, an oxide of a positive trivalent metal and an oxide of a positive tetravalent metal.

42. A method for producing a semiconductor device according to claim 37, said method comprising:
forming into a film said prescribed material to form an object to be processed and said conductor, and
subjecting said object to be processed to a plasma treatment to allow it to be a semiconductor.

43. The method for producing a semiconductor device according to claim 42, wherein, when said prescribed material is allowed to be a semiconductor by said plasma treatment, a shielding layer is used, which covers a region which is allowed to be said conductor and has an opening part for bringing plasma into contact with a region which is allowed to be a semiconductor.

44. The method for producing a semiconductor device according to claim 42, wherein said prescribed material is an amorphous metal oxide.

45. The method for producing a semiconductor device according to claim 44, wherein said amorphous metal oxide contains at least one of indium oxide, zinc oxide and tin oxide.

46. The method for producing a semiconductor device according to claim 45, wherein said amorphous metal oxide contains at least one of an oxide of a positive divalent metal, an oxide of a positive trivalent metal and an oxide of a positive tetravalent metal.

47. A method for producing a semiconductor device according to claim 37, said method comprising:
forming into a film said prescribed material,
subjecting part of said prescribed material which has been formed into a film to a plasma treatment to allow it to be a semiconductor, and
etching said prescribed material which has been formed into a film to form said conductor and said semiconductor.

48. The method for producing a semiconductor device according to claim 47, wherein, when said prescribed material is allowed to be a semiconductor by said plasma treatment, a shielding layer is used, which covers a region which is allowed to be said conductor and has an opening part for bringing plasma into contact with a region which is allowed to be a semiconductor.

49. The method for producing a semiconductor device according to claim 47, wherein said prescribed material is an amorphous metal oxide.

50. The method for producing a semiconductor device according to claim 49, wherein said amorphous metal oxide contains at least one of indium oxide, zinc oxide and tin oxide.

51. The method for producing a semiconductor device according to claim 50, wherein said amorphous metal oxide contains at least one of an oxide of a positive divalent metal, an oxide of a positive trivalent metal and an oxide of a positive tetravalent metal.

52. A thin film transistor provided with a gate electrode, a gate-insulating film, an active layer, a source electrode, a drain electrode and a pixel electrode, wherein the thin film transistor is provided with a conductor which is composed of an amorphous metal oxide comprising indium oxide as the main component and an oxide of a positive divalent metal and/or an oxide of a positive trivalent metal and serves said source electrode, said drain electrode and said pixel electrode, and said active layer is allowed to be a semiconductor by subjecting said conductor to a plasma treatment, wherein
said semiconductor is an IYbO (indium oxide-ytterbium oxide) or an IGZO (indium oxide-gallium oxide-zinc oxide).

53. A method for producing a thin film transistor according to claim 52, said method comprising: subjecting said prescribed material to a plasma treatment to allow it to be a semiconductor, thereby to obtain said semiconductor.

54. The method for producing a thin film transistor according to claim 53, which further comprises the step of forming a protective layer.

55. The method for producing a thin film transistor according to claim 53, wherein said prescribed material is an amorphous metal oxide.

56. The method for producing a thin film transistor according to claim 55, wherein said amorphous metal oxide contains at least one of indium oxide, zinc oxide and tin oxide.

57. The method for producing a thin film transistor according to claim 56, wherein said amorphous metal oxide contains at least one of an oxide of a positive divalent metal, an oxide of a positive trivalent metal and an oxide of a positive tetravalent metal.

58. A method for producing a thin film transistor according to claim 52, said method comprising:
forming into a film said prescribed material to form an object to be processed and said conductor, and
subjecting said object to be processed to a plasma treatment to allow it to be said semiconductor.

59. The method for producing a thin film transistor according to claim 58, wherein, when said prescribed material is allowed to be a semiconductor by said plasma treatment, a shielding layer is used, which covers a region which is allowed to be said conductor and has an opening part for bringing plasma into contact with a region which is allowed to be a semiconductor.

60. The method for producing a thin film transistor according to claim 58, which further comprises the step of forming a protective layer.

61. The method for producing a thin film transistor according to claim 58, wherein said prescribed material is an amorphous metal oxide.

62. The method for producing a thin film transistor according to claim 61, wherein said amorphous metal oxide contains at least one of indium oxide, zinc oxide and tin oxide.

63. The method for producing a thin film transistor according to claim 62, wherein said amorphous metal oxide contains at least one of an oxide of a positive divalent metal, an oxide of a positive trivalent metal and an oxide of a positive tetravalent metal.

64. A method for producing a thin film transistor according to claim 52, said method comprising:
   forming into a film said prescribed material,
   subjecting part of said prescribed material which has been formed into a film to a plasma treatment to allow it to be a semiconductor, and
   etching said prescribed material which has been formed into a film to form said conductor and said semiconductor.

65. The method for producing a thin film transistor according to claim 64, wherein, When said prescribed material is allowed to be a semiconductor by said plasma treatment, a shielding layer is used, which covers a region which is allowed to be said conductor and has an opening part for bringing plasma into contact with a region which is allowed to be a semiconductor.

66. The method for producing a thin film transistor according to claim 64, which further comprises the step of forming a protective layer.

67. The method for producing a thin film transistor according to claim 64, wherein said prescribed material is an amorphous metal oxide.

68. The method for producing a thin film transistor according to claim 67 wherein said amorphous metal oxide contains at least one of indium oxide, zinc oxide and tin oxide.

69. The method for producing a thin film transistor according to claim 68, wherein said amorphous metal oxide contains at least one of an oxide of a positive divalent metal, an oxide of a positive trivalent metal and an oxide of a positive tetravalent metal.

70. The thin film transistor according to claim 52, wherein the active layer, the source electrode, the drain electrode and the pixel electrode have a structure formed by simultaneously forming into a film, simultaneously etching, and the plasma treatment to allow the active layer to be a semiconductor, and a gate length of the active layer is shorter than the gate electrode length, and a gate width of the active layer is shorter than the gate electrode width.

\* \* \* \* \*